(12) United States Patent
Shim et al.

(10) Patent No.: US 12,520,606 B2
(45) Date of Patent: Jan. 6, 2026

(54) IMAGE SENSOR

(71) Applicant: SAMSUNG ELECTRONICS CO., LTD., Suwon-si (KR)

(72) Inventors: Eunsub Shim, Suwon-si (KR); Wonseok Lee, Suwon-si (KR); Haewook Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 377 days.

(21) Appl. No.: 18/345,429

(22) Filed: Jun. 30, 2023

(65) Prior Publication Data

US 2024/0047501 A1 Feb. 8, 2024

(30) Foreign Application Priority Data

Aug. 2, 2022 (KR) .......................... 10-2022-0096270

(51) Int. Cl.
*H10F 39/18* (2025.01)
*H10F 39/00* (2025.01)

(52) U.S. Cl.
CPC ........... *H10F 39/18* (2025.01); *H10F 39/802* (2025.01); *H10F 39/811* (2025.01)

(58) Field of Classification Search
CPC ........ H10F 39/00; H10F 39/011; H10F 39/12; H10F 39/18; H10F 39/802; H10F 39/803;
(Continued)

(56) References Cited

U.S. PATENT DOCUMENTS 7,679,133 B2 3/2010 Son et al.
8,792,034 B2 7/2014 Takahashi
(Continued)

FOREIGN PATENT DOCUMENTS

EP 3993013 A1 5/2022
KR 10-1226685 1/2013
(Continued)

OTHER PUBLICATIONS

L. DiCioccio et al., "Materials Science and Engineering: B", ScienceDirect, vol. 46, Issues 1-3, Apr. 1997, pp. 349-356.
(Continued)

*Primary Examiner* — Brook Kebede
(74) *Attorney, Agent, or Firm* — Morgan, Lewis & Bockius LLP

(57) ABSTRACT

An image sensor includes a first substrate layer, a second substrate layer that is thicker than the first substrate layer, an inter-substrate insulating layer arranged between the first substrate layer and the second substrate layer, a first impurity region, a pair of second impurity regions, and a third impurity region, which are spaced apart from each other and arranged on some portions of the first substrate layer. The image sensor further includes a photodiode region constituting a photo sensing device arranged on the second substrate layer, a transfer transistor including a first gate electrode layer that fills a gate hole, penetrates the first substrate layer and the inter-substrate insulating layer, and extends to the second substrate layer, and a floating diffusion region arranged on a side of the first substrate layer and connected to the transfer transistor.

20 Claims, 46 Drawing Sheets

(58) Field of Classification Search
CPC ......... H10F 39/80373; H10F 39/80377; H10F 39/807; H10F 39/809; H10F 39/811
See application file for complete search history.

(56) References Cited

U.S. PATENT DOCUMENTS

| | | | |
|---|---|---|---|
| 9,324,753 | B2 | 4/2016 | Kato et al. |
| 9,356,061 | B2 | 5/2016 | Fan et al. |
| 9,508,770 | B2 | 11/2016 | Yanagita et al. |
| 9,992,437 | B1 | 6/2018 | Keung et al. |
| 10,043,838 | B2 | 8/2018 | Kwag et al. |
| 10,199,421 | B2 | 2/2019 | Choi et al. |
| 10,424,568 | B1 | 9/2019 | Tan et al. |
| 10,438,989 | B2 | 10/2019 | Kim et al. |
| 10,651,226 | B2 | 5/2020 | Lee et al. |
| 10,964,741 | B1 | 3/2021 | Chen et al. |
| 10,985,201 | B2 | 4/2021 | Sze |
| 2012/0146173 | A1* | 6/2012 | Ohta ................ H10F 39/809 257/E31.124 |
| 2014/0246707 | A1* | 9/2014 | Koo ................ H10F 39/80373 257/230 |
| 2015/0155323 | A1 | 6/2015 | Ahn et al. |
| 2017/0092680 | A1 | 3/2017 | Kwon |
| 2018/0061873 | A1* | 3/2018 | Lee ................ H10F 39/8053 |
| 2018/0294300 | A1 | 10/2018 | Ishida et al. |
| 2018/0358393 | A1 | 12/2018 | Sato et al. |
| 2020/0161361 | A1 | 5/2020 | Huang et al. |
| 2021/0351223 | A1 | 11/2021 | Nomoto |
| 2022/0159208 | A1 | 5/2022 | Machida |
| 2022/0352226 | A1 | 11/2022 | Miyazaki et al. |

FOREIGN PATENT DOCUMENTS

| | | |
|---|---|---|
| WO | 2020195824 | 1/2020 |
| WO | 2020054282 | 3/2020 |
| WO | WO2020262583 A1 | 12/2020 |

OTHER PUBLICATIONS

[Semiconductor Device] Silicon On Insulator (SOI)—PDSOI, FDSOI, https://blog.naver.com/rlaqjawndsla/222467131100, Aug. 12, 2021.
EESR issued in corresponding EP Patent Application No. 23185736.8 on Feb. 12, 2024.

* cited by examiner

IMAGE SENSOR

CROSS-REFERENCE TO RELATED APPLICATION

This application is based on and claims priority under 35 U.S.C. § 119 to Korean Patent Application No. 10-2022-0096270, filed on Aug. 2, 2022 in the Korean Intellectual Property Office, the disclosure of which is incorporated by reference herein in its entirety.

TECHNICAL FIELD

Embodiments of the inventive concept relate to an image sensor including a transmission gate and a floating diffusion region.

DISCUSSION OF RELATED ART

Image sensors may include a plurality of unit pixels arranged in a two-dimensional array. In general, unit pixels may include photo sensing elements, such as photodiodes, and a plurality of pixel transistors. In this case, the plurality of pixel transistors may include, for example, transfer transistors, reset transistors, source follower transistors, and selection transistors, and a transfer transistor may connect a photodiode to a floating diffusion region.

SUMMARY

Embodiments of the inventive concept provide an image sensor which may have an increased photo sensing capability.

According to an embodiment, an image sensor includes a first substrate layer, a second substrate layer that is thicker than the first substrate layer, an inter-substrate insulating layer arranged between the first substrate layer and the second substrate layer, a first impurity region, a pair of second impurity regions, and a third impurity region, which are spaced apart from each other and arranged on some portions of the first substrate layer, a photodiode region constituting a photo sensing device arranged on the second substrate layer, a transfer transistor including a first gate electrode layer, which is a vertical gate, that fills a gate hole, penetrates the first substrate layer and the inter-substrate insulating layer and extends to the second substrate layer, and a floating diffusion region arranged on a side of the first substrate layer and connected to the transfer transistor.

According to an embodiment, an image sensor includes a first substrate layer including impurities of a first conductivity type, a second substrate layer including impurities of the first conductivity type, an inter-substrate insulating layer arranged between the first substrate layer and the second substrate layer, a first impurity region, a pair of second impurity regions, and a third impurity region, which are arranged on some portions of the first substrate layer, are spaced apart from each other, and respectively include impurities of a second conductivity type that is different from the first conductivity type. The image sensor further includes a photodiode region arranged in the second substrate layer and including the impurities of the second conductivity type, a transfer transistor including a first gate electrode layer, which is a vertical gate, that penetrates the first substrate layer and the inter-substrate insulating layer and extends toward the photodiode region, a source follower transistor including a second gate electrode layer arranged on a portion of the first substrate layer between the pair of second impurity regions, and a reset transistor including a third gate electrode layer arranged on a portion of the first substrate layer between the first impurity region and the third impurity region. The first impurity region includes a floating diffusion region connected to the transfer transistor and a source region of the reset transistor.

An image sensor includes a first substrate layer including impurities of a first conductivity type, a second substrate layer including the impurities of the first conductivity type, an inter-substrate insulating layer arranged between the first substrate layer and the second substrate layer, a first impurity region, a pair of second impurity regions, and a third impurity region, which are arranged on some portions of the first substrate layer, are spaced apart from each other, and respectively include impurities of a second conductivity type that is different from the first conductivity type. The image sensor further includes a photodiode region arranged in the second substrate layer and including the impurities of the second conductivity type, a channel layer including the impurities of the first conductivity type, that penetrates the first substrate layer and the inter-substrate insulating layer, covers sidewalls of a channel hole that extends to the second substrate layer, and limits a size of a gate hole. The image sensor further includes a transfer transistor including a first gate insulating layer that covers a bottom surface and sidewalls of the gate hole and a first gate electrode layer, which is a vertical gate, and covers the first gate insulating layer and fills the channel hole. The image sensor further includes a plurality of source follower transistors including a second gate insulating layer arranged therebetween, and a second gate electrode layer arranged on a portion of the first substrate layer between the pair of second impurity regions, and a plurality of reset transistors including a third gate insulating layer arranged therebetween, and including a third gate electrode layer arranged on a portion of the first substrate layer between the first impurity region and the third impurity region. The second gate electrode layer extends from the portion of the first substrate layer between the pair of second impurity regions onto the channel layer and the first impurity region, and contacts the channel layer and the first impurity region.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
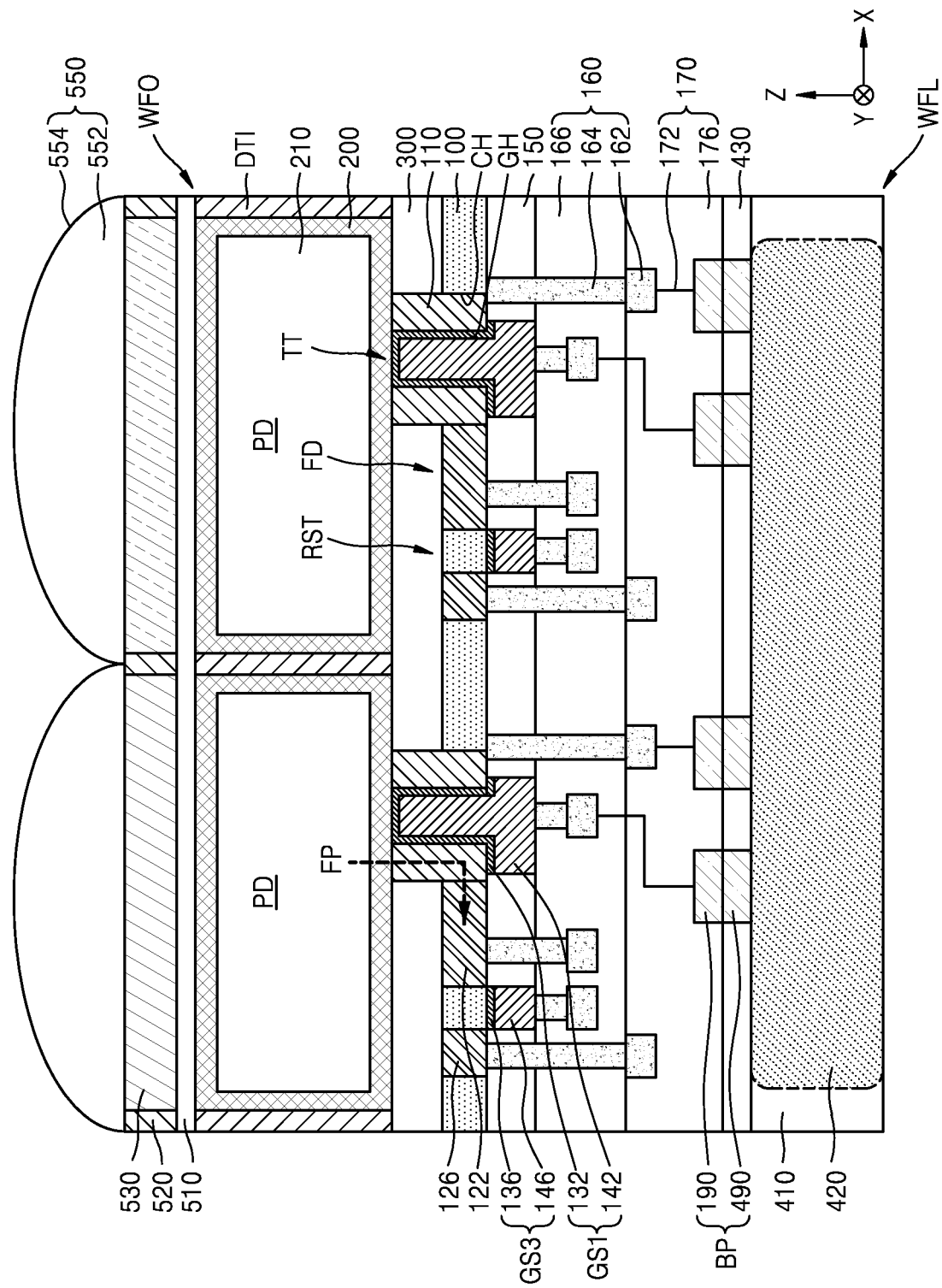
FIG. 1 is a cross-sectional view of an image sensor according to an embodiment.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when elements are described as being substantially coplanar with one another, it is to be understood that elements are exactly coplanar with one another, or almost coplanar with one another (e.g., within a measurement error), as would be understood by a person having ordinary skill in the art. Further, when one value is described as being about the same as or about equal to another value, it is to be understood that the values are equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Figure 5A:
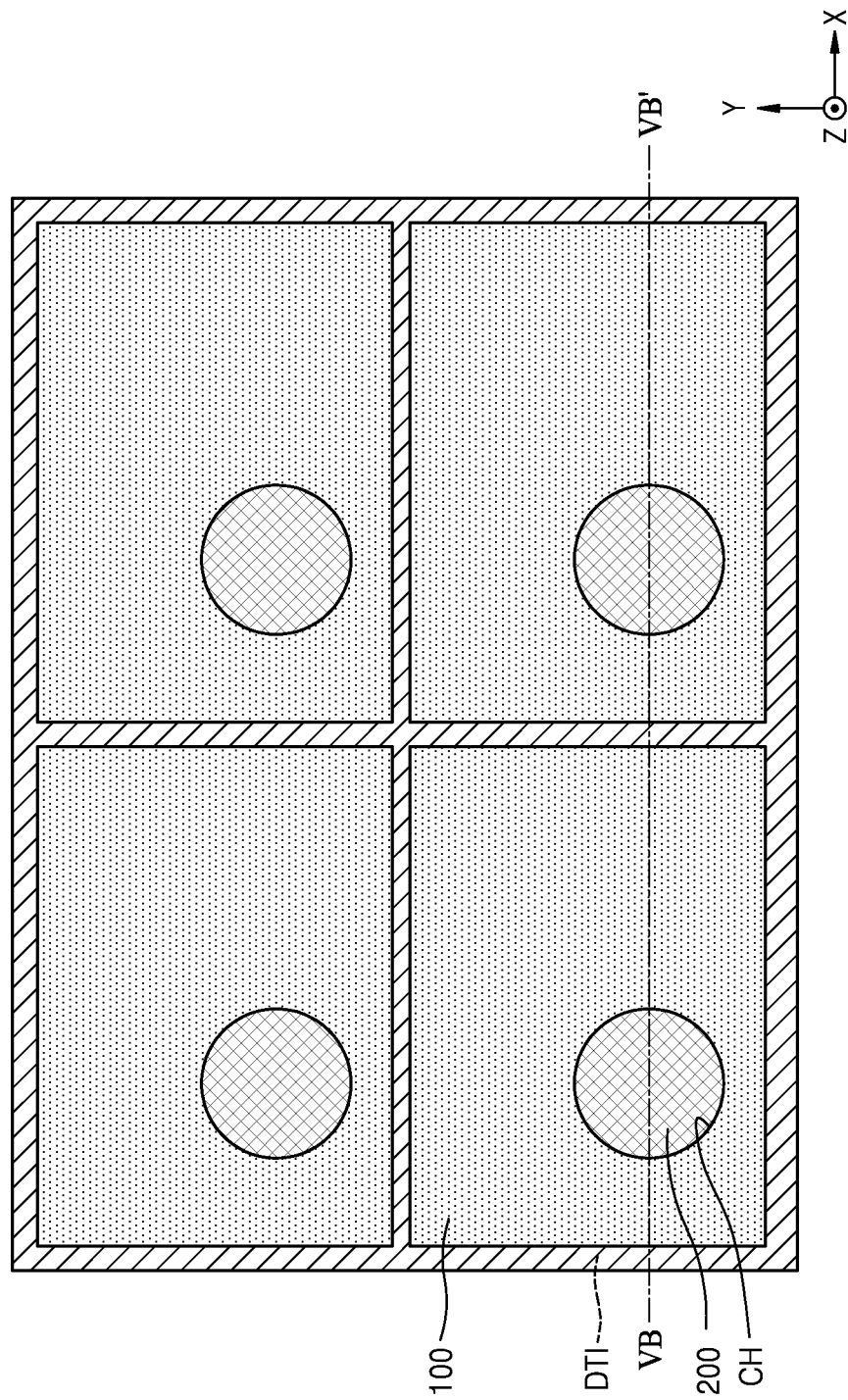
Figure 5B:
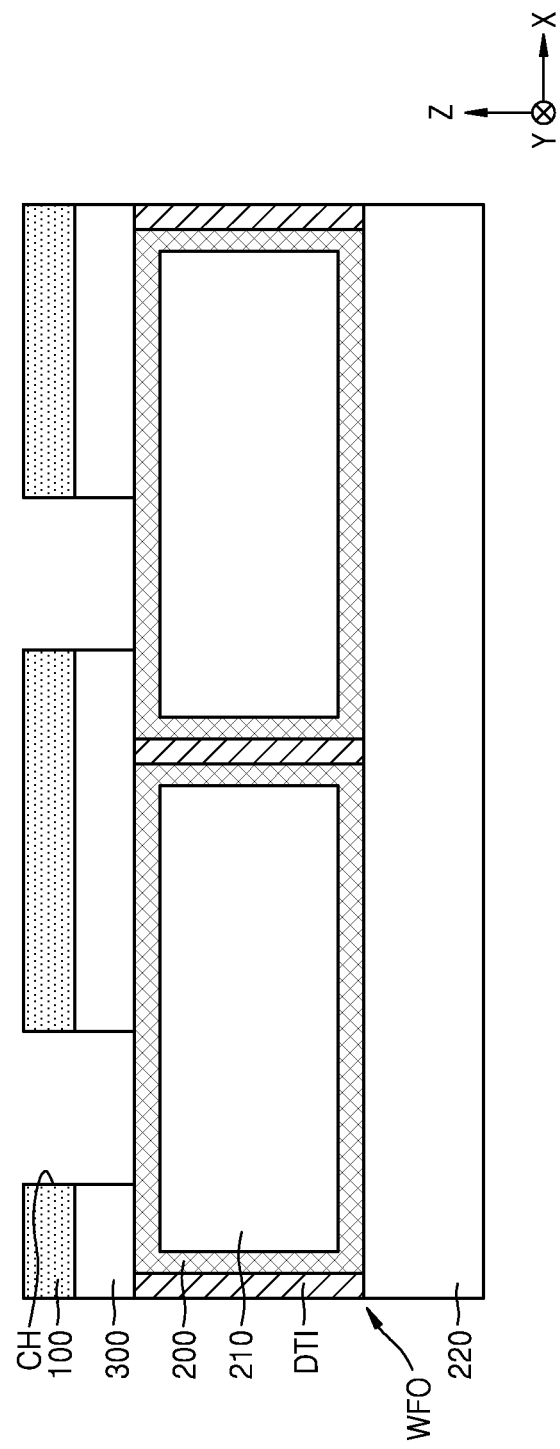
Figure 6A:
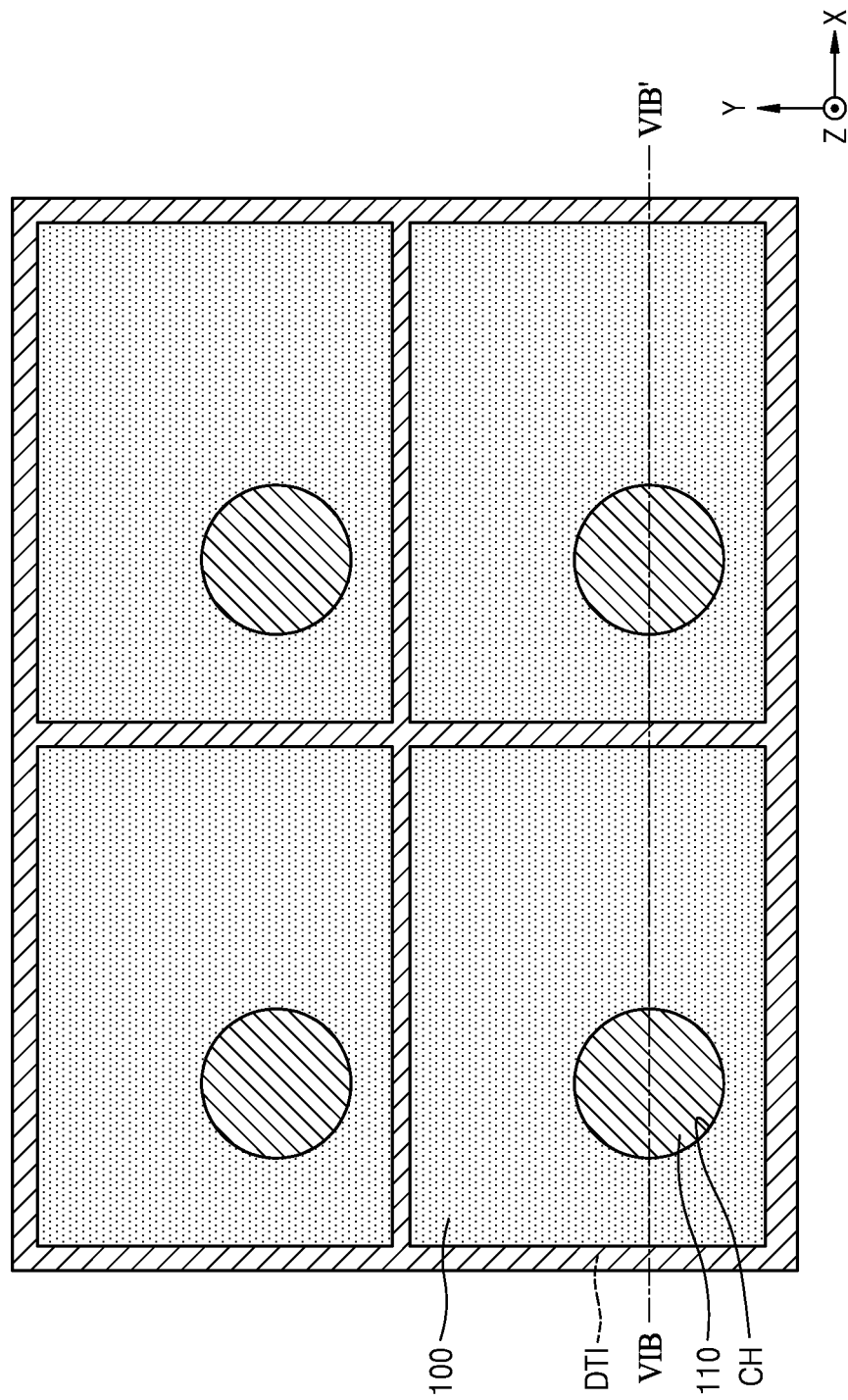
Figure 6B:
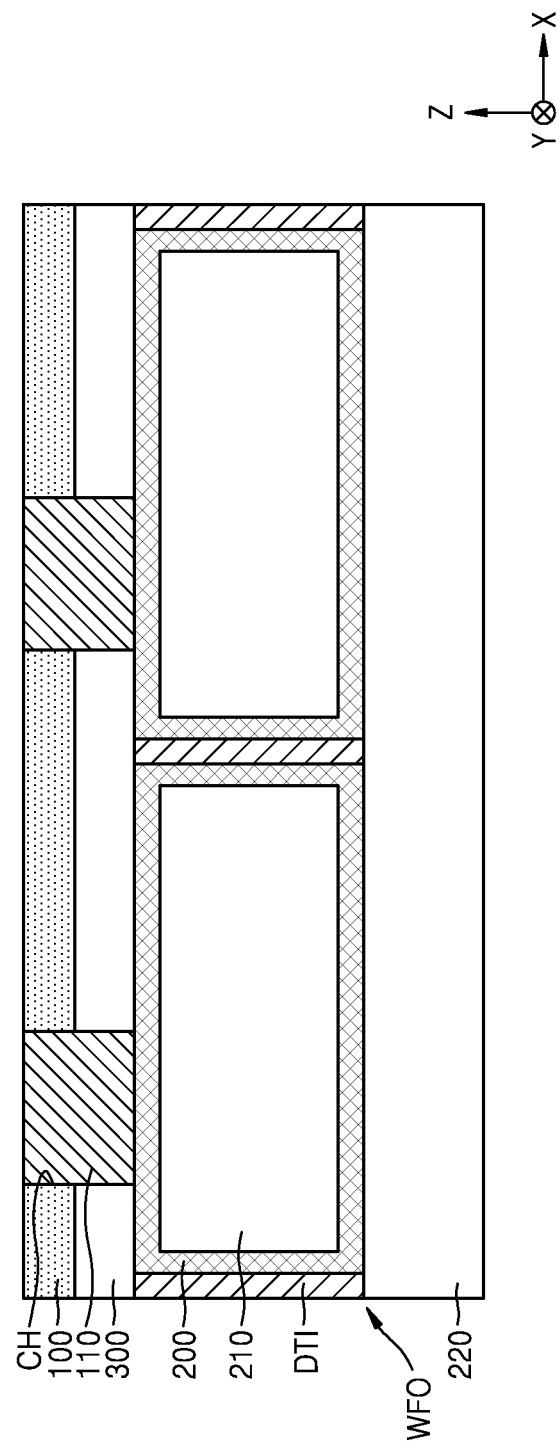
Figure 7A:
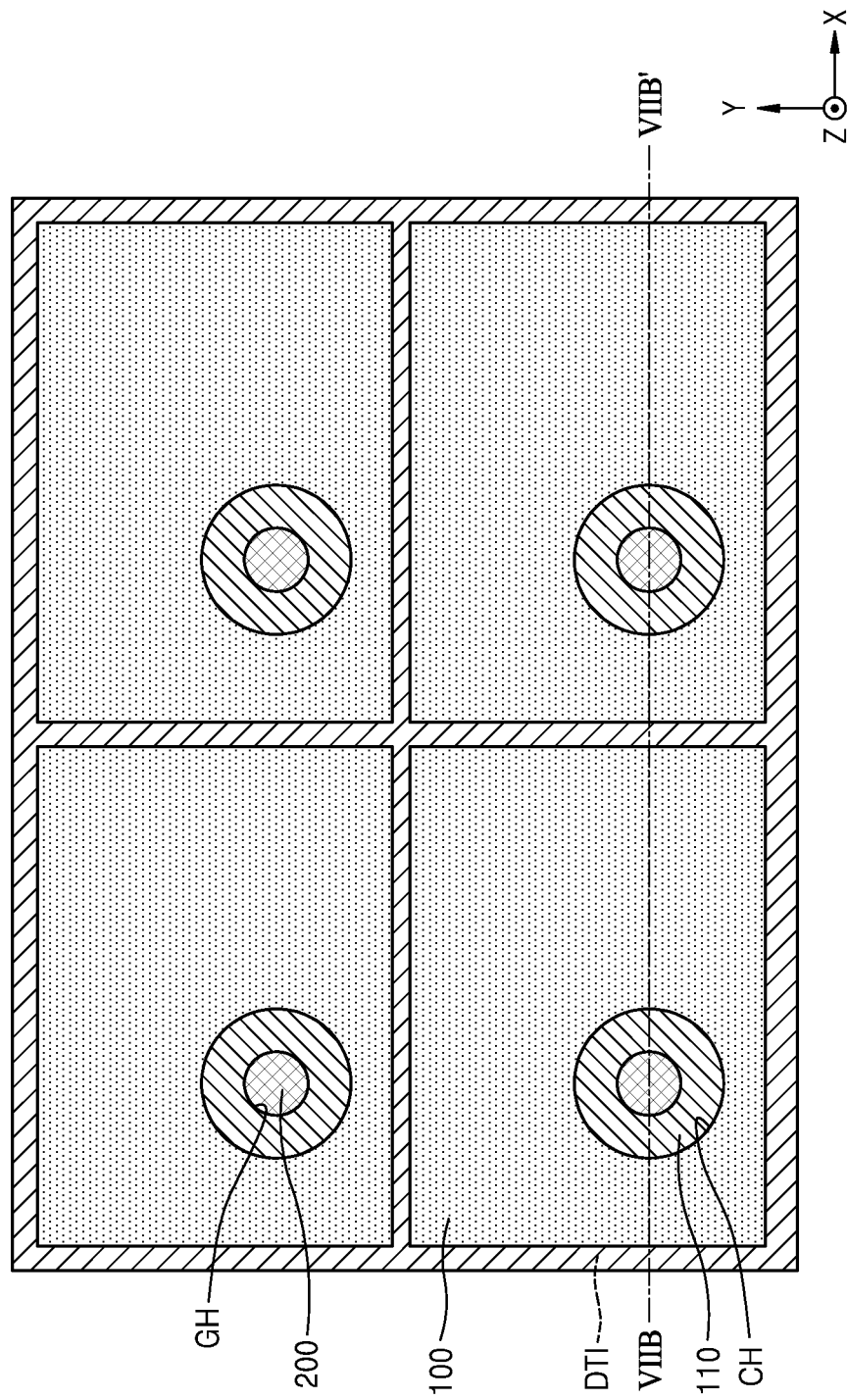
Figure 7B:
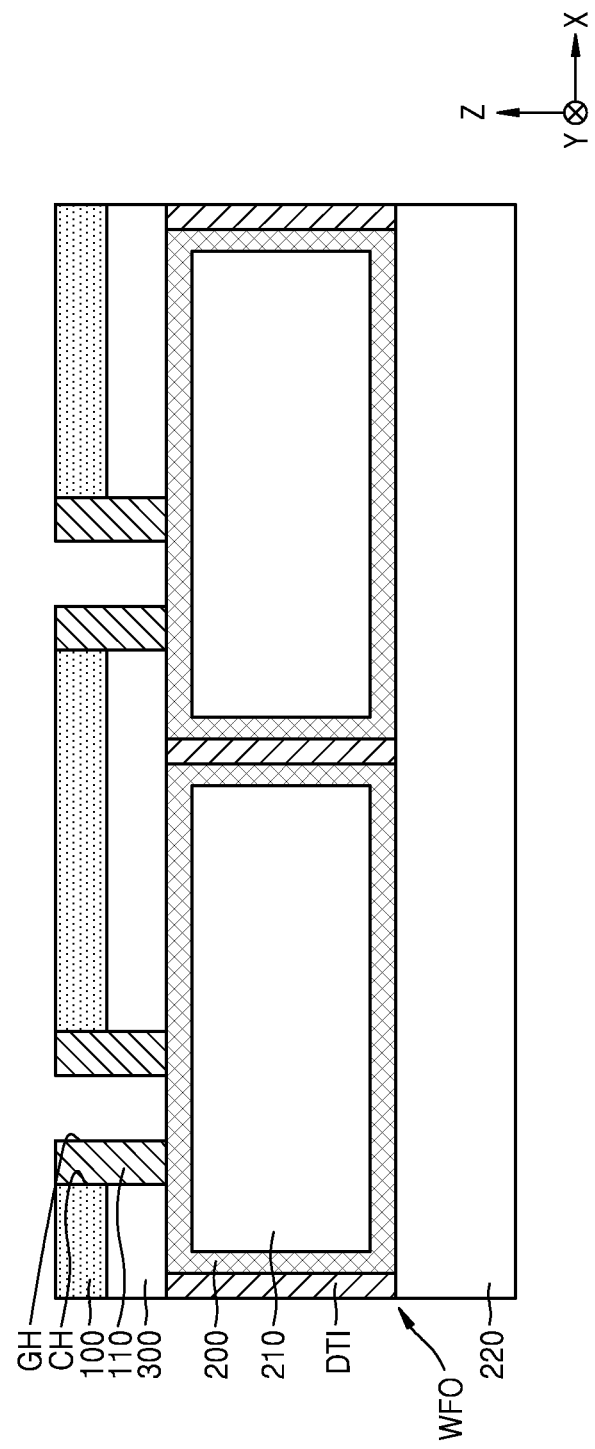
Figure 8A:
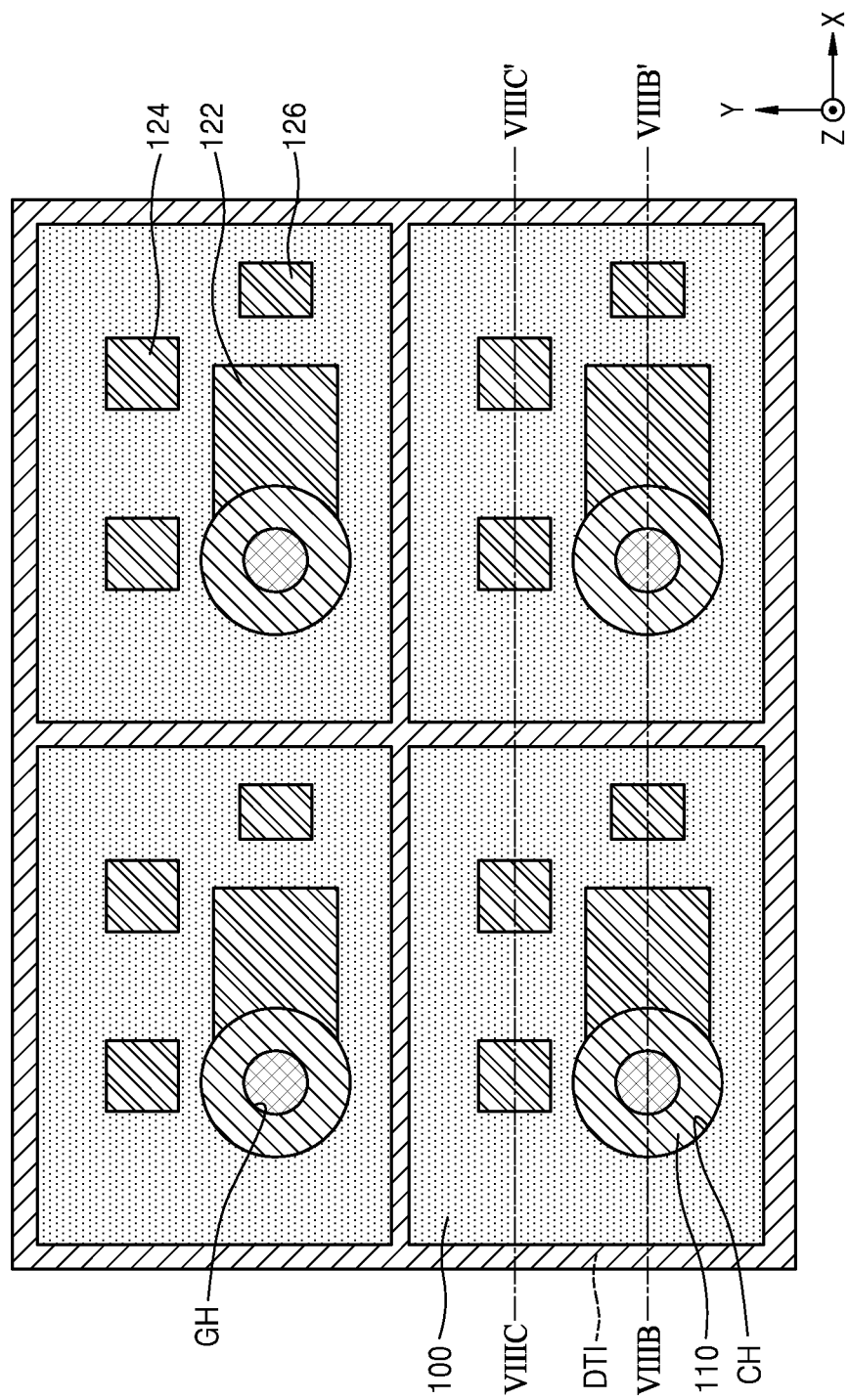
Figure 8B:
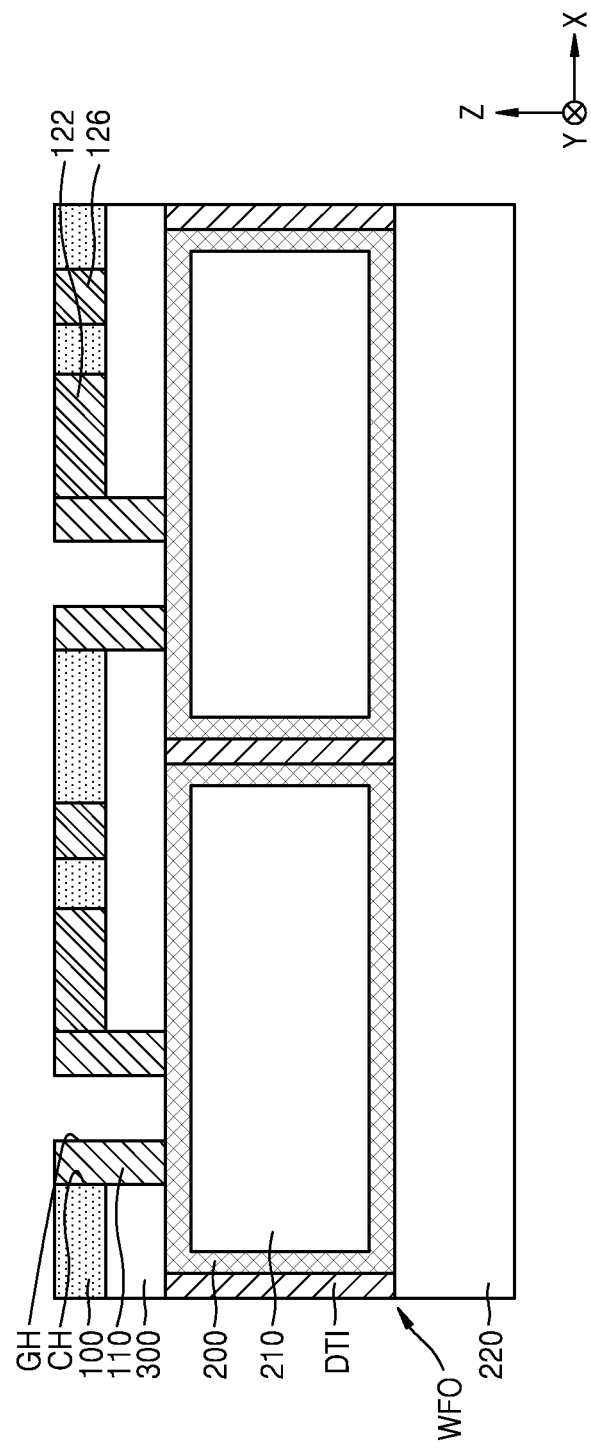

FIG. 1 is a cross-sectional view of an image sensor according to an embodiment. FIGS. 2A to 2C, 3, 4, 5A, 5B, 6A, 6B, 7A, 7B, 8A to 8C, 9A to 9C, 10A to 10C and 11 are plan layouts and cross-sectional views illustrating a manufacturing method of an image sensor, according to embodiments. For example, FIG. 5B is a cross-sectional view taken along line VB-VB' in FIG. 5A, FIG. 6B is a cross-sectional view taken along line VIB-VIB' in FIG. 6A, FIG. 7B is a cross-sectional view taken along line VIIB-VIIB' in FIG. 7A, FIG. 8B is a cross-sectional view taken along line VIIIB-VIIIB' in FIG. 8A, FIGS. 9B and 9C are cross-sectional views taken along lines IXB-IXB' and IXC-IXC' in FIG. 9A, respectively, FIGS. 10B and 10C are cross-sectional views taken along lines XB-XB' and XC-XC' in FIG. 10A, respectively, and FIGS. 1 and 11 are cross-sectional views taken along locations corresponding to line XB-XB' in FIG. 10A. The plan layouts of FIGS. 5A, 6A, 7A, 8A, 9A, and 10A primarily illustrate main components, and some components may be omitted for convenience of illustration.

Figure 10A:
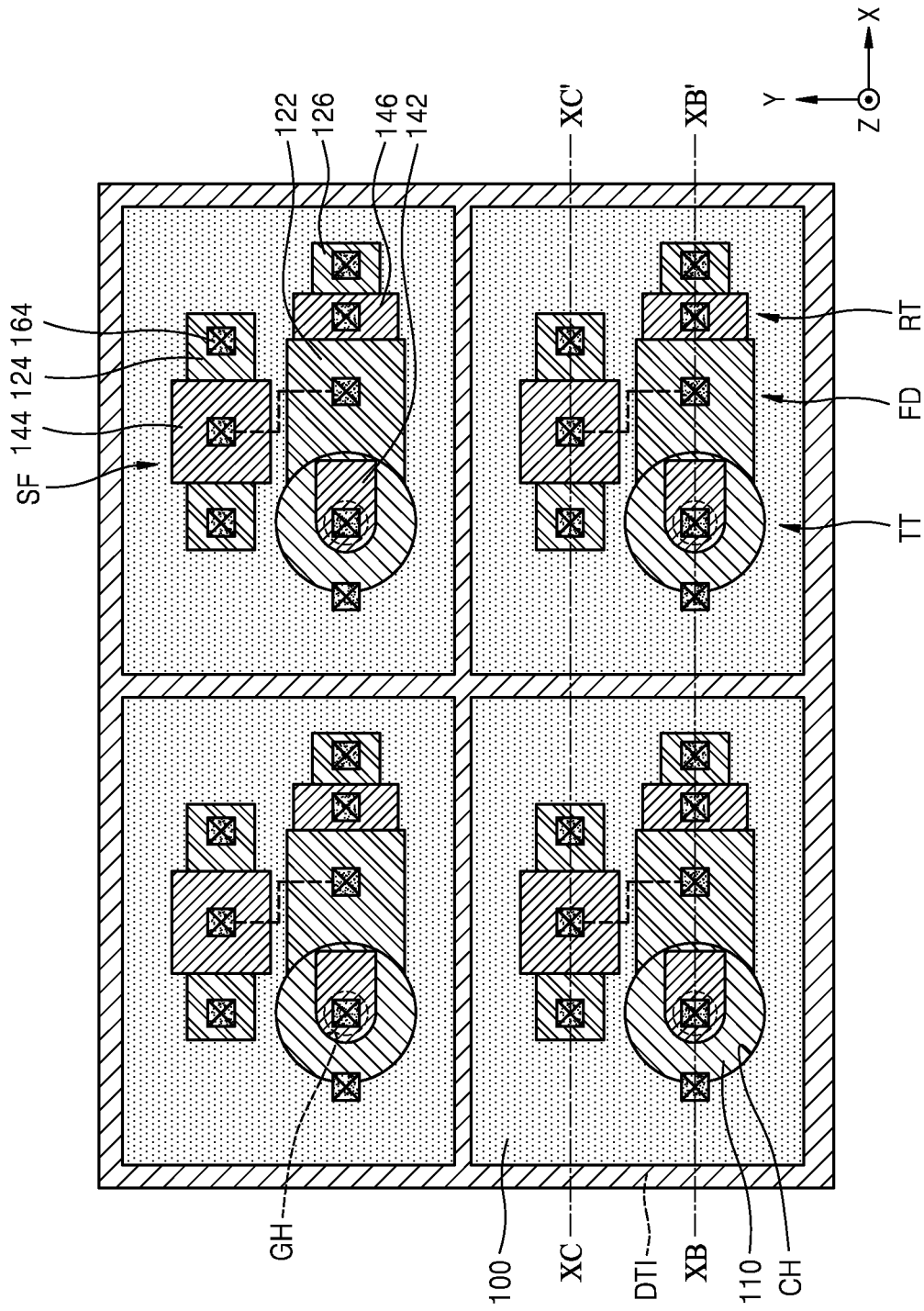
Figure 10B:
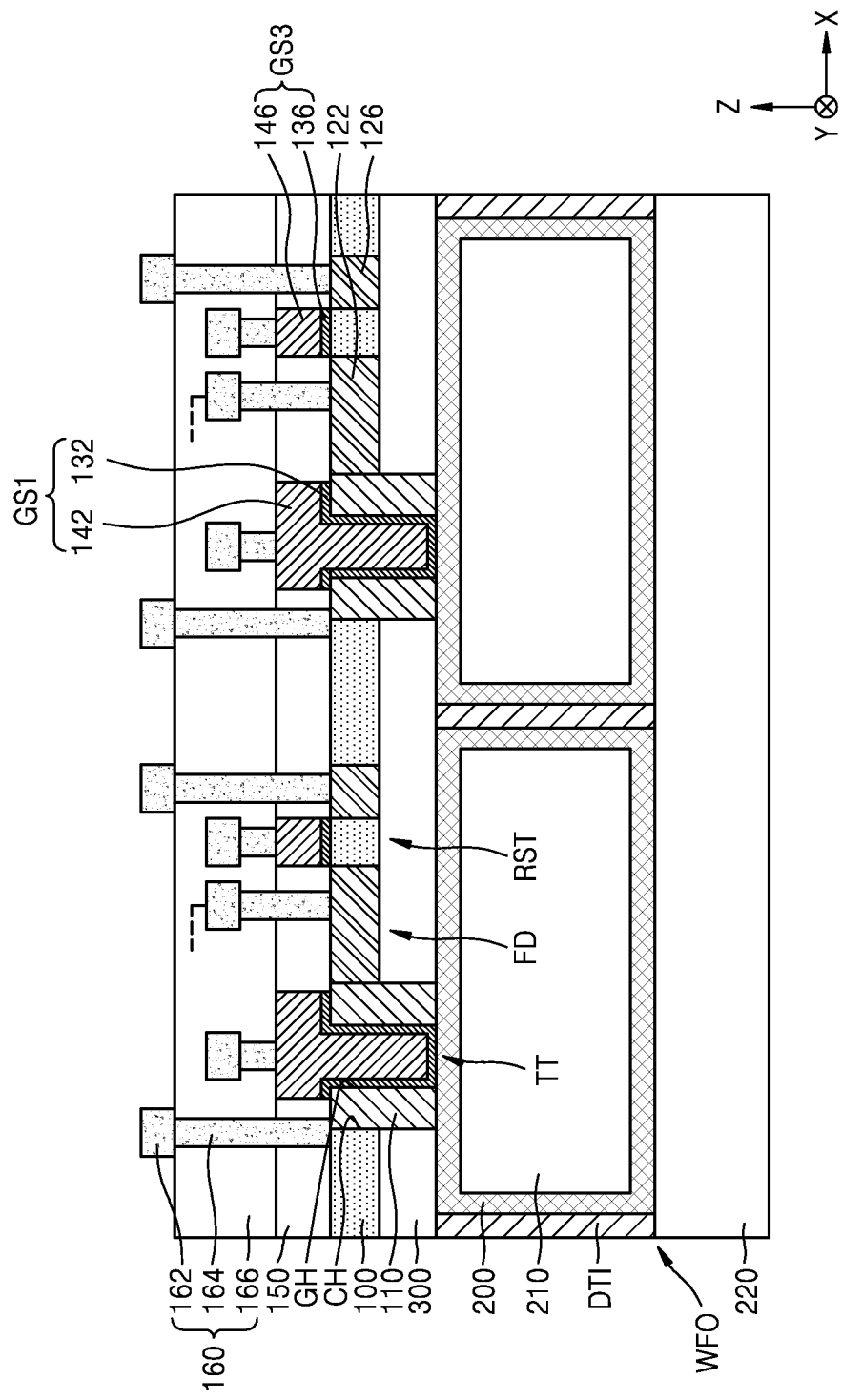
Figure 10C:
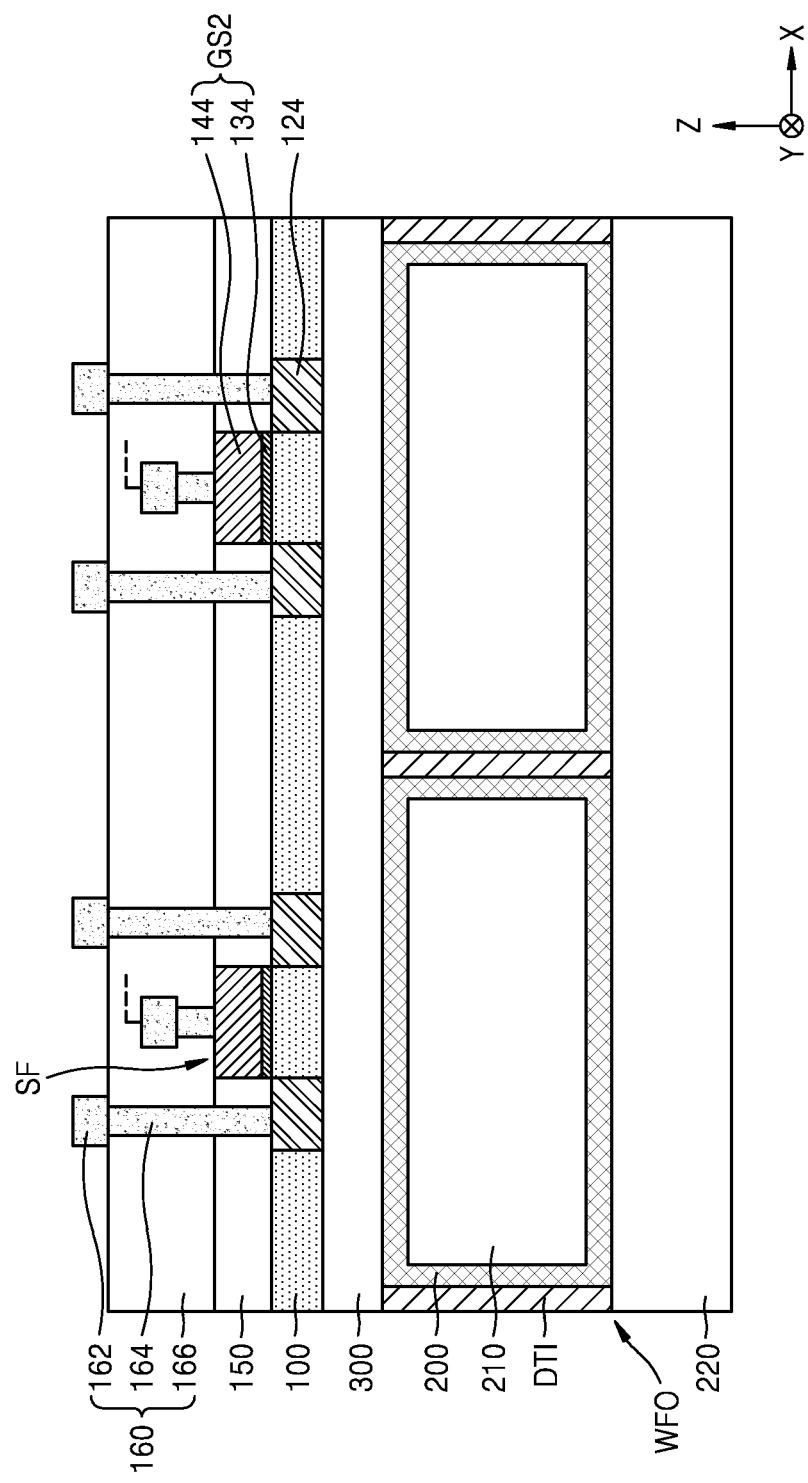
Figure 11:
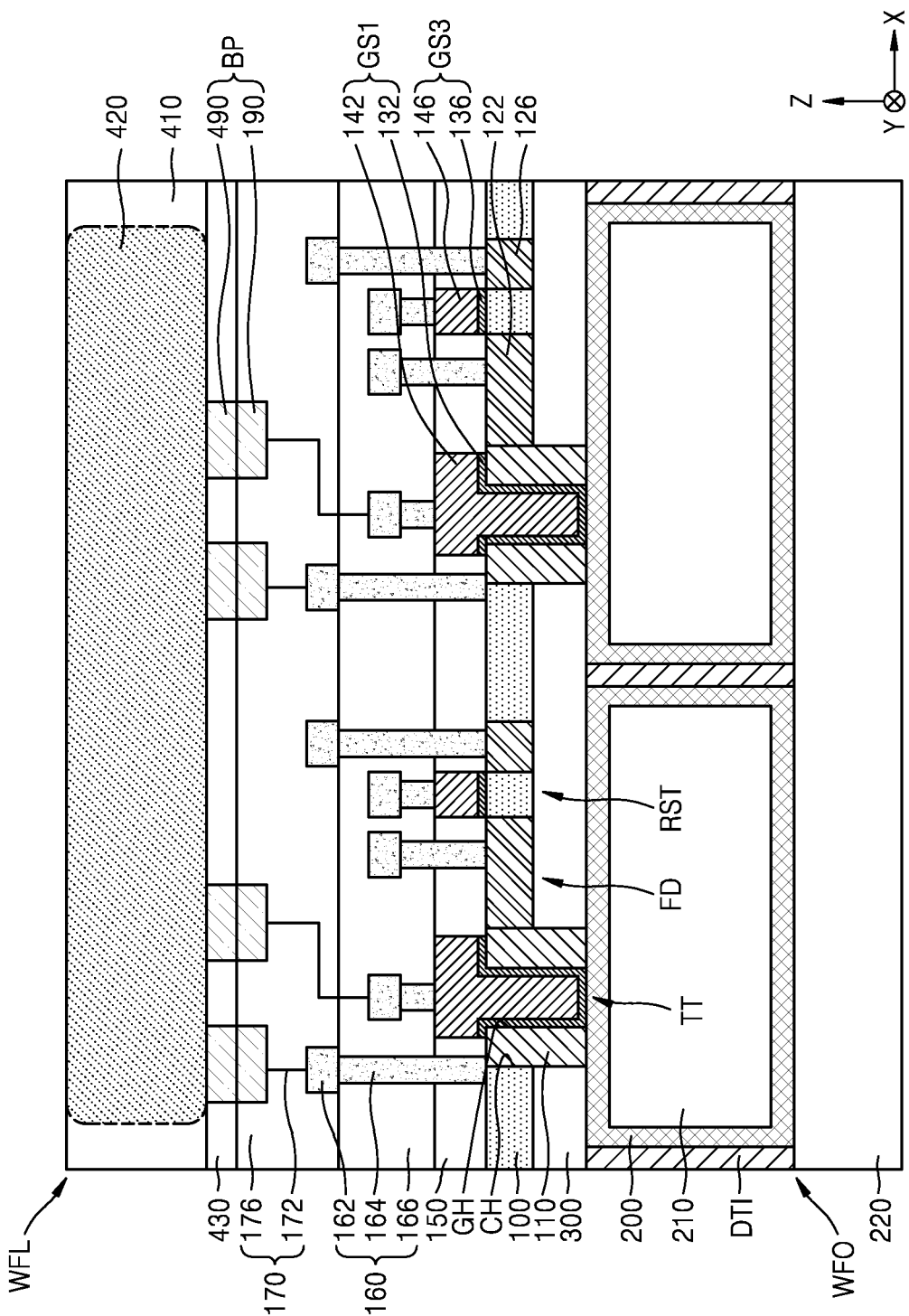

Referring to FIG. 1 together with FIGS. 10A to 10C, an image sensor 1 may include a photo device substrate WFO including a plurality of photo sensing devices PD, a plurality of microlenses 550 arranged on the photo device substrate WFO, and a plurality of color filters 530 arranged between the photo device substrate WFO and the plurality of microlenses 550.

FIG. 10A is a plan layout of some components of the image sensor 1, FIG. 1 is a cross-sectional view taken along line XB-XB' in FIG. 10A, and FIGS. 10B and 10C are cross-sectional views taken along lines XB-XB' and XC-XC' in FIG. 10A, respectively. When components except for a protective insulating layer 220 in FIGS. 10B and 10C are rotated upside down, and a front passivation layer 510, a guide pattern 520, a plurality of color filters 530, a plurality of microlenses 550, a wiring structure 170, and a logic substrate WFL, which are illustrated in FIG. 1, are included, the result thereof may correspond to the cross-sectional view of the image sensor 1.

The photo device substrate WFO may include a silicon on insulator (SOI) substrate. The photo device substrate WFO may include a first substrate layer 100, a second substrate layer 200, and an inter-substrate insulating layer 300 arranged between the first substrate layer 100 and the second substrate layer 200. The second substrate layer 200 may be thicker than the first substrate layer 100. For example, the thickness of the first substrate layer 100 may be several hundred nm, and the thickness of the second substrate layer 200 may be several μm. In some embodiments, the thickness of the first substrate layer 100 may be equal to or less than about 300 nm, and the thickness of the second substrate layer 200 may be equal to or less than about 4 μm. The thickness of the inter-substrate insulating layer 300 may be dozens nm to several hundred nm. For example, the inter-substrate insulating layer 300 may include oxide. In some embodiments, the inter-substrate insulating layer 300 may include silicon oxide.

The plurality of microlenses 550 may be arranged on the second substrate layer 200. The microlens 550 may concentrate light incident on the image sensor 1 onto a photo sensing device PD. In some embodiments, the microlens 550 may include an organic material layer 552 and an inorganic material layer 554 conformally covering a surface of the organic material layer 552. For example, the organic material layer 552 may include a TMR-based resin (e.g., Tokyo Ohka Kogyo, Co. product) or an MFR-based resin (e.g., Japan Synthetic Rubber Corporation product).

The plurality of color filters 530 may include, for example, a red color (R) filter, a blue color (B) filter, and a green color (G) filter. Alternatively, the plurality of color filters 530 may include a cyan color (C) filter, a yellow color (Y) filter, and a magenta color (M) filter. On each photo sensing device PD, one color filter 530 may be selected from the R filter, B filter, and G filter, or one color filter 530 may be selected from the C filter, Y filter, and M filter, and each photo sensing device PD may detect separated components of incident light and recognize one color.

The front passivation layer 510 may be arranged between the second substrate layer 200 and the plurality of color filters 530. The front passivation layer 510 may include, for example, oxide, nitride, oxynitride, or a combination thereof. For example, the front passivation layer 510 may include one of silicon nitride, hafnium oxide, aluminum oxide, and tantalum oxide, or may have a stacked structure thereof.

The guide pattern 520 may be formed on the front passivation layer 510. In a plan view, the guide pattern 520 may have a grid shape or a mesh shape. The guide pattern 520 has an inclination angle with respect to one photo sensing device PD, and may prevent the incident light from entering the adjacent photo sensing device PD. The guide pattern 520 may include, for example, at least one metal material of W, Al, Ti, Ru, Co, Ni, Cu, Au, Ag, and Pt. On the front passivation layer 510, on which the guide pattern 520 is formed, the color filter 530 may be arranged to overlap the photo sensing device PD in a vertical direction (Z direction). In some embodiments, the guide pattern 520 and the plurality of color filters 530 may be arranged at the same vertical level. For example, a plurality of color filters 530 may, in a plan view, fill a space limited by the guide pattern 520 having a grid shape or a mesh shape.

The image sensor 1 may include a photo sensing device PD, a floating diffusion region FD connected to the photo sensing device PD, a transfer transistor TT connecting the photo sensing device PD to the floating diffusion region FD, a reset transistor RST connected to the floating diffusion region FD, and a source follower transistor SF. In some embodiments, the floating diffusion region FD and the reset transistor RST may be arranged on a side of the transfer transistor TT in the first horizontal direction (X direction), and the source follower transistor SF may be arranged on a side of the transfer transistor in the second horizontal direction (Y direction). However, embodiments of the inventive concept are not limited thereto. The first horizontal direction (X direction) may be orthogonal to the second horizontal direction (Y direction).

The floating diffusion region FD may be connected to the source region of the reset transistor RST. In some embodiments, the floating diffusion region FD and the source region of the reset transistor RST may be integrated into one body. The floating diffusion region FD may be electrically connected to a gate region of the source follower transistor SF, that is, a second gate electrode layer 144. For example, the floating diffusion region FD may be electrically connected to the second gate electrode layer 144 via a contact pad layer 162 and a contact plug 164. The image sensor 1 may further include a selection transistor (SEL in FIG. 22A or 22B).

Based on the inter-substrate insulating layer 300, the photo sensing device PD may be arranged on the side of the second substrate layer 200, and the floating diffusion region FD may be arranged on the side of the first substrate layer 100. For example, according to embodiments, the photo sensing device PD may be arranged on a side of the second substrate layer 200 relative to the inter-substrate insulating layer 300, and the floating diffusion region FD may be arranged on a side of the first substrate layer 100 relative to the inter-substrate insulating layer 300 (e.g., the inter-substrate insulating layer 300 may be used as a reference). In some embodiments, the photo sensing device PD may be arranged in the second substrate layer 200, and the floating diffusion region FD may be arranged in the first substrate layer 100.

The first substrate layer 100 may include, for example, a Group IV semiconductor material, a Group III-V semiconductor material, or a Group II-VI semiconductor material. The Group IV semiconductor material may include, for example, silicon (Si), germanium (Ge), or Si-Ge. The Group III-V semiconductor material may include, for example, gallium arsenide (GaAs), indium phosphor (InP), gallium phosphor (GaP), indium arsenide (InAs), indium antimony (InSb), or indium gallium arsenide (InGaAs). The Group II-VI semiconductor material may include, for example, zinc telluride (ZnTe) or cadmium sulfide (CdS).

On some portions of the first substrate layer 100, a first impurity region 122, a second impurity region 124, and a third impurity region 126 may be formed. For example, the first substrate layer 100 may be doped with impurities of a first conductivity type, and each of the first impurity region 122, the second impurity region 124, and the third impurity region 126 may be doped with impurities of a second conductivity type that is different from the first conductivity type. In some embodiments, the first conductivity type may be a p-type and the second conductivity type may be an n-type. For example, the impurities of the first conductive type may include one or more of boron (B), aluminum (Al), gallium (Ga), indium (In), thallium (Tl), zinc (Zn), cadmium (Cd), and mercury (Hg). For example, the impurities of the second conductive type may include one or more of nitrogen (N), phosphorus (P), arsenic (As), antimony (Sb), bismuth (Bi), sulfur (S), selenium (Se), tellurium (Te), and polonium (Po).

The first impurity region 122 may be arranged adjacent to a channel layer 110. For example, the first impurity region 122 may be arranged to contact the channel layer 110. At least a portion of the first impurity region 122 (e.g., the portion contacting the channel layer 110) may include the floating diffusion region FD. The third impurity region 126 may be arranged adjacent to the first impurity region 122, but may be arranged apart from the first impurity region 122. For example, the third impurity region 126 may be arranged adjacent to the first impurity region 122 without contacting the first impurity region 122. The second impurity region 124 may be arranged apart from each of the first impurity region 122 and the third impurity region 126. For example, the image sensor 1 may include a pair of second impurity regions 124 adjacent to each other but apart from each other corresponding to each of the plurality of photo sensing device PD.

In some embodiments, each of the first impurity region 122, the second impurity region 124, and the third impurity region 126 may have substantially the same thickness as the first substrate layer 100. That is, in some embodiments, a thickness of each of the first impurity region 122, the second impurity region 124, and the third impurity region 126 may be substantially equal to a thickness of the first substrate layer 100. For example, an upper surface of each of the first impurity region 122, the second impurity region 124, and the third impurity region 126 may be arranged at the same vertical level to be substantially coplanar with the upper surface of the first substrate layer 100, and a lower surface of each of the first impurity region 122, the second impurity region 124, and the third impurity region 126 may be at the same vertical level to be substantially coplanar with the lower surface of the first substrate layer 100. The first impurity region 122 may include the floating diffusion region FD and a source region of the reset transistor RST, the second impurity region 124 may include a source region and a drain region of the source follower transistor SF, and the third impurity region 126 may include a drain region of the reset transistor RST.

According to embodiments of the inventive concept, an upper surface and a lower surface of a component may mean an upper side surface and a lower side surface of a component based on described drawings. For example, in this case, an upper surface and a lower surface of a component may refer to the upper side surface and the lower side surface of a component with reference to FIG. 1, not FIGS. 10A to 10C referred together.

The channel layer 110 may penetrate the first substrate layer 100 and the inter-substrate insulating layer 300, and extend to the second substrate layer 200. In some embodiments, the channel layer 110 may contact the second substrate layer 200. For example, the channel layer 110 may be doped with impurities of a first conductivity type. The channel layer 110 may cover an inner wall of a channel hole CH penetrating the first substrate layer 100 and the inter-substrate insulating layer 300. For example, the channel layer 110 may contact the first substrate layer 100 and the inter-substrate insulating layer 300, which are arranged on the inner wall of the channel hole CH. The channel layer 110 may limit a size of a gate hole GH in the channel hole CH. The gate hole GH may penetrate the channel layer 110. The gate holes GH may include the channel layer 110 therebetween, and may penetrate the first substrate layer 100 and the inter-substrate insulating layer 300, and extend to the second substrate layer 200.

The second substrate layer 200 may include the same material as the first substrate layer 100. For example, the second substrate layer 200 may include a Group IV semiconductor material, a Group III-V semiconductor material, or a Group II-VI semiconductor material. The Group IV semiconductor material may include, for example, Si, Ge, or Si-Ge. The Group III-V semiconductor material may include, for example, GaAs, InP, GaP, InAs, InSb, or InGaAs. The Group II-VI semiconductor material may include, for example, ZnTe or CdS.

A plurality of photodiode regions 210 may be arranged in the second substrate layer 200. Each of the plurality of photodiode regions 210 may be doped with impurities of a second conductivity type. Each of the plurality of photodiode regions 210 may constitute the photo sensing device PD. In some embodiments, the photodiode region 210 may be spaced apart from the channel layer 110, the channel hole CH, and the gate hole GH. For example, a portion of the second substrate layer 200 may be arranged between each of the photodiode region 210, the channel layer 110, the channel hole CH, and the gate hole GH.

In FIGS. 1, 10B, and 10C, the second substrate layer 200 is illustrated as completely surrounding the plurality of photodiode regions 210. However, embodiments of the inventive concept are not limited thereto. For example, in FIG. 1, a portion of the second substrate layer 200 is arranged between the plurality of photodiode regions 210 and the front passivation layer 510, but is not limited thereto, and the plurality of photodiode regions 210 may directly contact the front passivation layer 510.

A pixel isolation region DTI may surround the periphery of each of the plurality of photo sensing devices PD in the second substrate layer 200. The pixel isolation region DTI may have a grid shape or mesh shape in a plan view. In some embodiments, the pixel isolation region DTI may extend from an upper surface to a lower surface of the second substrate layer 200. However, embodiments of the inventive concept are not limited thereto. For example, the pixel isolation region DTI may be spaced apart from one of the upper surface and the lower surface of the second substrate layer 200. The pixel isolation region DTI may include, for example, a deep trench isolation layer.

A plurality of gate structures including a first gate structure GS1, a second gate structure GS2, and a third gate structure GS3 may be arranged on the first substrate layer 100. Each of the plurality of gate structures may include a gate insulating layer and a gate electrode layer. For example, the first gate structure GS1 may have a stacked structure of a first gate insulating layer 132 and a first gate electrode layer 142, the second gate structure GS2 may have a stacked structure of a second gate insulating layer 134 and the second gate electrode layer 144, and the third gate structure GS3 may have a stacked structure of a third gate insulating layer 136 and a third gate electrode layer 146.

The first gate electrode layer 142 may include a transfer gate constituting the transfer transistor TT, the second gate electrode layer 144 may include a source follower gate constituting the source follower transistor SF, and the third gate electrode layer 146 may include a reset gate constituting the reset transistor RST. The floating diffusion region FD may be connected to the transfer transistor TT. According to embodiments, the image sensor 1 may further include a separate gate electrode layer, which is a selection gate constituting the selection transistor SEL.

In some embodiments, the first gate electrode layer 142 may include a vertical gate, and each of the second gate electrode layer 144 and the third gate electrode layer 146 may include a planar gate. The first gate structure GS1 may extend onto the lower surface of the channel layer 110 while filling the gate hole GH. The second gate structure GS2 and the third gate structure GS3 may be arranged under the lower surface of the first substrate layer 100.

The first gate insulating layer 132 may cover an inner wall and a bottom surface of the gate hole GH. In some embodiments, the first gate insulating layer 132 may extend from the inside of the gate hole GH onto the lower surface of the channel layer 110. The lower surface of the channel layer 110 may mean a surface of the channel layer 110 opposite to the inter-substrate insulating layer 300. The first gate electrode layer 142 may cover the first gate insulating layer 132, and fill the gate hole GH. The first gate insulating layer 132 may be arranged between each of the channel layer 110 and the second substrate layer 200, and the first gate electrode layer 142. Each of the second gate insulating layer 134 and the third gate insulating layer 136 may be arranged under the lower surface of the first substrate layer 100. The second gate electrode layer 144 and the third gate electrode layer 146 may be arranged between the second gate insulating layer 134 and the third gate insulating layer 136, and may be arranged under the lower surface of the first substrate layer 100. The second gate structure GS2 may be arranged on the lower surface of the first substrate layer 100 between a pair of second impurity regions 124. The third gate structure GS3 may be arranged under the lower surface of the first substrate layer 100 between the first impurity region 122 and the third impurity region 126.

An inter-gate insulating layer 150 surrounding the first gate structure GS1, the second gate structure GS2, and the third gate structure GS3 may be arranged under the lower surface of the first substrate layer 100. The inter-gate insulating layer 150 may cover side surfaces of each of the first gate structure GS1, the second gate structure GS2, and the third gate structure GS3, that is, side surfaces of the first gate electrode layer 142, side surfaces of the second gate insulating layer 134, side surfaces of the second gate electrode layer 144, side surfaces of the third gate insulating layer 136, and side surfaces of the third gate electrode layer 146, on the lower surface of the first substrate layer 100.

The contact structure 160 may be arranged under the lower surface of the inter-gate insulating layer 150. The contact structure 160 may include a plurality of contact pad layers 162, the contact plug 164 connected to the plurality of contact pad layers 162, and an interlayer insulating layer 166 surrounding a plurality of contact plugs 164 and covering the lower surface of the inter-gate insulating layer 150. In some embodiments, the contact structure 160 may have a multilayer structure, in which some of the plurality of contact pad layers 162 are arranged at a different vertical level than the others thereof.

Each of the plurality of contact plugs 164 may be connected to one of the first impurity region 122, the second impurity region 124, the third impurity region 126, the first gate electrode layer 142, the second gate electrode layer 144, and the third gate electrode layer 146. The plurality of contact pad layers 162 may be electrically connected to one of the first impurity region 122, the second impurity region 124, the third impurity region 126, the first gate electrode layer 142, the second gate electrode layer 144, and the third gate electrode layer 146, via the plurality of contact plugs 164.

The wiring structure 170 may be arranged under the lower surface of the contact structure 160. The wiring structure 170 may include a plurality of conductive wirings 172 and a wiring insulating layer 176 surrounding the plurality of conductive wirings 172 and covering the lower surface of the contact structure 160. The plurality of conductive wirings 172 may include a plurality of wiring lines and a plurality of wiring vias connecting the plurality of wiring lines to the plurality of contact pad layers 162.

The logic substrate WFL may be arranged under a lower surface of the wiring structure 170. The logic substrate WFL may include a third substrate layer 410, a logic circuit device 420 arranged in the third substrate layer 410, and a logic wiring insulating layer 430. The logic wiring insulating layer 430 may contact the wiring insulating layer 176. The wiring insulating layer 176 may be referred to as a first wiring insulating layer, and the logic wiring insulating layer 430 may be referred to as a second wiring insulating layer. In some embodiments, the third substrate layer 410 may include the same material as the first substrate layer 100 or the second substrate layer 200. For example, the third substrate layer 410 may include a Group IV semiconductor material, a Group III-V semiconductor material, or a Group II-VI semiconductor material. A logic circuit device 420 may include at least some of a row driver 1120, a controller 1130, and a pixel signal processor 1140 illustrated in FIG. 20, or at least some of a vertical drive circuit 2400, a column signal processing circuit 2500, a horizontal drive circuit 2600, an output circuit 2700, and a control circuit 2800.

The photo device substrate WFO may be electrically connected to the logic substrate WFL by using a plurality of bonding pads BP. For example, the plurality of bonding pads BP may electrically connect the plurality of conductive wirings 172 to the logic circuit device 420. The plurality of bonding pads BP may include a first pad unit 190 arranged on the wiring structure 170 and a second pad unit 490 arranged on the logic substrate WFL. In some embodiments, the wiring insulating layer 176 may surround the first pad unit 190, and the logic wiring insulating layer 430 may surround the second pad unit 490. For example, the wiring insulating layer 176 may surround side surfaces of the first pad unit 190, and the logic wiring insulating layer 430 may surround side surfaces of the second pad unit 490.

The plurality of bonding pads BP may be arranged on an interface between the wiring structure 170 and the logic substrate WFL, that is, an interface between the wiring insulating layer 176 and the logic wiring insulating layer 430. The first pad unit 190 and the second pad unit 490, which correspond to each other and form the bonding pad BP, may be arranged to vertically overlap each other, and may be attached to each other. For example, a bonding interface, which is the interface between the first pad unit 190 and the second pad unit 490, may be arranged on the same plane as the interface between the wiring insulating layer 176 and the logic wiring insulating layer 430. The first pad unit 190 and the second pad unit 490, which correspond to each other, may become the bonding pad BP, in which the first pad unit 190 and the second pad unit 490 are expanded due to heat, bonded to each other, and diffusion bonded to make one body by using diffusion of metal atoms therein. The wiring insulating layer 176 and the logic wiring insulating layer 430 may be bonded to each other while forming a covalent bonding. For example, the photo device substrate WFO and the logic substrate WFL may be stacked in a metal-oxide hybrid bonding method.

In the image sensor 1 according to embodiments of the inventive concept, the photo sensing device PD and the floating diffusion region FD may be spaced apart from each other with the inter-substrate insulating layer 300 arranged therebetween. A flow path FP of a charge between the photo sensing device PD and the floating diffusion region FD may be formed through the channel layer 110. Accordingly, the inter-substrate insulating layer 300 may be arranged between the photo sensing device PD and the floating diffusion region FD, for example, between the second substrate layer 200 and the floating diffusion region FD. Thus, the second substrate layer 200 and the floating diffusion region FD are not pn-bonded according to embodiments. Thus, a parasitic capacitance arranged between the photo sensing device PD and the floating diffusion region FD may be reduced, and a conversion gain may be increased. As a result, the photo sensing capability of the image sensor 1 may be increased.

Figure 2A:
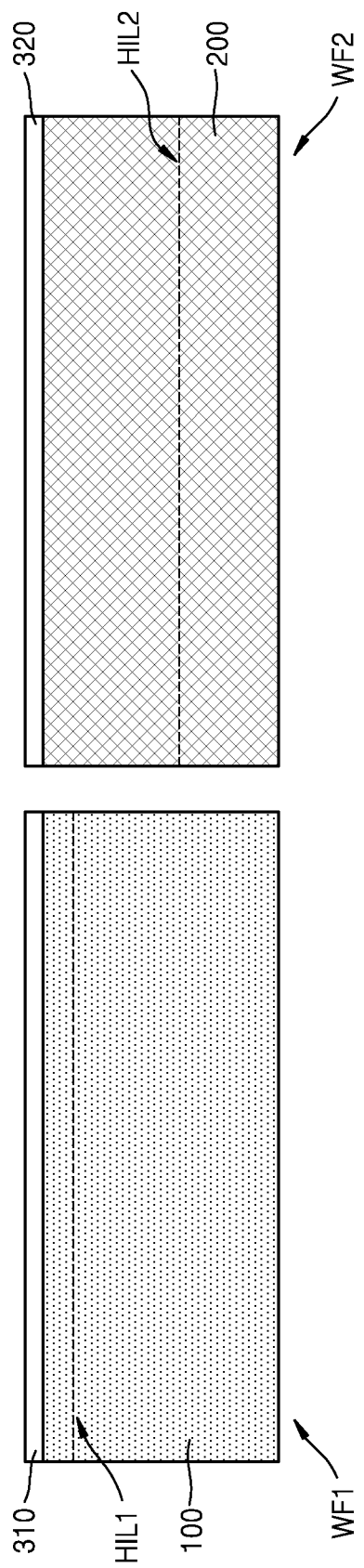
FIGS. 2A to 2C, 3, 4, 5A, 5B, 6A, 6B, 7A, 7B, 8A to 8C, 9A to 9C, 10A to 10C and 11 are plan layouts and cross-sectional views illustrating a manufacturing method of an image sensor, according to embodiments.

Referring to FIG. 2A, a first wafer WF1 including the first substrate layer 100 and a second wafer WF2 including the second substrate layer 200 may be prepared. A first bonding insulating layer 310 may be formed on the first substrate layer 100, and a second bonding insulating layer 320 may be formed on the second substrate layer 200.

Hydrogen ions may be injected into each of the first wafer WF1 and the second wafer WF2, and a first hydrogen injection layer HIL1 and a second hydrogen injection layer HIL2 may be formed in the first substrate layer 100 and the second substrate layer 200, respectively. Hydrogen ions may be injected into each of the first substrate layer 100 and the second substrate layer 200 by using energy equal to or less than about 50 KeV. The injection energy of hydrogen ions for forming the first hydrogen injection layer HIL1 may be less than the injection energy of hydrogen ions for forming the second hydrogen injection layer HIL2. The depth from the first bonding insulating layer 310 to the first hydrogen injection layer HIL1 may be less than the depth from the second bonding insulating layer 320 to the second hydrogen injection layer HIL2. For example, the depth from the first bonding insulating layer 310 to the first hydrogen injection layer HIL1 may be hundreds of nm, and the depth from the second bonding insulating layer 320 to the second hydrogen injection layer HIL2 may be several μm.

Figure 2B:
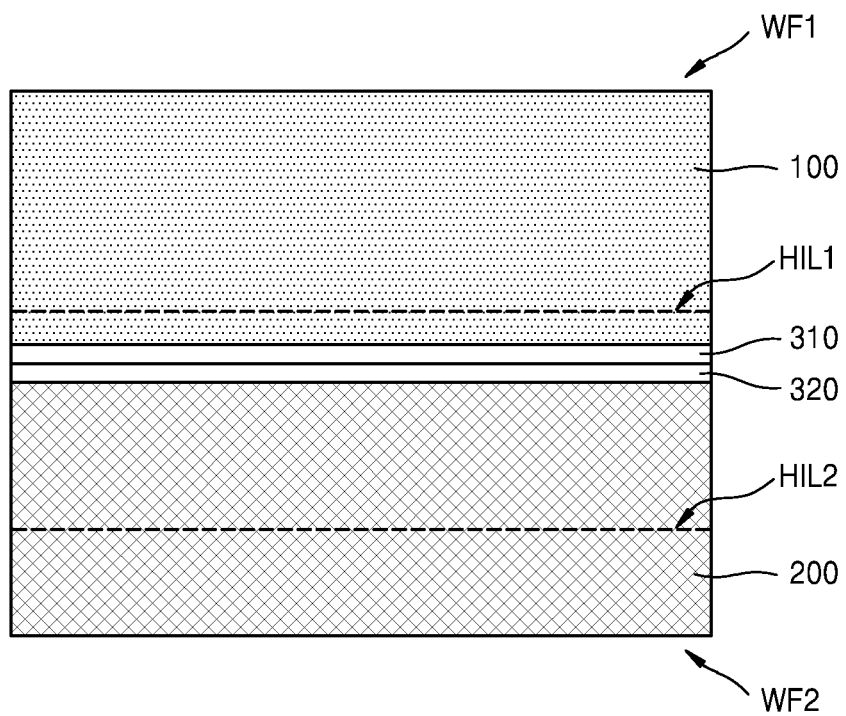

Referring to FIG. 2B, the first wafer WF1 and the second wafer WF2 may be caused to contact to each other so that the first bonding insulating layer 310 contacts the second bonding insulating layer 320.

Figure 2C:
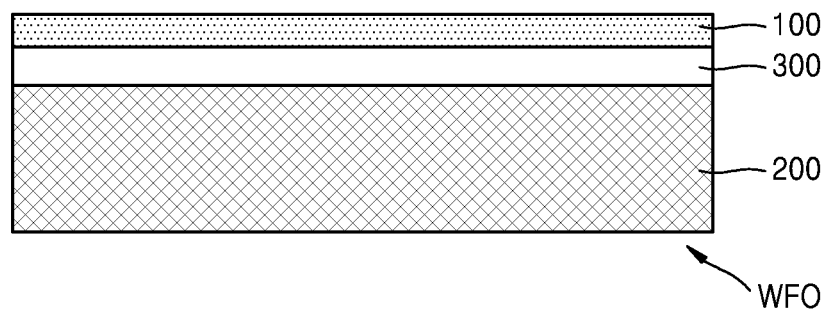

Referring to FIGS. 2B and 2C together, the first wafer WF1 and the second wafer WF2 may be heat-treated to form the inter-substrate insulating layer 300, in which the first bonding insulating layer 310 and the second bonding insulating layer 320 are bonded, and the blister may be formed in each of the first hydrogen injection layer HIL1 and the second hydrogen injection layer HIL2. As a result, a flake phenomenon, in which each of the first substrate layer 100 and the second substrate layer 200 are separated, may occur. The first substrate layer 100 and the second substrate layer 200 may be separated from each other, and the photo device substrate WFO may be formed, in which only a portion of the first substrate layer 100 and a portion of the second substrate layer 200, which are close to the inter-substrate insulating layer 300 with respect to the centers of the first hydrogen injection layer HIL1 and the second hydrogen injection layer HIL2, respectively, remain on the upper surface and the lower surface of the inter-substrate insulating layer 300, respectively.

In the photo device substrate WFO, the first substrate layer 100 may have a thickness of hundreds of nm, the second substrate layer 200 may have a thickness of several μm, and the inter-substrate insulating layer 300 may have a thickness of tens to hundreds of nm. In some embodiments, in the photo device substrate WFO, the first substrate layer 100 may have a thickness of about 300 nm or less, and the second substrate layer 200 may have a thickness of about 4 μm or less.

Figure 3:
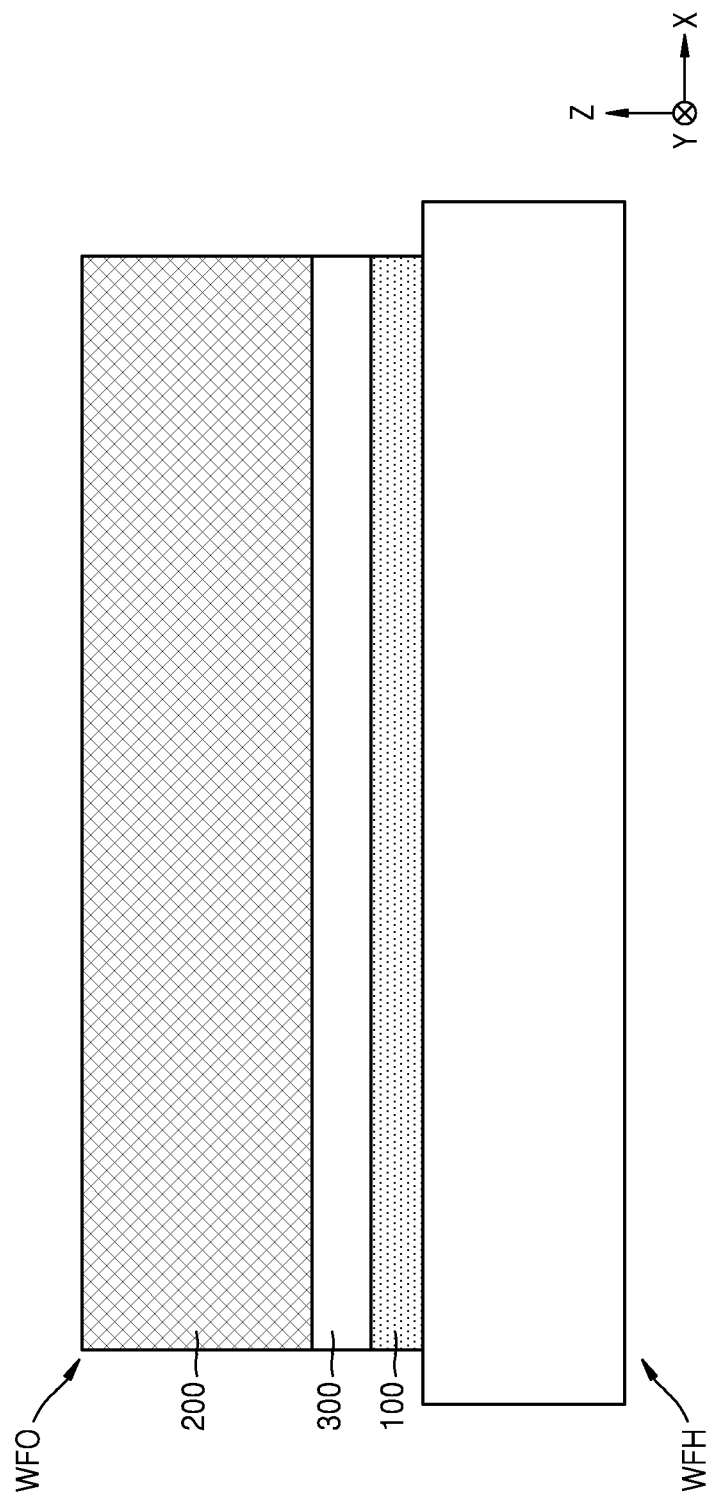

Referring to FIG. 3, the photo device substrate WFO may be attached to a handling substrate WFH. The photo device substrate WFO may be attached to the handling substrate WFH so that the first substrate layer 100 faces the handling substrate WFH.

Figure 4:
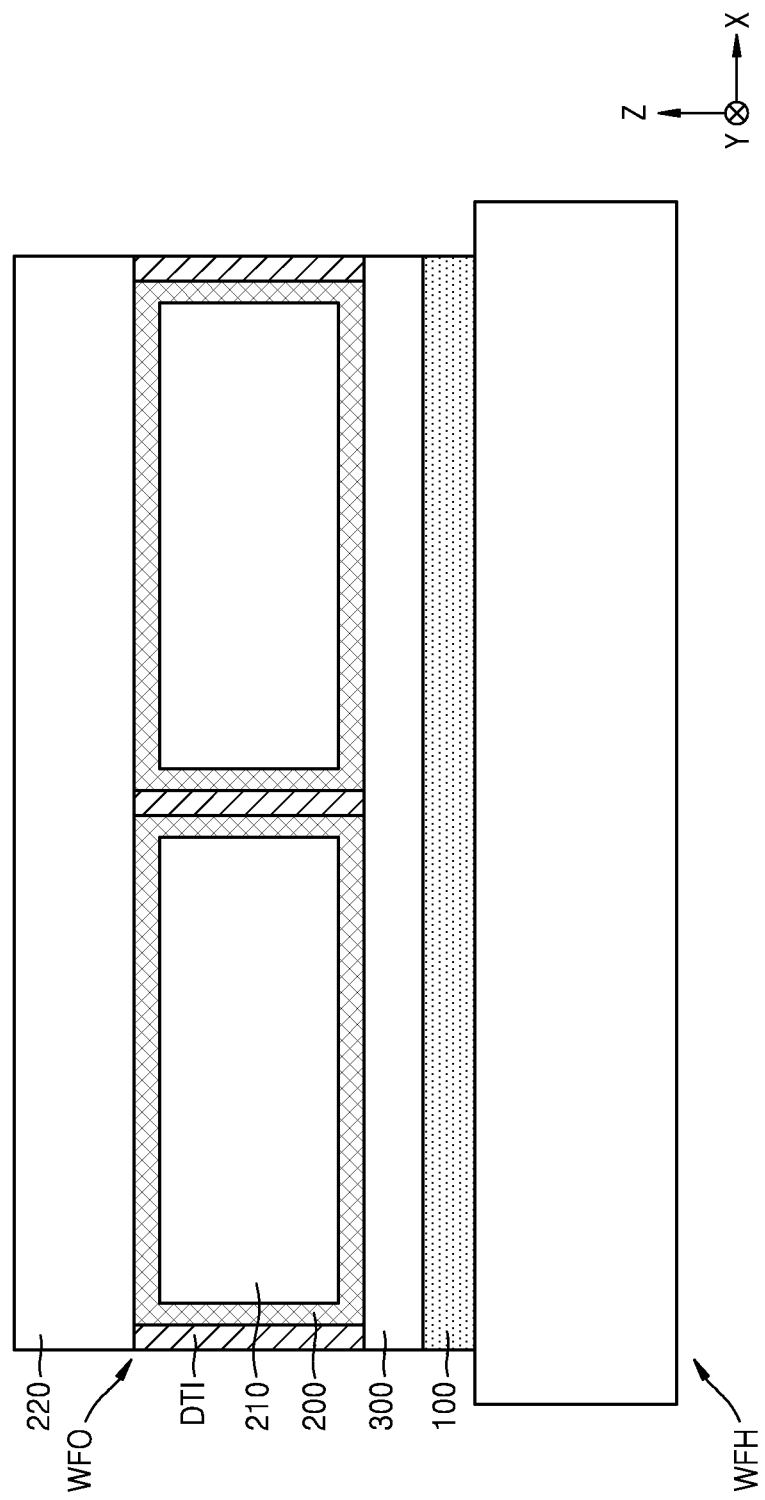

Referring to FIG. 4, in the second substrate layer 200, the plurality of photodiode regions 210 and the pixel isolation region DTI surrounding the boundary of each of the plurality of photodiode regions 210 may be formed. The pixel isolation region DTI may be formed to have a grid or mesh shape in a plan view. In some embodiments, the pixel isolation region DTI may be formed to extend from the upper surface to the lower surface of the second substrate layer 200. However, embodiments of the inventive concept are not limited thereto. For example, the pixel isolation region DTI may be formed to be spaced apart from any one of the upper surface and the lower surface of the second substrate layer 200.

Thereafter, the protective insulating layer 220 may be formed on the second substrate layer 200. The protective insulating layer 220 may be formed to be relatively thick. For example, the second substrate layer 200 may be formed to be thicker than the inter-substrate insulating layer 300. Thereafter, the photo device substrate WFO may be separated from the handling substrate WFH.

Referring to FIGS. 5A and 5B together, the resultant product of FIG. 4 may be rotated upside down so that the protective insulating layer 220 is oriented downward and the photo device substrate WFO is oriented upward.

By removing a portion of the first substrate layer 100 and a portion of the inter-substrate insulating layer 300, a plurality of channel holes CH penetrating the first substrate layer 100 and the inter-substrate insulating layer 300 may be formed. In some embodiments, the second substrate layer 200 may be exposed on a bottom surface of the channel hole CH. In some other embodiments, the channel hole CH may extend into the second substrate layer 200, and the photodiode region 210 may be exposed on the bottom surface of the channel hole CH. In some embodiments, a horizontal cross-section of the channel hole CH may have a circular shape, but is not limited thereto. For example, the horizontal cross-section of the channel hole CH may have a polygonal shape, such as a circular shape, an elliptical shape, or a rectangular shape.

Referring to FIGS. 6A and 6B together, the channel layer 110 filling the channel hole CH may be formed. For example, the channel layer 110 may be doped with impurities of a first conductivity type. The channel layer 110 may be formed by performing a selective epitaxial growth (SEG) process by using the second substrate layer 200 as a seed layer. The channel layer 110 may be formed such that the upper surface of the first substrate layer 100 is substantially coplanar with an upper surface of the channel layer 110.

Referring to FIGS. 7A and 7B together, by removing a portion of the channel layer 110, a plurality of gate holes GH penetrating the channel layer 110 may be formed. The gate holes GH may include the channel layer 110 therebetween, and may be formed to penetrate the first substrate layer 100 and the inter-substrate insulating layer 300, and extend to the second substrate layer 200. The channel layer 110 may limit the gate hole GH in the channel hole CH. As a result of the forming of the gate hole GH, the channel layer 110 may cover the inner wall of the channel hole CH penetrating the first substrate layer 100 and the inter-substrate insulating layer 300, and may limit the size of the gate hole GH inside the channel hole CH.

Figure 8C:
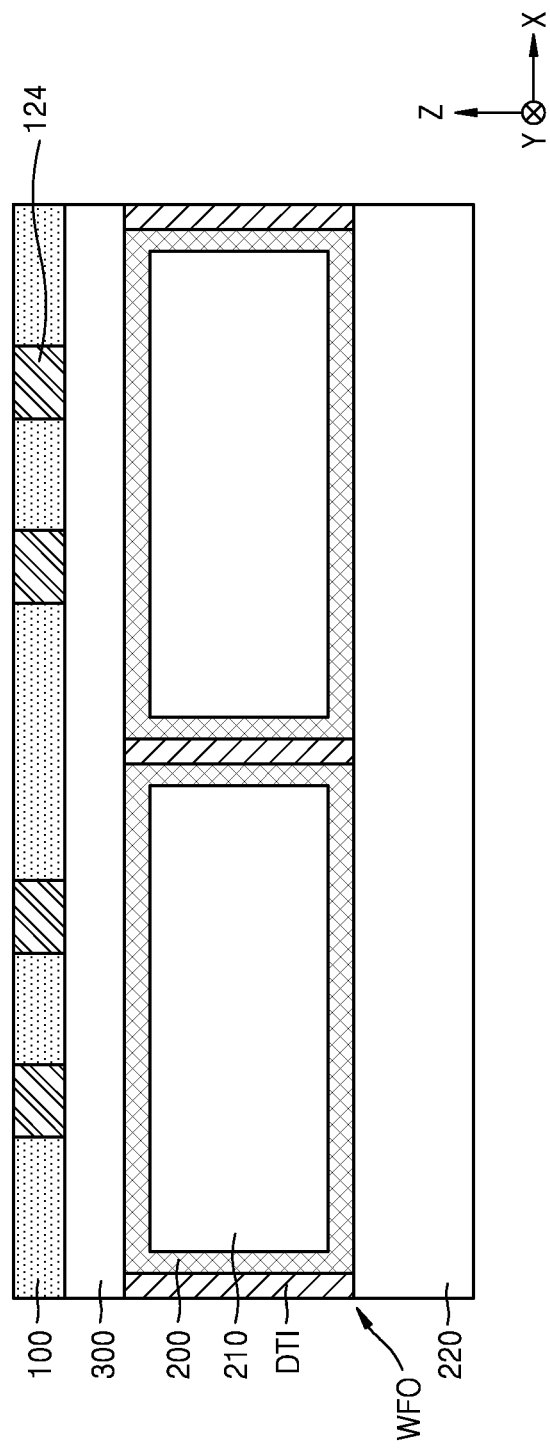

Referring to FIGS. 8A to 8C together, the first impurity region 122, the second impurity region 124, and the third impurity region 126 may be formed on some portions of the first substrate layer 100. For example, by doping some portions of the first substrate layer 100 with impurities of a second conductive type, the first impurity region 122, the second impurity region 124, and the third impurity region 126 may be formed.

In some embodiments, each of the first impurity region 122, the second impurity region 124, and the third impurity region 126 may be formed to have the same thickness as the first substrate layer 100. For example, each of the first impurity region 122, the second impurity region 124, and the third impurity region 126 may be formed by doping impurities of a second conductive type from the upper surface of the first substrate layer 100 to the lower surface of the first substrate layer 100.

The first impurity region 122 may be formed adjacent to a channel layer 110. The third impurity region 126 may be formed to be adjacent to the first impurity region 122, but spaced apart from the first impurity region 122. The second impurity region 124 may be formed to be spaced apart from each of the first impurity region 122 and the third impurity region 126. For example, a pair of second impurity regions 124 adjacent to each other but spaced apart from each other corresponding to each of a plurality of photodiode regions 210 may be formed.

Figure 9A:
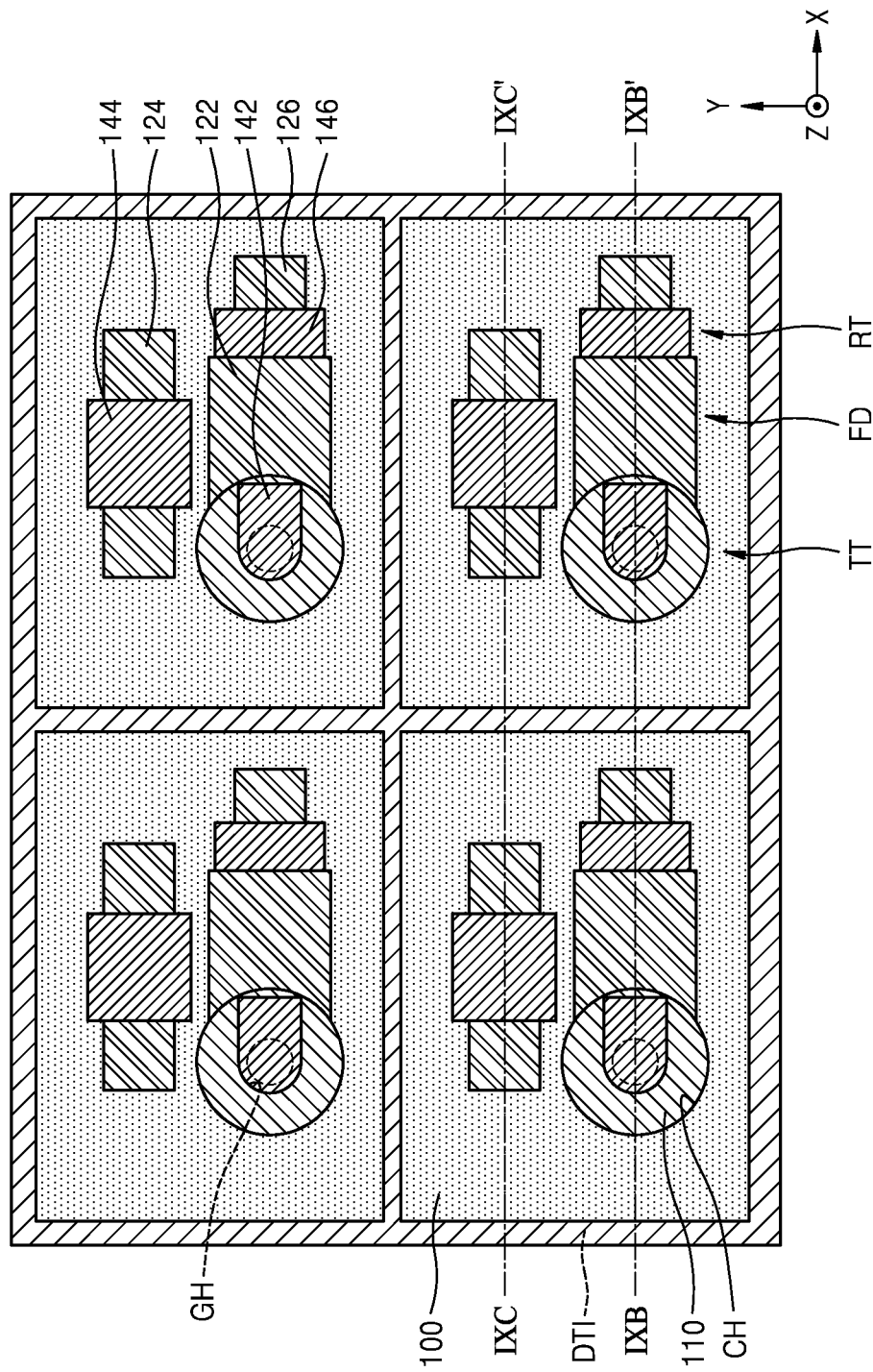
Figure 9B:
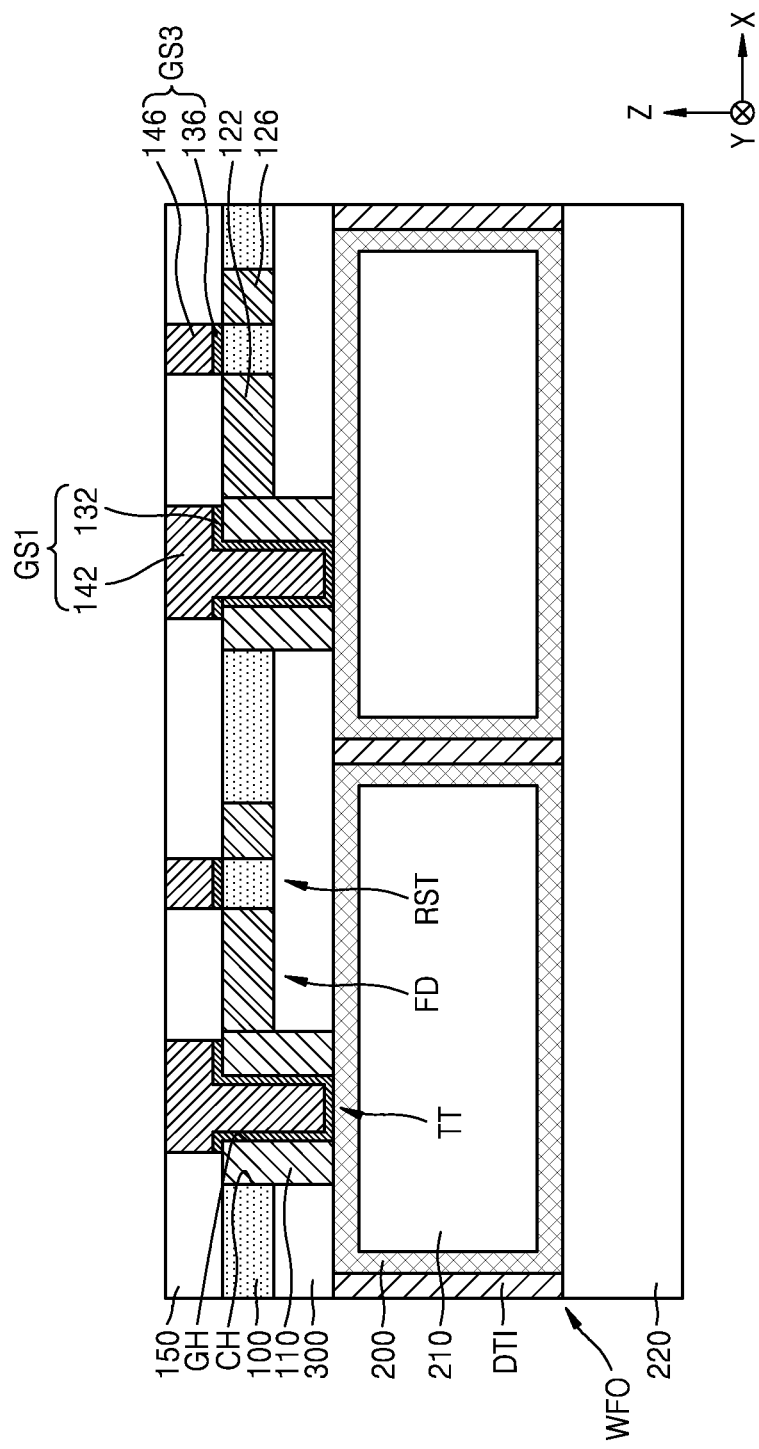
Figure 9C:
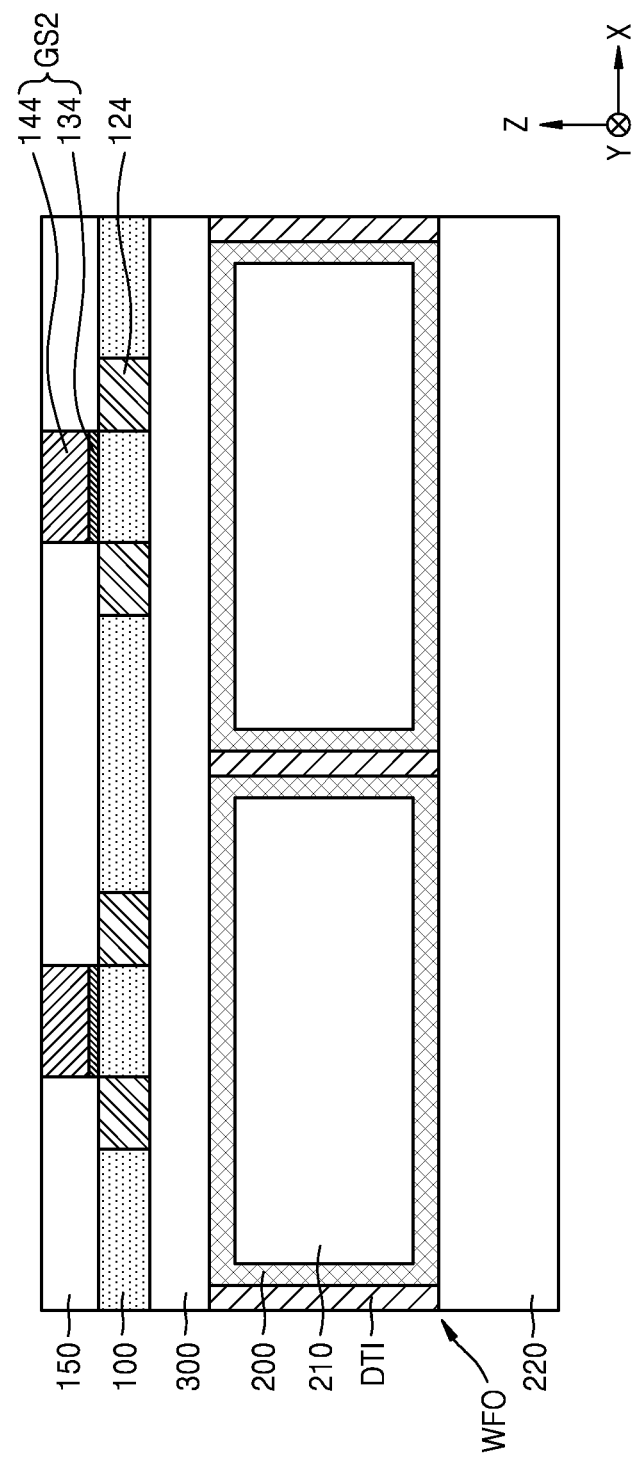

Referring to FIGS. 9A to 9C together, a plurality of gate structures including the first gate structure GS1, the second gate structure GS2, and the third gate structure GS3 may be formed on the first substrate layer 100. Each of the plurality of gate structures may be formed to include a gate insulating layer and a gate electrode layer. For example, the first gate structure GS1 may be formed to have a stacked structure of a first gate insulating layer 132 and a first gate electrode layer 142, the second gate structure GS2 may be formed to have a stacked structure of a second gate insulating layer 134 and the second gate electrode layer 144, and the third gate structure GS3 may be formed to have a stacked structure of a third gate insulating layer 136 and a third gate electrode layer 146.

In some embodiments, the first gate electrode layer 142 may be formed as a vertical gate, and each of the second gate electrode layer 144 and the third gate electrode layer 146 may be formed as a planar gate. The first gate structure GS1 may fill the gate hole GH. In some embodiments, the first gate structure GS1 may be formed to fill the gate hole GH and extend to the upper surface of the channel layer 110. The second gate structure GS2 and the third gate structure GS3 may be formed on the upper surface and under the upper surface of the first substrate layer 100, respectively.

The first gate insulating layer 132 may be formed to cover the inner wall and the bottom surface of the gate hole GH. In some embodiments, the first gate insulating layer 132 may be formed to extend from the inside of the gate hole GH onto the lower surface of the channel layer 110. The first gate electrode layer 142 may be formed to cover the first gate insulating layer 132 and fill the gate hole GH. The first gate insulating layer 132 may be formed to be arranged between each of the channel layer 110 and the second substrate layer 200, and the first gate electrode layer 142. Each of the second gate insulating layer 134 and the third gate insulating layer 136 may be formed on the upper surface and under the upper surface of the first substrate layer 100, respectively. The second gate electrode layer 144 and the third gate electrode layer 146 may have the second gate insulating layer 134 and the third gate insulating layer 136 therebetween, and may be arranged on the upper surface and under the upper surface of the first substrate layer 100, respectively. The second gate structure GS2 may be formed on the upper surface of the first substrate layer 100 between a pair of second impurity regions 124. The third gate structure GS3 may be formed under the upper surface of the first substrate layer 100 between the first impurity region 122 and the third impurity region 126.

The inter-gate insulating layer 150 may be formed on the upper surface of the first substrate layer 100. The inter-gate insulating layer 150 may surround the first gate structure GS1, the second gate structure GS2, and the third gate structure GS3. The inter-gate insulating layer 150 may be formed to cover the side surfaces of each of the first gate structure GS1, the second gate structure GS2, and the third gate structure GS3 on the upper surface of the first substrate layer 100.

Referring to FIGS. 10A to 10C together, the contact structure 160 may be formed on an upper surface of the inter-gate insulating layer 150. The contact structure 160 may be formed to include the plurality of contact pad layers 162, the contact plug 164 connected to the plurality of contact pad layers 162, and the interlayer insulating layer 166 surrounding a plurality of contact plugs 164 and covering the upper surface of the inter-gate insulating layer 150. In some embodiments, the contact structure 160 may be formed to have a multilayer structure, in which some of the plurality of contact pad layers 162 and the others thereof are arranged at different vertical levels from each other.

Each of the plurality of contact plugs 164 may be connected to one of the first impurity region 122, the second impurity region 124, the third impurity region 126, the first gate electrode layer 142, the second gate electrode layer 144, and the third gate electrode layer 146. The plurality of contact pad layers 162 may be electrically connected to one of the first impurity region 122, the second impurity region 124, the third impurity region 126, the first gate electrode layer 142, the second gate electrode layer 144, and the third gate electrode layer 146, via the plurality of contact plugs 164.

Some of the plurality of contact pad layers 162 and some of the plurality of contact plugs 164 may be formed to electrically connect the first impurity region 122 to the second gate electrode layer 144.

Referring to FIG. 11, the wiring structure 170 may be formed on an upper surface of the contact structure 160. The wiring structure 170 may be formed to include the plurality of conductive wirings 172 and the wiring insulating layer 176 surrounding the plurality of conductive wirings 172 and covering the lower surface of the contact structure 160. The plurality of conductive wirings 172 may be formed to include the plurality of wiring lines and the plurality of wiring vias connecting the plurality of wiring lines to the plurality of contact pad layers 162.

The logic substrate WFL may be attached to the upper surface of the wiring structure 170. The logic substrate WFL may include the third substrate layer 410, the logic circuit device 420 arranged in the third substrate layer 410, and the logic wiring insulating layer 430. The logic wiring insulating layer 430 may be formed to contact the wiring insulating layer 176.

The photo device substrate WFO may be electrically connected to the logic substrate WFL by using the plurality of bonding pads BP. For example, the plurality of bonding pads BP may electrically connect the plurality of conductive wirings 172 to the logic circuit device 420. The plurality of bonding pads BP may include the first pad unit 190 arranged on the wiring structure 170 and the second pad unit 490 arranged on the logic substrate WFL. In some embodiments, the wiring insulating layer 176 may surround the first pad unit 190, and the logic wiring insulating layer 430 may surround the second pad unit 490. For example, the wiring insulating layer 176 may surround side surfaces of the first pad unit 190, and the logic wiring insulating layer 430 may surround side surfaces of the second pad unit 490.

The plurality of bonding pads BP may be formed to be arranged on the interface between the wiring structure 170 and the logic substrate WFL, that is, the interface between the wiring insulating layer 176 and the logic wiring insulating layer 430. The first pad unit 190 and the second pad unit 490, which correspond to each other and form the bonding pad BP, may be arranged to vertically overlap each other, and may be attached to each other. For example, a bonding interface, which is the interface between the first pad unit 190 and the second pad unit 490, may be formed to be arranged on the same plane as the interface between the wiring insulating layer 176 and the logic wiring insulating layer 430. The first pad unit 190 and the second pad unit 490, which correspond to each other, may form the bonding pad BP, in which the first pad unit 190 and the second pad unit 490 are expanded due to heat, bonded to each other, and diffusion bonded to make one body by using diffusion of metal atoms therein. The wiring insulating layer 176 and the logic wiring insulating layer 430 may be bonded to each other while forming a covalent bonding. For example, the logic substrate WFL may be stacked on the photo device substrate WFO in a metal-oxide hybrid bonding method.

Thereafter, as illustrated in FIG. 1, by flipping the resultant product of FIG. 11, the protective insulating layer 220 may be oriented upward, and the photo device substrate WFO may be oriented downward, and by removing the protective insulating layer 220, and forming the front passivation layer 510, the guide pattern 520, a plurality of color filters 530, and a plurality of microlenses 500 on the second substrate layer 200, the image sensor 1 may be formed.

Figure 12:
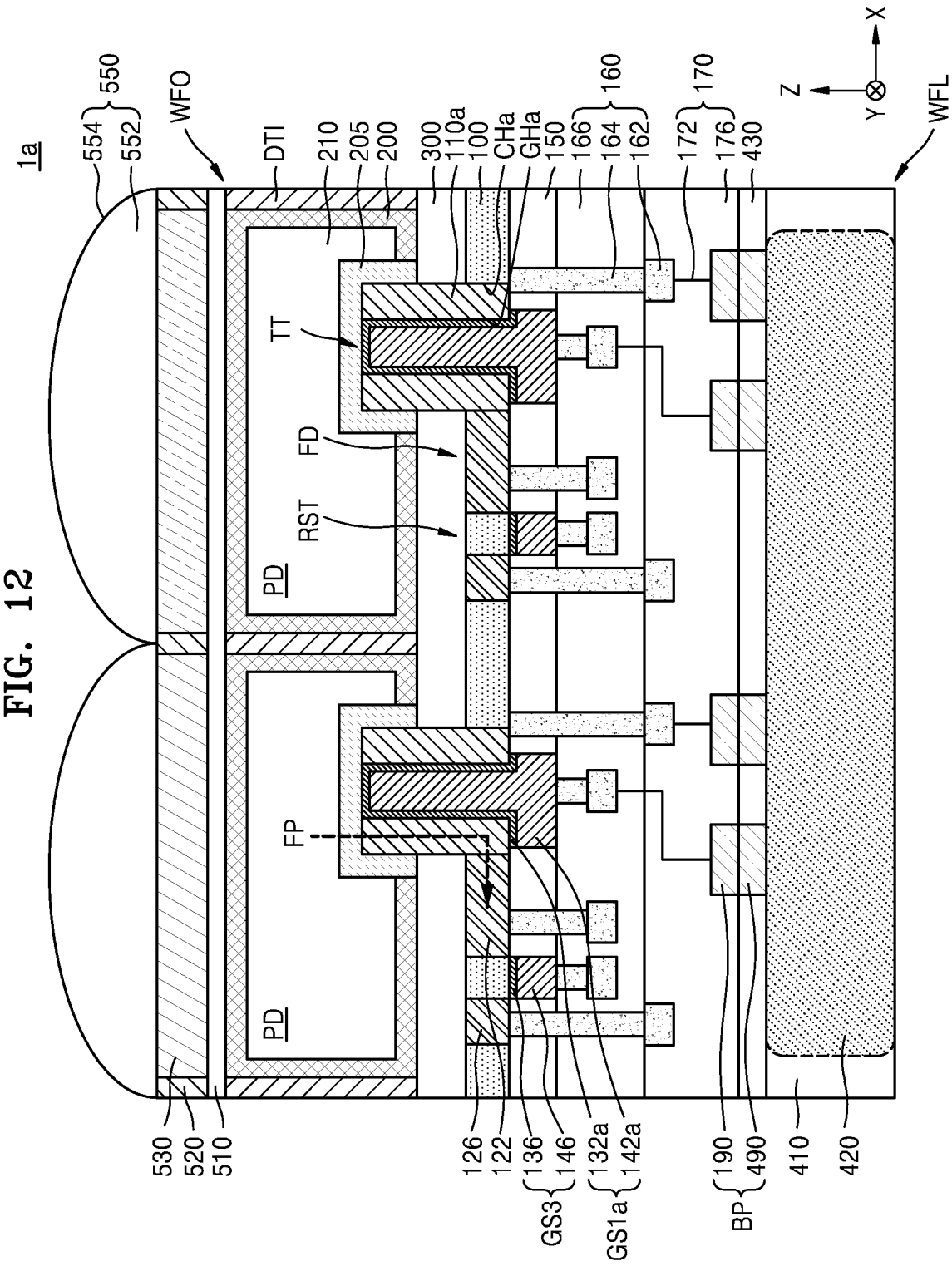
FIG. 12 is a cross-sectional view of an image sensor according to an embodiment.

FIG. 12 is a cross-sectional view of an image sensor 1a according to an embodiment. For convenience of explanation, a further description of components and technical aspects previously described may be omitted with reference to FIG. 1 may be omitted.

Referring to FIG. 12 together with FIGS. 10A to 10C, the image sensor 1a may include the photo device substrate WFO including the plurality of photo sensing devices PD, the plurality of microlenses 550 arranged on the photo device substrate WFO, and the plurality of color filters 530 arranged between the photo device substrate WFO and the plurality of microlenses 550.

The photo device substrate WFO may include a first substrate layer 100, a second substrate layer 200, and an inter-substrate insulating layer 300 arranged between the first substrate layer 100 and the second substrate layer 200. The front passivation layer 510 may be arranged between the second substrate layer 200 and the plurality of color filters 530. The guide pattern 520 may be formed on the front passivation layer 510. On the front passivation layer 510, on which the guide pattern 520 is formed, the color filter 530 may be arranged to overlap the photo sensing device PD in the vertical direction (Z direction). For example, the plurality of color filters 530 may, in a plan view, fill a space limited by the guide pattern 520 having a grid shape or a mesh shape.

Based on the inter-substrate insulating layer 300, the photo sensing device PD may be arranged on the side of the second substrate layer 200, and the floating diffusion region FD may be arranged on the side of the first substrate layer 100. In some embodiments, the photo sensing device PD may be in the second substrate layer 200, and the floating diffusion region FD may be in the first substrate layer 100. The first impurity region 122, the second impurity region 124, and the third impurity region 126 may be formed on some portions of the first substrate layer 100.

A plurality of channel holes CHa may penetrate the first substrate layer 100, the inter-substrate insulating layer 300, and the second substrate layer 200, and may extend into the plurality of photodiode regions 210. A photodiode impurity region 205 may be formed in a portion of the second substrate layer 200 and a portion of the photodiode region 210, which are exposed in the plurality of channel holes CHa. For example, the photodiode impurity region 205 may be doped with impurities of a first conductivity type. Accordingly, the photodiode impurity region 205 may be arranged between the channel hole CHa, the second substrate layer 200, and the photodiode region 210, so that in the channel hole CHa, the second substrate layer 200 and the photodiode region 210 are not exposed, but the photodiode impurity region 205 is exposed. In some embodiments, a portion of the second substrate layer 200 may be arranged between adjacent channel holes CHa of the plurality of channel holes CHa, and the plurality of channel holes CHa may be spaced apart from the photodiode region 210.

A channel layer 110a may penetrate the first substrate layer 100, the inter-substrate insulating layer 300, and the second substrate layer 200, and may extend into the photodiode region 210. In some embodiments, the channel layer 110a may contact the photodiode impurity region 205. For example, the channel layer 110a may be doped with impurities of a first conductivity type. The channel layer 110a may penetrate the first substrate layer 100, the inter-substrate insulating layer 300, and the second substrate layer 200, and may cover the inner walls of the channel hole CHa extending into the photodiode region 210. For example, the channel layer 110a may contact the first substrate layer 100 and the inter-substrate insulating layer 300, and the photodiode impurity region 205, which are arranged on the outer wall of the channel hole CHa. The channel layer 110a may limit the size of a gate hole GHa in the channel hole. The gate hole GHa may penetrate the channel layer 110a. The gate holes GHa may include the channel layer 110a arranged therebetween, penetrate the first substrate layer 100, the inter-substrate insulating layer 300, and the second substrate layer 200, and extend into the photodiode region 210.

The plurality of photodiode regions 210 may be arranged in the second substrate layer 200. Each of the plurality of photodiode regions 210 may be doped with impurities of a second conductivity type. Each of the plurality of photodiode regions 210 may constitute the photo sensing device PD. In some embodiments, the photodiode region 210 may be spaced apart from the channel layer 110a, the channel hole CHa, and the gate hole GHa. For example, a portion of the photodiode impurity region 205 may be arranged between each of the photodiode region 210, the channel layer 110a, the channel hole CHa, and the gate hole GHa.

The pixel isolation region DTI may surround the periphery of each of the plurality of photo sensing devices PD in the second substrate layer 200. The pixel isolation region DTI may have a grid shape or mesh shape in a plan view.

A plurality of gate structures including a first gate structure GS1a, the second gate structure GS2, and the third gate structure GS3 may be arranged on the first substrate layer 100. Each of the plurality of gate structures may include a gate insulating layer and a gate electrode layer. For example, the first gate structure GS1a may have a stacked structure of a first gate insulating layer 132a and a first gate electrode layer 142a, the second gate structure GS2 may have a stacked structure of a second gate insulating layer 134 and the second gate electrode layer 144, and the third gate structure GS3 may have a stacked structure of the third gate insulating layer 136 and the third gate electrode layer 146.

The first gate electrode layer 142a may include a transfer gate constituting the transfer transistor TT. In some embodiments, the first gate electrode layer 142a may include a vertical gate. The first gate structure GS1a may extend onto the lower surface of the channel layer 110a while filling the gate hole GHa. The first gate insulating layer 132a may cover an inner wall and a bottom surface of the gate hole GHa. In some embodiments, the first gate insulating layer 132a may extend from the inside of the gate hole GHa onto the lower surface of the channel layer 110a. The first gate electrode layer 142a may cover the first gate insulating layer 132a, and fill the gate hole GHa. The first gate insulating layer 132a may be arranged between the channel layer 110a and the photodiode impurity region 205, and the photodiode impurity region 205 may be arranged between the first gate insulating layer 132a and the photodiode region 210, and between the first gate insulating layer 132a and the second substrate layer 200.

An inter-gate insulating layer 150 surrounding the first gate structure GS1a, the second gate structure GS2, and the third gate structure GS3 may be arranged under the lower surface of the first substrate layer 100. The inter-gate insulating layer 150 may, under the lower surface of the first substrate layer 100, cover the side surfaces of each of the first gate structure GS1a, the second gate structure GS2, and the third gate structure GS3.

The contact structure 160 may be arranged under the lower surface of the inter-gate insulating layer 150. The contact structure 160 may include a plurality of contact pad layers 162, the contact plug 164 connected to the plurality of contact pad layers 162, and an interlayer insulating layer 166 surrounding a plurality of contact plugs 164 and covering the lower surface of the inter-gate insulating layer 150. Each of the plurality of contact plugs 164 may be connected to one of the first impurity region 122, the second impurity region 124, the third impurity region 126, the first gate electrode layer 142a, the second gate electrode layer 144, and the third gate electrode layer 146. The plurality of contact pad layers 162 may be electrically connected to one of the first impurity region 122, the second impurity region 124, the third impurity region 126, the first gate electrode layer 142a, the second gate electrode layer 144, and the third gate electrode layer 146, via the plurality of contact plugs 164.

The wiring structure 170 may be arranged under the lower surface of the contact structure 160. The logic substrate WFL may be arranged under the lower surface of the wiring structure 170.

FIGS. 13A to 13E are cross-sectional views illustrating a manufacturing method of an image sensor, according to embodiments. FIGS. 13A to 13E are cross-sectional views illustrating manufacturing operations performed after the manufacturing operation described with reference to FIG. 4.

Figure 13A:
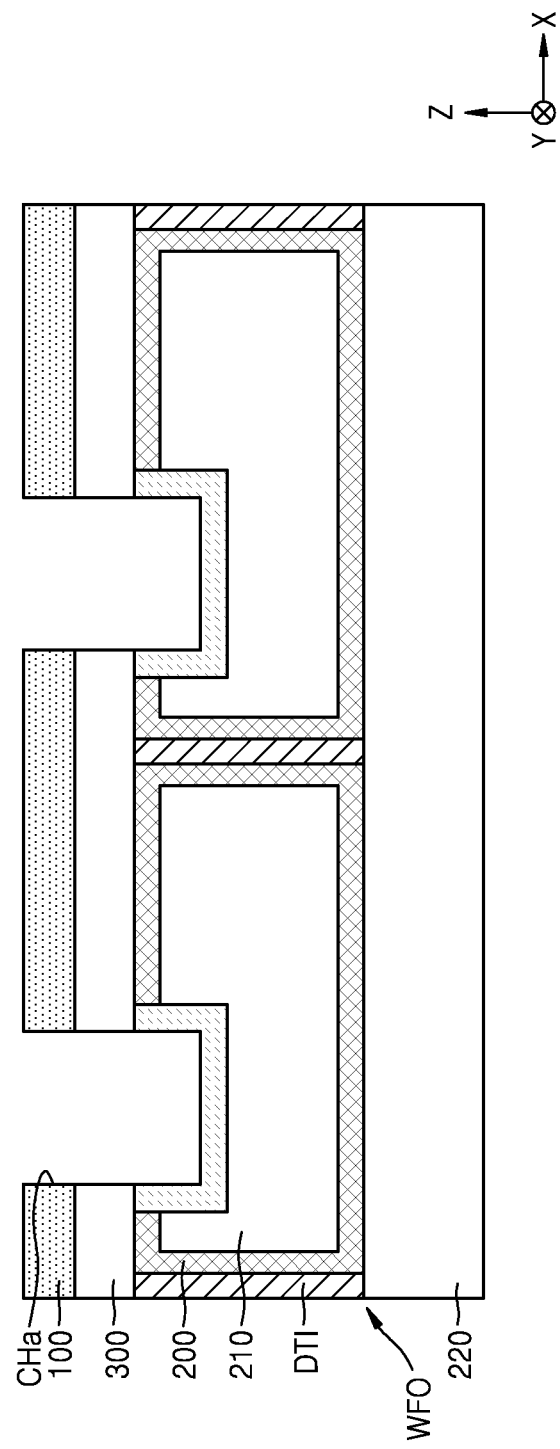
FIGS. 13A to 13E are cross-sectional views illustrating a manufacturing method of an image sensor, according to embodiments.

Referring to FIG. 13A, the resultant product of FIG. 4 may be rotated upside down so that the protective insulating layer 220 is oriented downward and the photo device substrate WFO is oriented upward.

By removing a portion of the first substrate layer 100, a portion of the inter-substrate insulating layer 300, a portion of the second substrate layer 200, and a portion of the photodiode region 210, the plurality of channel holes CHa, which penetrate the first substrate layer 100, the inter-substrate insulating layer 300, and the second substrate layer 200 and extend into the photodiode region 210, may be formed. In some embodiments, the photodiode region 210 may be exposed on a bottom surface of the channel hole CHa. In some embodiments, a horizontal cross-section of the channel hole CHa may have a circular shape. However, embodiments of the inventive concept are not limited thereto. For example, the horizontal cross-section of the channel hole CHa may have a polygonal shape, such as a circular shape, an elliptical shape, or a rectangular shape.

Figure 13B:
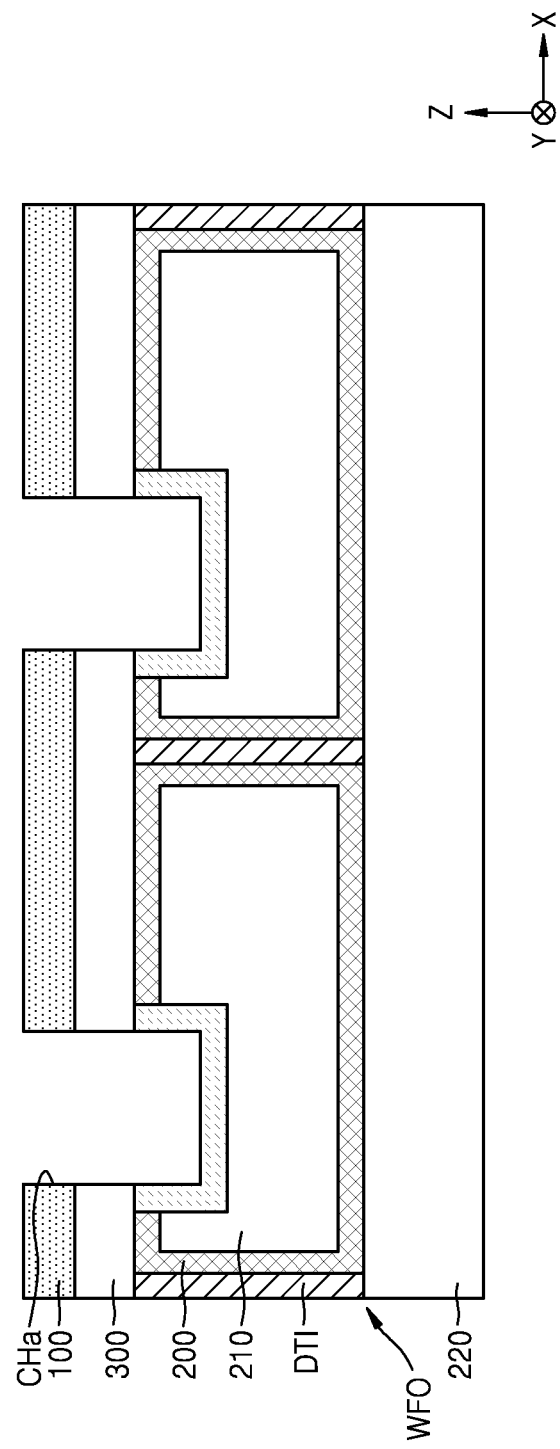

Referring to FIGS. 13A and 13B together, by doping a portion of the second substrate layer 200 exposed in the channel hole CHa and a portion of the photodiode region 210 with impurities of a first conductive type, the photodiode impurity region 205 may be formed. The photodiode impurity region 205 may be formed to be arranged on a lower portion of a sidewall of the channel hole CHa, and a bottom surface of the channel hole CHa.

Figure 13C:
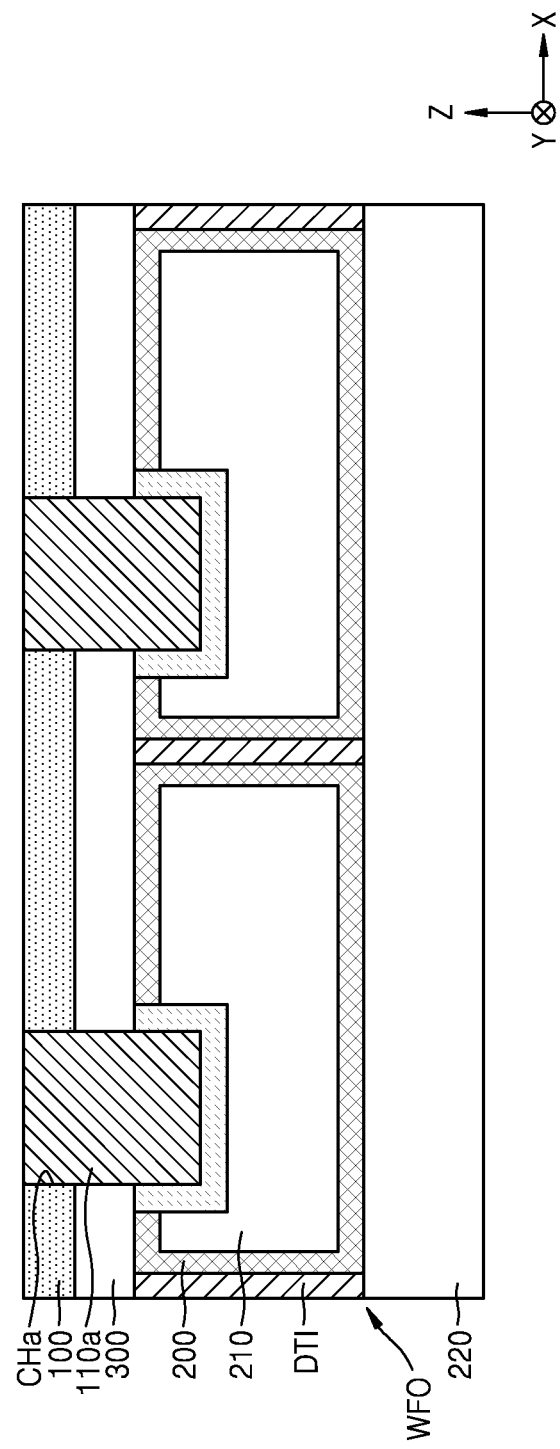

Referring to FIG. 13C, the channel layer 110a filling the channel hole CHa may be formed. For example, the channel layer 110a may be doped with impurities of a first conductivity type. The channel layer 110a may be formed by performing an SEG process by using the photodiode impurity region 205 as a seed layer. The channel layer 110a may be formed such that the upper surface of the first substrate layer 100 and the upper surface of the channel layer 110a are substantially coplanar.

Figure 13D:
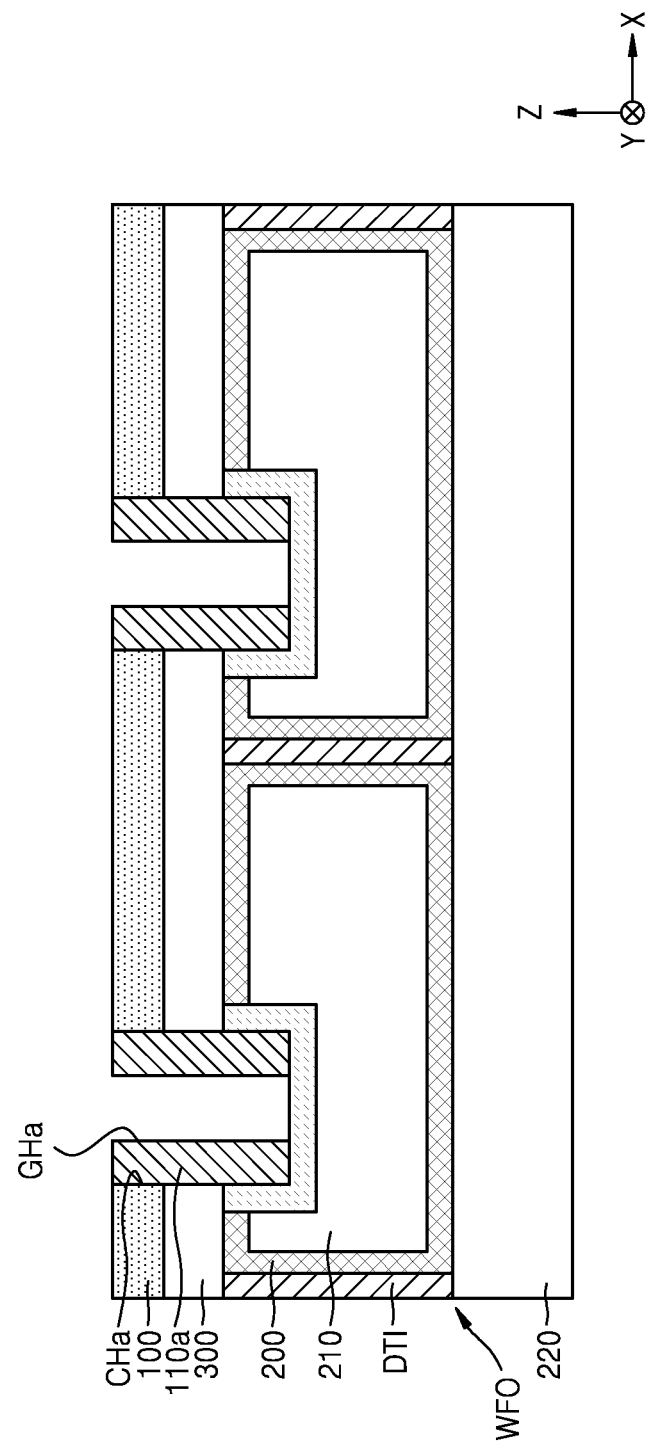

Referring to FIG. 13D, by removing a portion of the channel layer 110a, a plurality of gate holes GHa penetrating the channel layer 110a may be formed. The gate holes GHa may be formed to include the channel layer 110a therebetween, penetrate the first substrate layer 100, the inter-substrate insulating layer 300, and the second substrate layer 200, and extend into the photodiode region 210. The channel layer 110a may limit the size of a gate hole GHa in the channel hole CHa. As a result of forming the gate hole GHa, the channel layer 110a may limit the size of the gate hole GHa in the channel hole CHa, while covering the inner wall of the channel hole CHa, which penetrates the first substrate layer 100, the inter-substrate insulating layer 300, and the second substrate layer 200, and extends into the photodiode region 210.

Figure 13E:
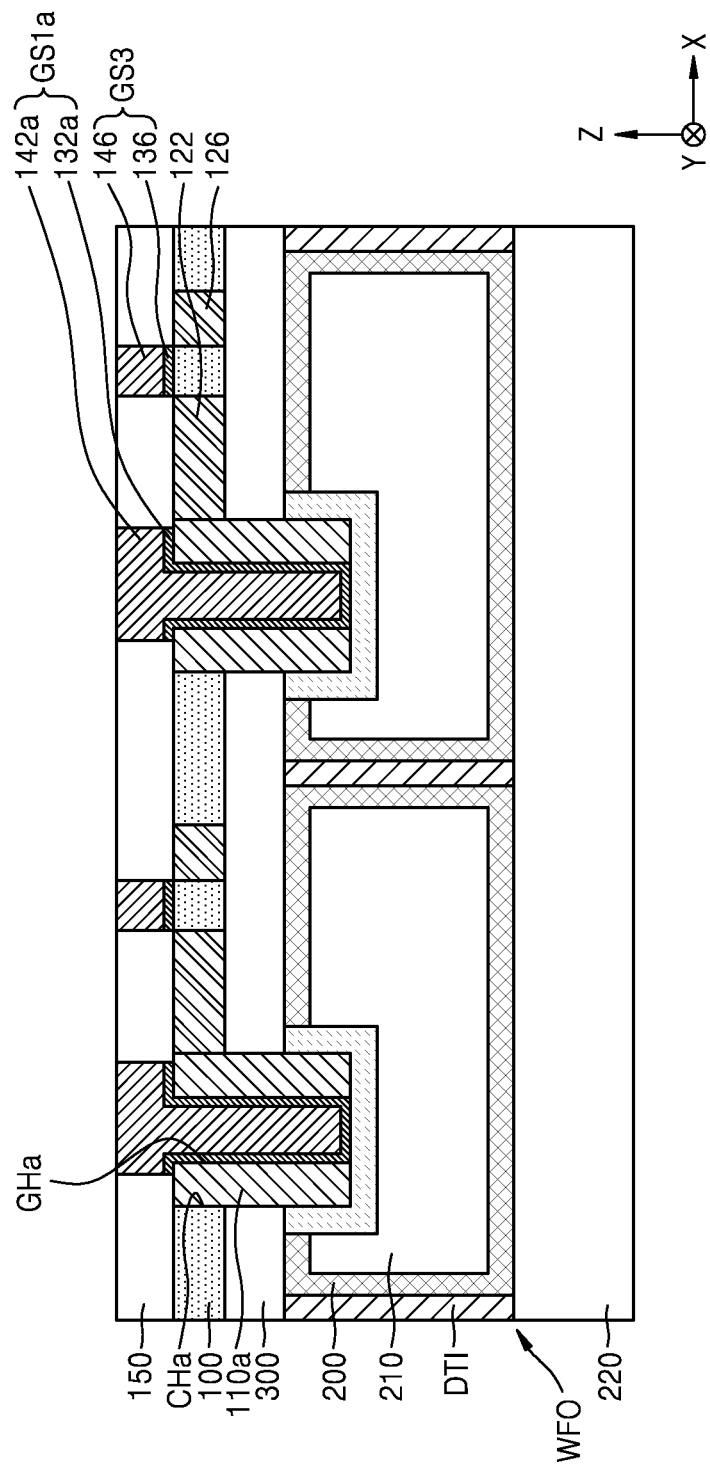

Referring to FIG. 13E, the first impurity region 122, the second impurity region 124, and the third impurity region 126 may be formed in some portions of the first substrate layer 100, and a plurality of gate structures including the first gate structure GS1a, the second gate structure GS2, and the third gate structure GS3 may be formed on the first substrate layer 100. Each of the plurality of gate structures may be formed to include a gate insulating layer and a gate electrode layer. For example, the first gate structure GS1a may be formed to have a stacked structure of the first gate insulating layer 132a and the first gate electrode layer 142a, the second gate structure GS2 may be formed to have a stacked structure of the second gate insulating layer 134 and the second gate electrode layer 144, and the third gate structure GS3 may be formed to have a stacked structure of the third gate insulating layer 136 and the third gate electrode layer 146.

In some embodiments, the first gate electrode layer 142a may be formed as a vertical gate. The first gate structure GS1a may be formed to extend onto the lower surface of the channel layer 110a while filling the gate hole GHa. The first gate insulating layer 132a may be formed to cover the inner wall and the bottom surface of the gate hole GHa. In some embodiments, the first gate insulating layer 132a may be formed to extend from the inside of the gate hole GHa onto the lower surface of the channel layer 110a. The first gate electrode layer 142a may be formed to cover the first gate insulating layer 132 and fill the gate hole GHa. The first gate insulating layer 132a may be formed to be arranged between the channel layer 110a, the photodiode impurity region 205, and the first gate electrode layer 142a.

On the upper surface of the first substrate layer 100, the inter-gate insulating layer 150 surrounding the first gate structure GS1a, the second gate structure GS2, and the third gate structure GS3 may be formed. The inter-gate insulating layer 150 may, on the upper surface of the first substrate layer 100, be formed to cover the side surfaces of each of the first gate structure GS1a, the second gate structure GS2, and the third gate structure GS3.

Thereafter, the contact structure 160 and the wiring structure 170 may be formed with reference to FIGS. 10A to 11, and as illustrated in FIG. 12, and the image sensor 1a may be formed by rotating the resultant product of FIG. 11 upside down, and arranging the protective insulating layer 220 to be oriented upward, and the photo device substrate WFO to be oriented downward, removing the protective insulating layer 220, and forming the front passivation layer 510, the guide pattern 520, a plurality of color filters 530, and a plurality of microlenses 500 on the second substrate layer 200.

Figure 14:
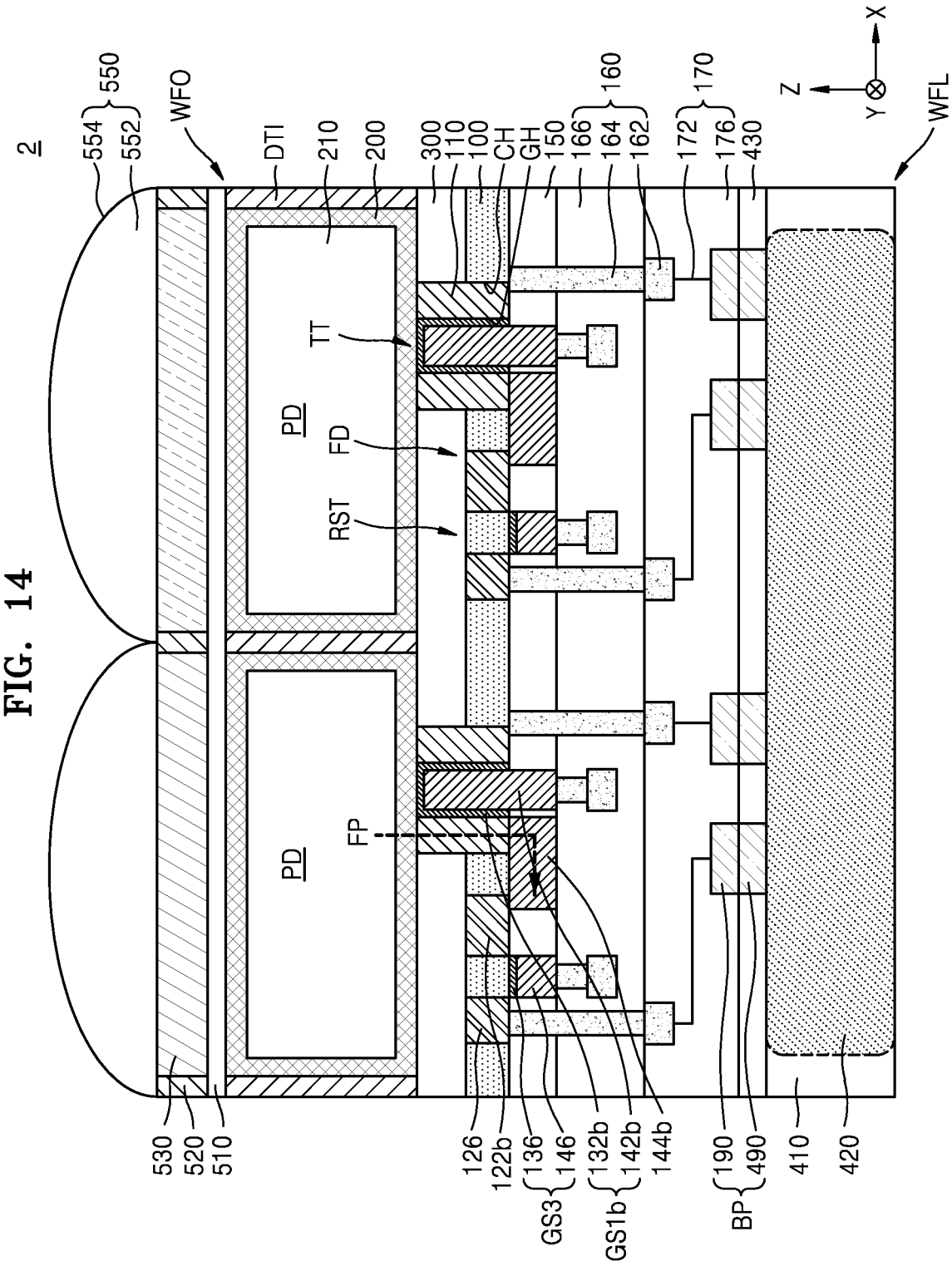
FIG. 14 is a cross-sectional view of an image sensor according to an embodiment.

FIG. 14 is a cross-sectional view of an image sensor 2 according to an embodiment. For convenience of explanation, a further description of components and technical aspects previously described with reference to FIG. 1 may be omitted.

Referring to FIG. 14 together with FIGS. 17A to 17D, the image sensor 2 may include the photo device substrate WFO including the plurality of photo sensing devices PD, the plurality of microlenses 550 arranged on the photo device substrate WFO, and the plurality of color filters 530 arranged between the photo device substrate WFO and the plurality of microlenses 550. The photo device substrate WFO may include the first substrate layer 100, the second substrate layer 200, and the inter-substrate insulating layer 300 arranged between the first substrate layer 100 and the second substrate layer 200. The front passivation layer 510 may be arranged between the second substrate layer 200 and the plurality of color filters 530. The guide pattern 520 may be formed on the front passivation layer 510. On the front passivation layer 510, on which the guide pattern 520 is formed, the color filter 530 may be arranged to overlap the photo sensing device PD in the vertical direction (Z direction).

Based on the inter-substrate insulating layer 300, the photo sensing device PD may be arranged on the side of the second substrate layer 200, and the floating diffusion region FD may be arranged on the side of the first substrate layer 100. In some embodiments, the photo sensing device PD may be arranged in the second substrate layer 200, and the floating diffusion region FD may be arranged on the first substrate layer 100. A first impurity region 122b, the second impurity region 124, and the third impurity region 126 may be formed on some portions of the first substrate layer 100. The first impurity region 122b may include the floating diffusion region FD and a source region of the reset transistor RST, the second impurity region 124 may include a source region and a drain region of the source follower transistor SF, and the third impurity region 126 may include a drain region of the reset transistor RST.

A plurality of gate structures including a first gate structure GS1b, a second gate structure GS2b, and the third gate structure GS3 may be arranged on the first substrate layer 100. Each of the plurality of gate structures may include a gate insulating layer and a gate electrode layer. For example, the first gate structure GS1b may have a stacked structure of a first gate insulating layer 132b and a first gate electrode layer 142b, the second gate structure GS2b may have a stacked structure of a second gate insulating layer 134b and a second gate electrode layer 144b, and the third gate structure GS3 may have a stacked structure of the third gate insulating layer 136 and the third gate electrode layer 146.

The first gate electrode layer 142b may include a transfer gate constituting the transfer transistor TT. In some embodiments, the first gate electrode layer 142b may include a vertical gate. The first gate electrode layer 142b may fill the gate hole GH, and protrude downward from the lower surface of the channel layer 110. The first gate insulating layer 132b may cover an inner wall and a bottom surface of the gate hole GH. The first gate electrode layer 142b may cover the first gate insulating layer 132b, and fill the gate hole GH. The first gate insulating layer 132b may be arranged between each of the channel layer 110, the second substrate layer 200, and the first gate electrode layer 142b.

The second gate electrode layer 144b may extend from the channel layer 110 onto the first impurity region 122b and onto the first substrate layer 100 between the pair of second impurity regions 124. The second gate electrode layer 144b may contact the channel layer 110 and the first impurity region 122b. A second gate insulating layer 134b may be arranged between a portion of the first substrate layer 100 between the pair of second impurity regions 124 and the second gate electrode layer 144b. The second gate electrode layer 144b may be electrically connected to the channel layer 110 and the first impurity region 122b, and may be spaced apart from a portion of the first substrate layer 100 between the pair of second impurity regions 124 with the second gate insulating layer 134b arranged therebetween.

A portion of the second gate electrode layer 144b, that is, a portion of the second gate electrode layer 144b, which extends from the channel layer 110 to the first impurity region 122b and electrically connects the channel layer 110 to the first impurity region 122b, may include the floating diffusion region FD. The other portions of the second gate electrode layer 144b, that is, portions which include the second gate insulating layer 134b therebetween and are on the first substrate layer 100 between the pair of second impurity regions 124, may include a gate region of the source follower transistor SF.

In the image sensor 2 according to embodiments of the inventive concept, the photo sensing device PD and the floating diffusion region FD may be spaced apart from each other with the inter-substrate insulating layer 300 arranged therebetween. Accordingly, the inter-substrate insulating layer 300 may be arranged between the photo sensing device PD and the floating diffusion region FD, for example, between the second substrate layer 200 and the floating diffusion region FD. Thus, the second substrate layer 200 and the floating diffusion region FD are not pn-bonded according to embodiments.

According to embodiments, the contact pad layer 162 and the contact plug 164 are not arranged on a portion of the second gate electrode layer 144b, which is used as the floating diffusion region FD. Accordingly, a parasitic capacitance between the photo sensing device PD and the floating diffusion region FD, and a parasitic capacitance between the floating diffusion region FD and the contact pad layer 162, may be reduced, and the conversion gain may be increased. Thus, the photo sensing capability of the image sensor 2 may be increased.

FIGS. 15A to 15C, 16A to 16D and 17A to 17D are cross-sectional views illustrating a manufacturing method of an image sensor, according to embodiments. FIGS. 15A to 17D are cross-sectional views illustrating manufacturing operations after the manufacturing operations described with reference to FIGS. 7A and 7B have been performed.

Figure 15A:
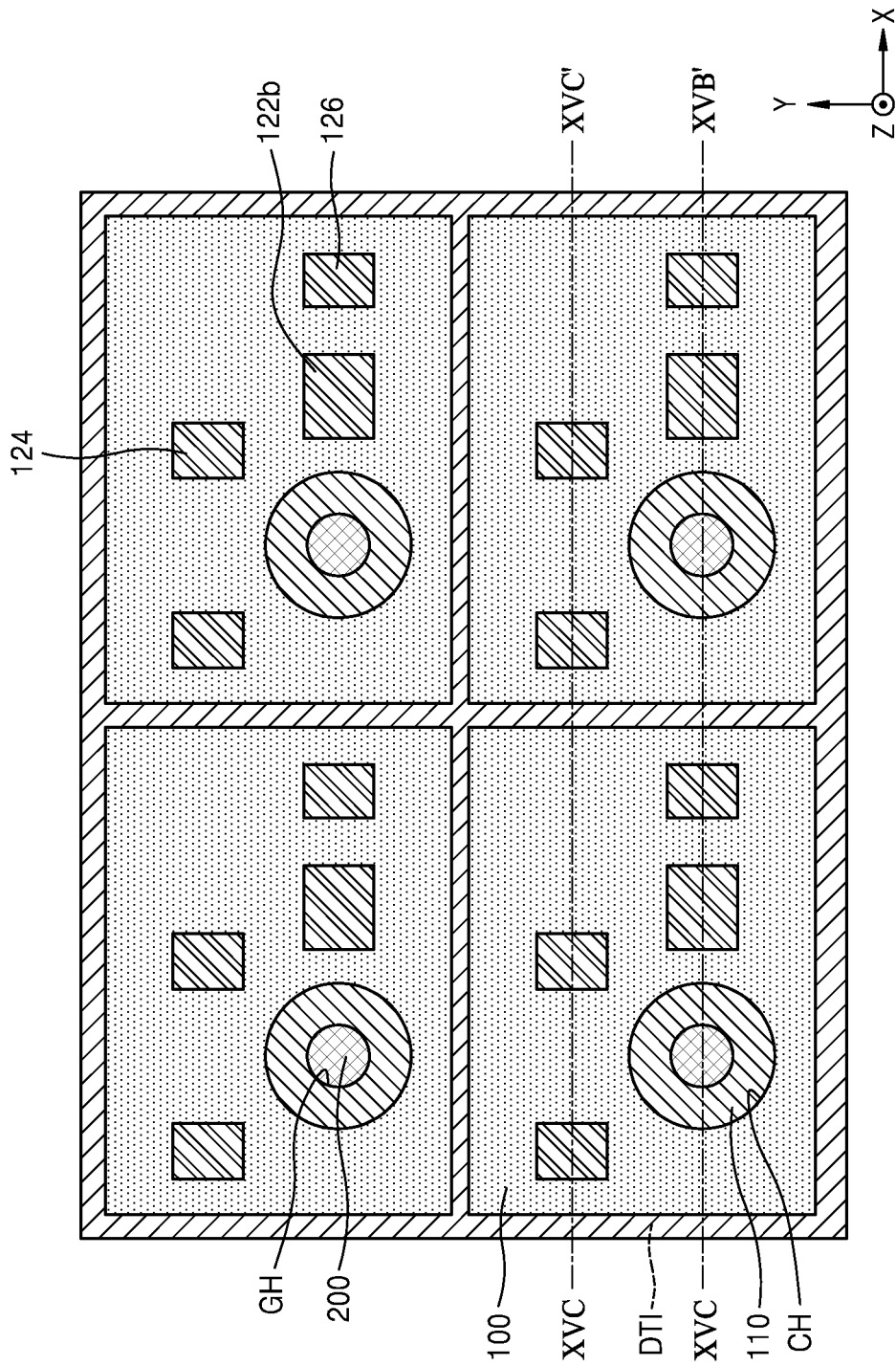
FIGS. 15A to 15C, 16A to 16D and 17A to 17D are cross-sectional views illustrating a manufacturing method of an image sensor, according to embodiments.
Figure 15B:
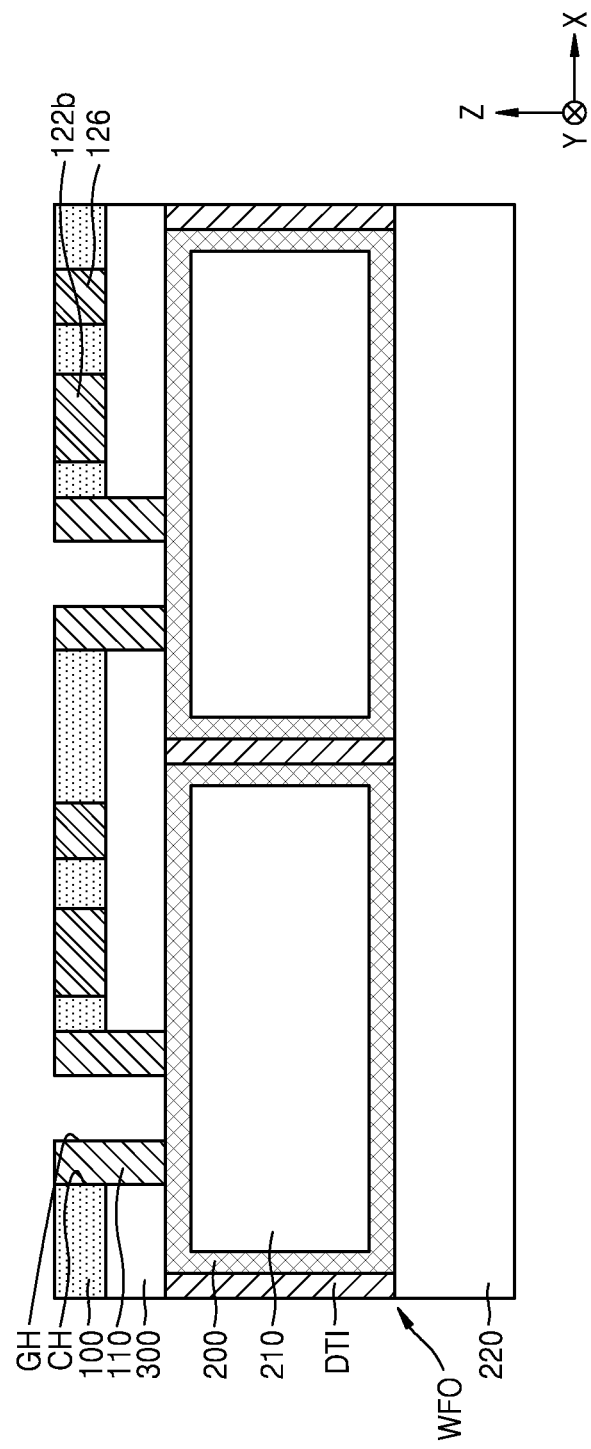
Figure 15C:
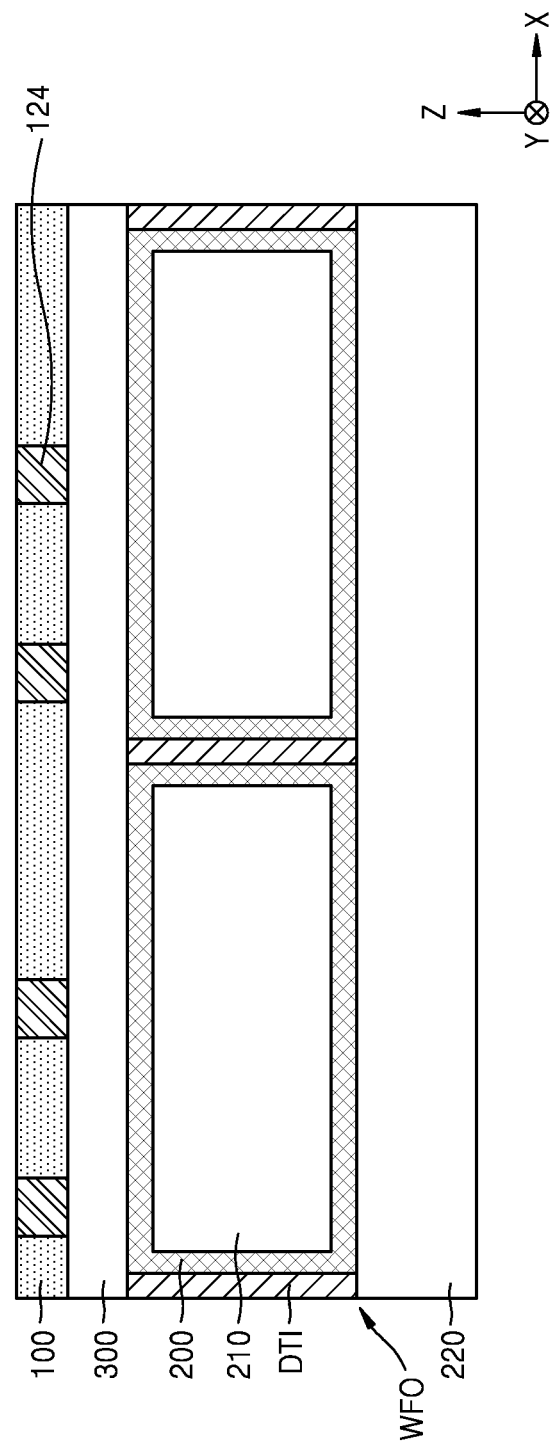
Figure 16A:
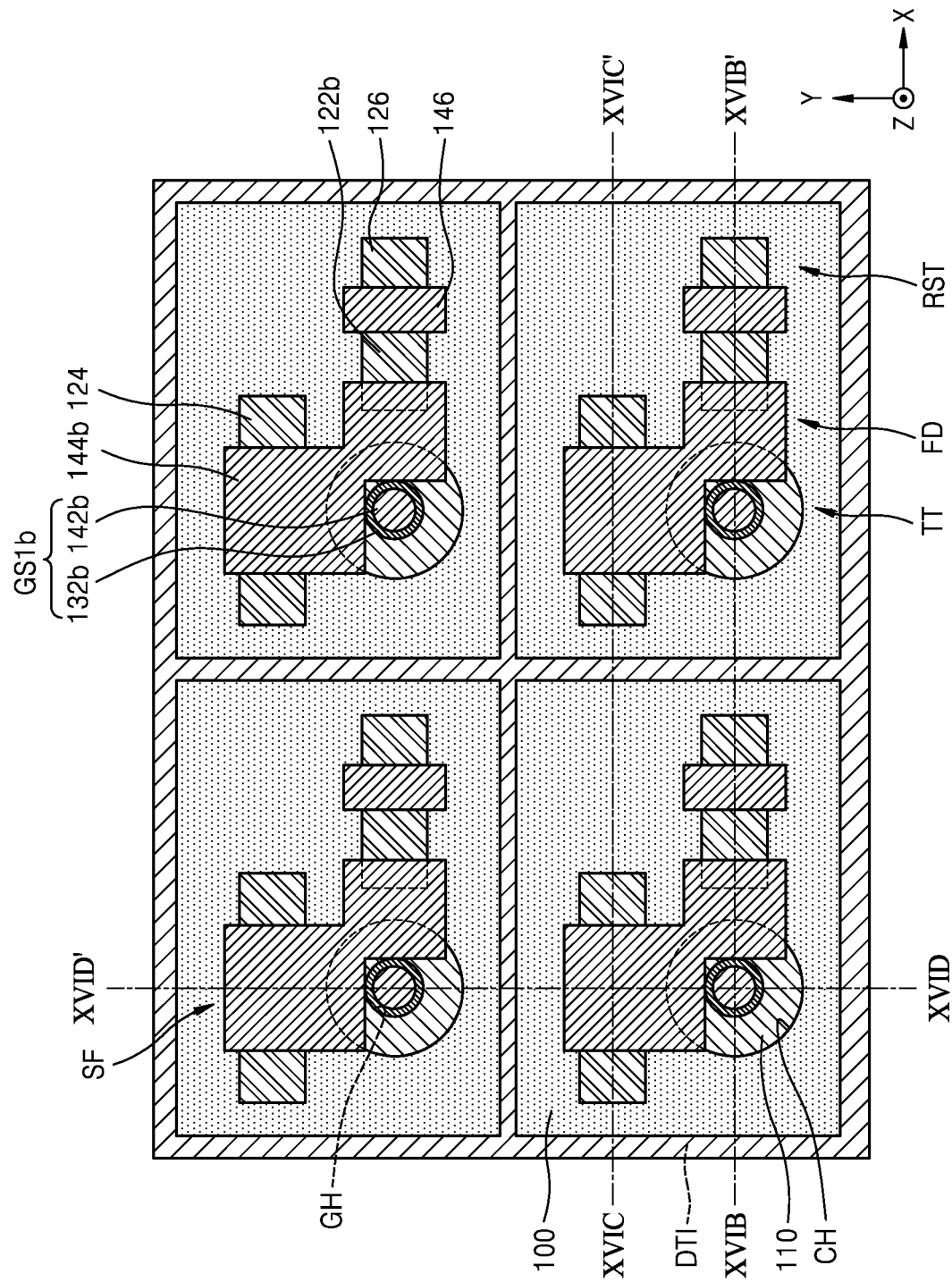
Figure 16B:
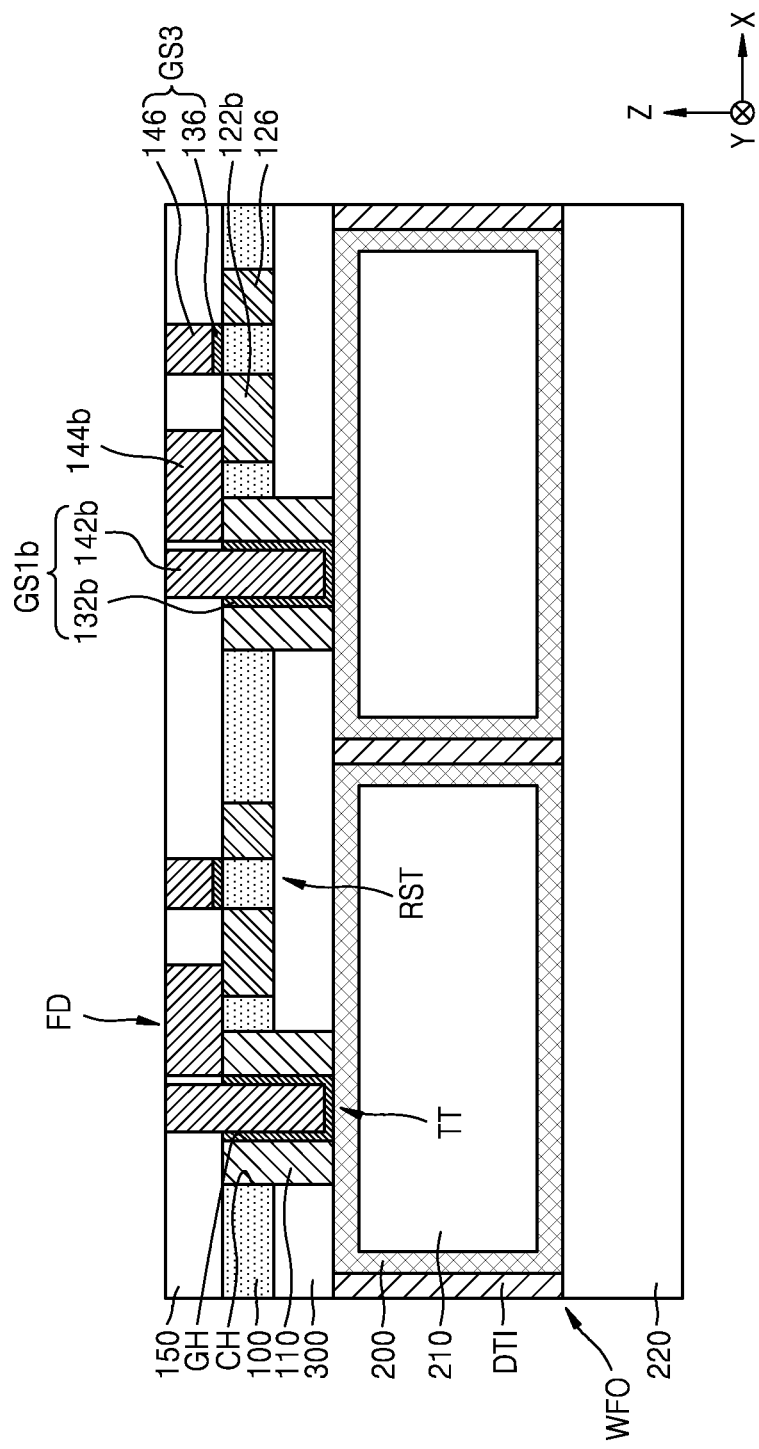
Figure 16C:
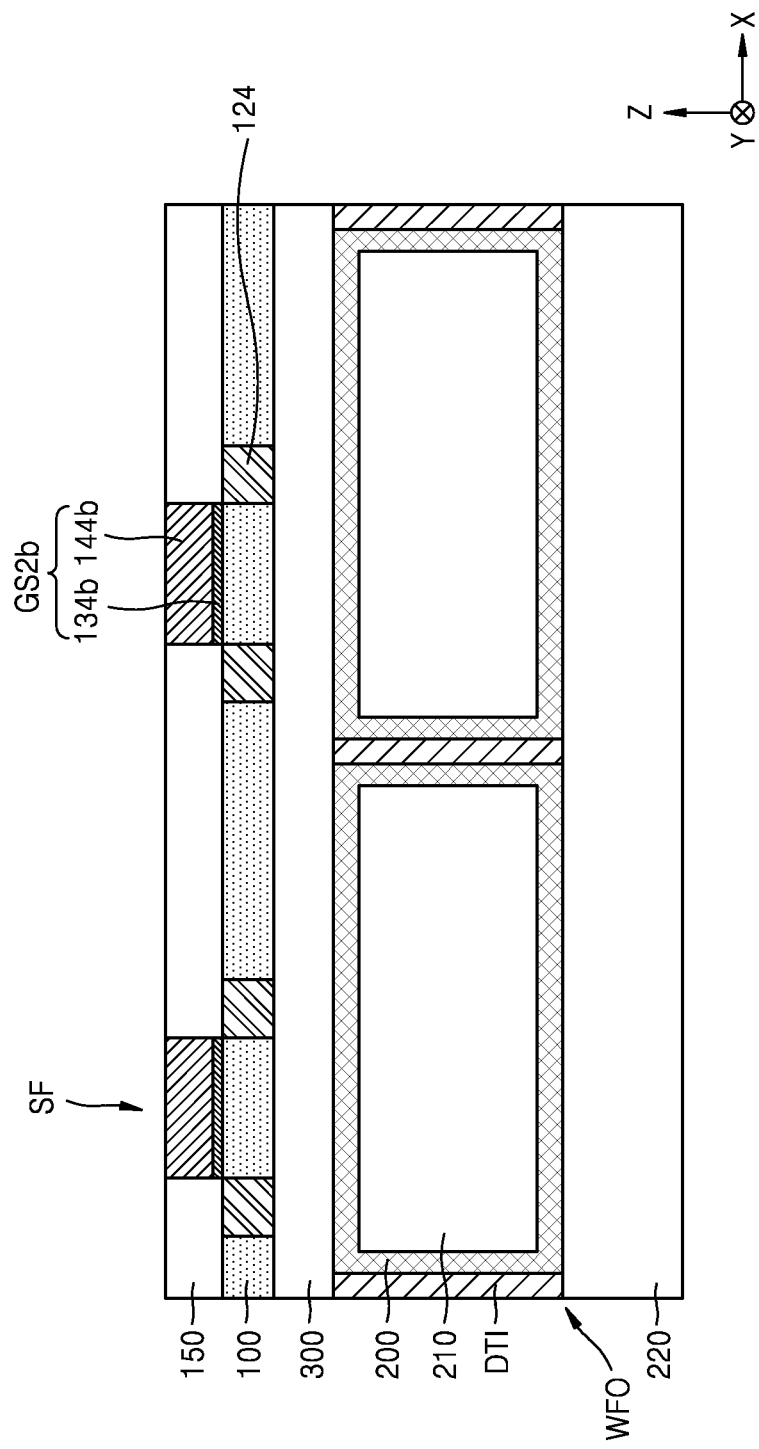
Figure 16D:
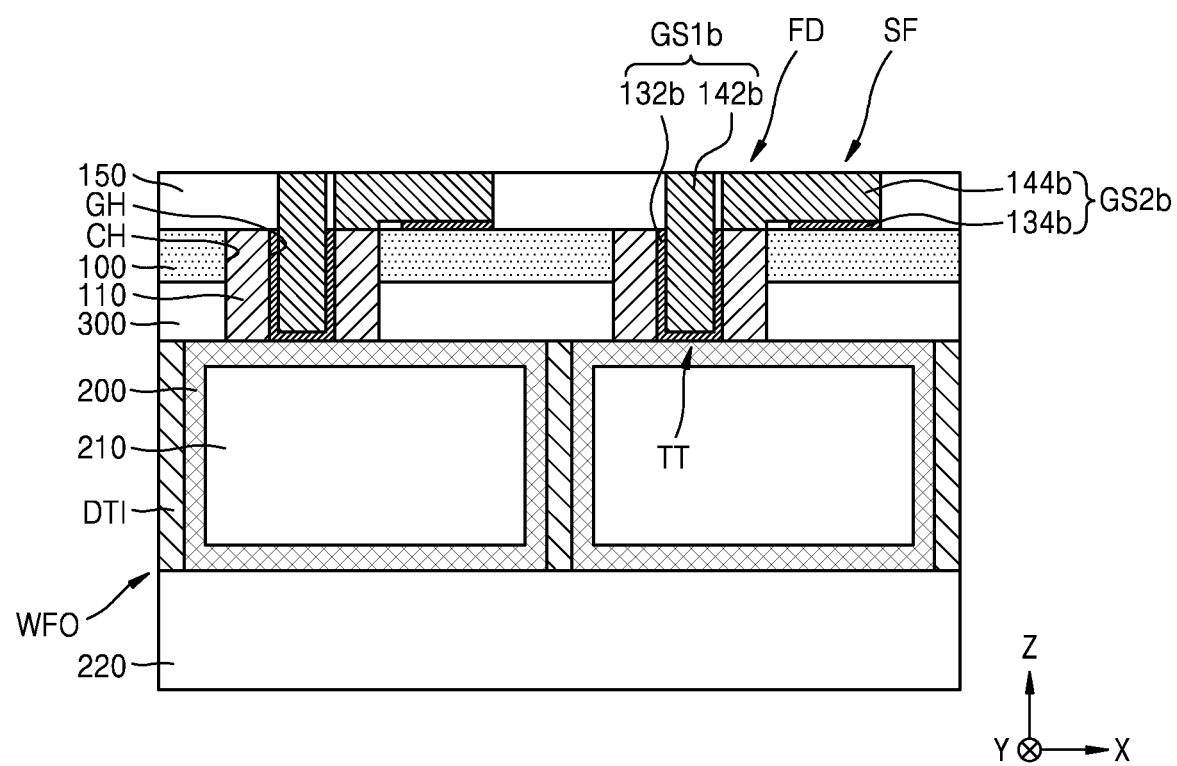
Figure 17A:
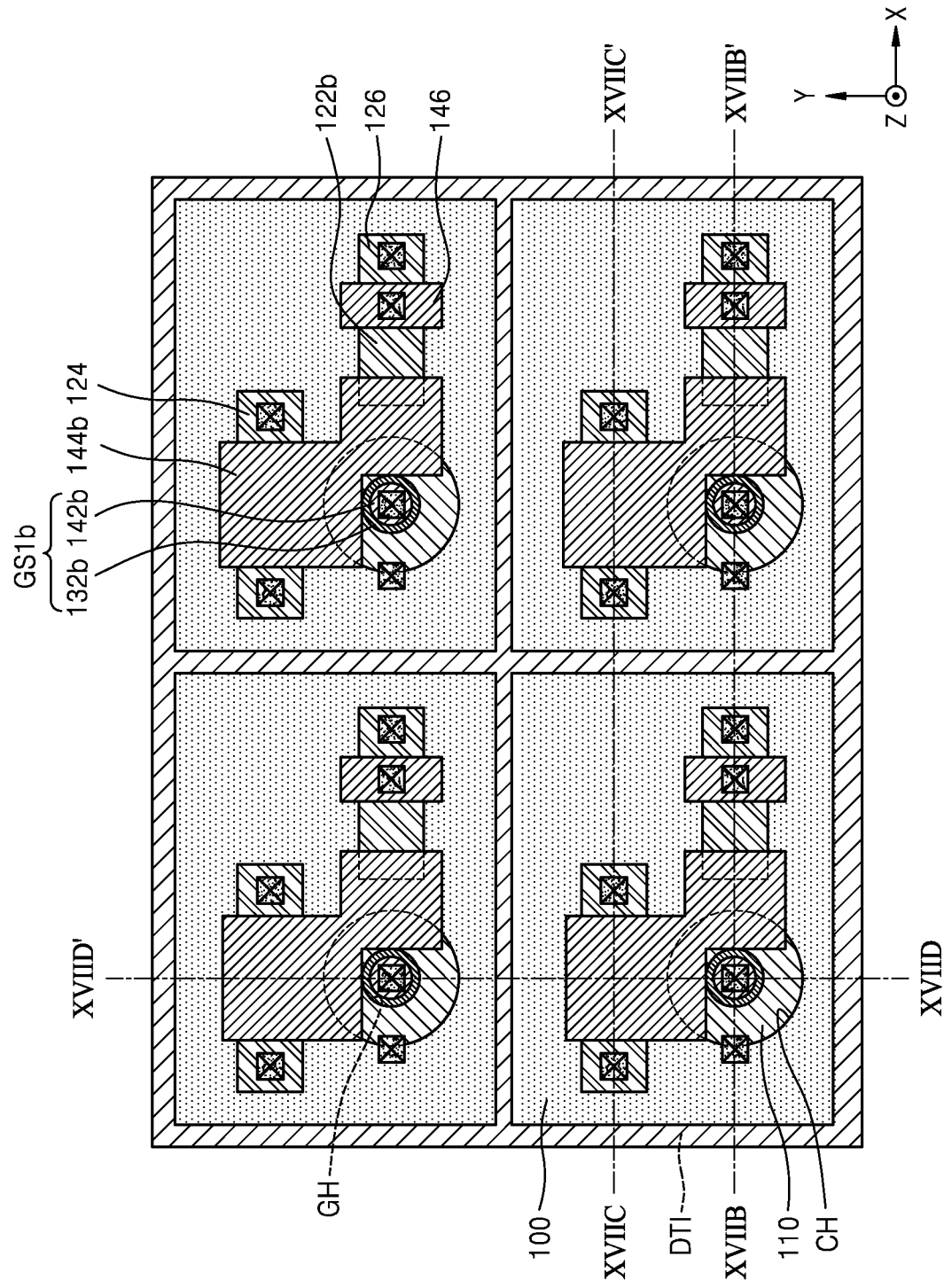
Figure 17B:
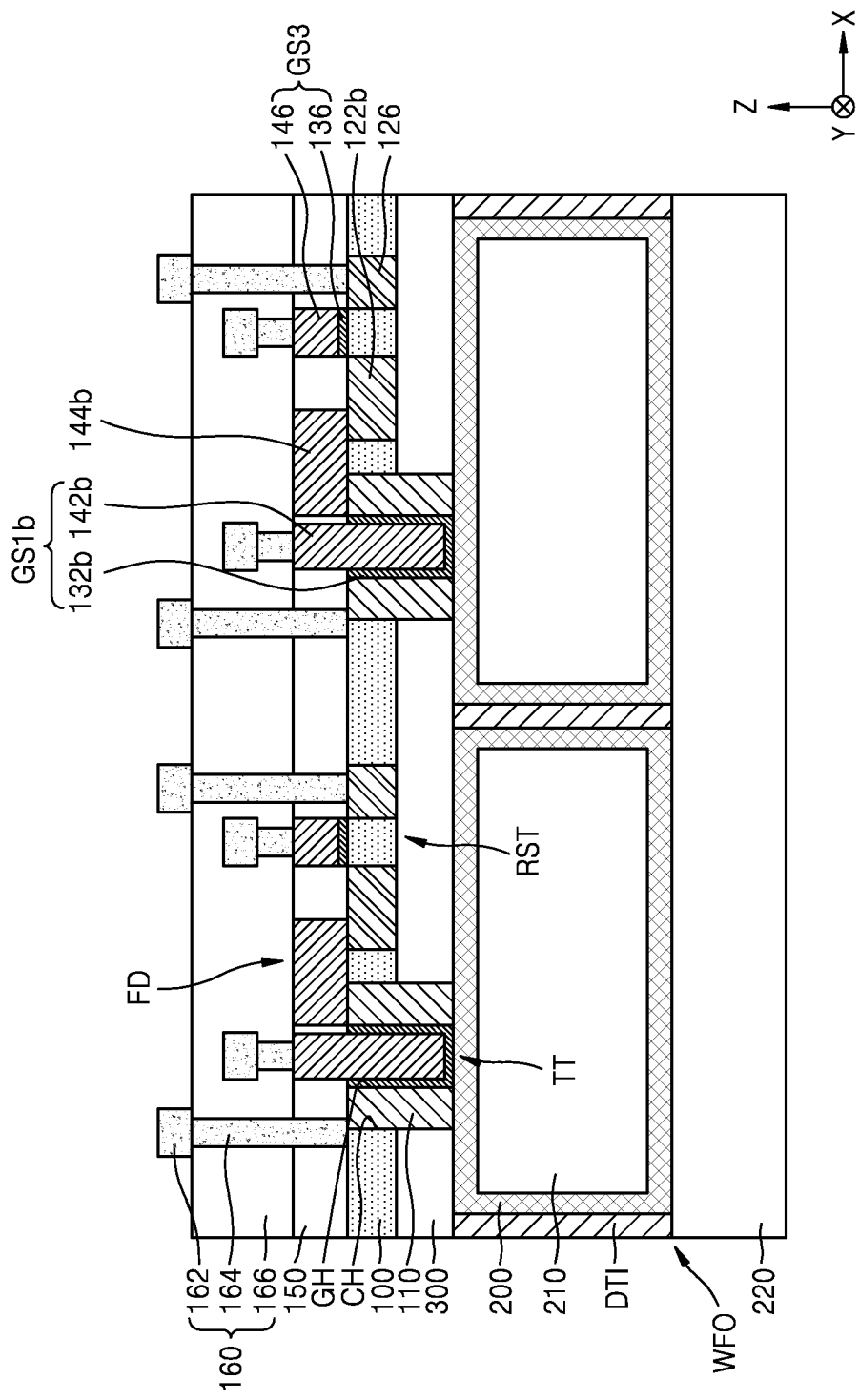
Figure 17C:
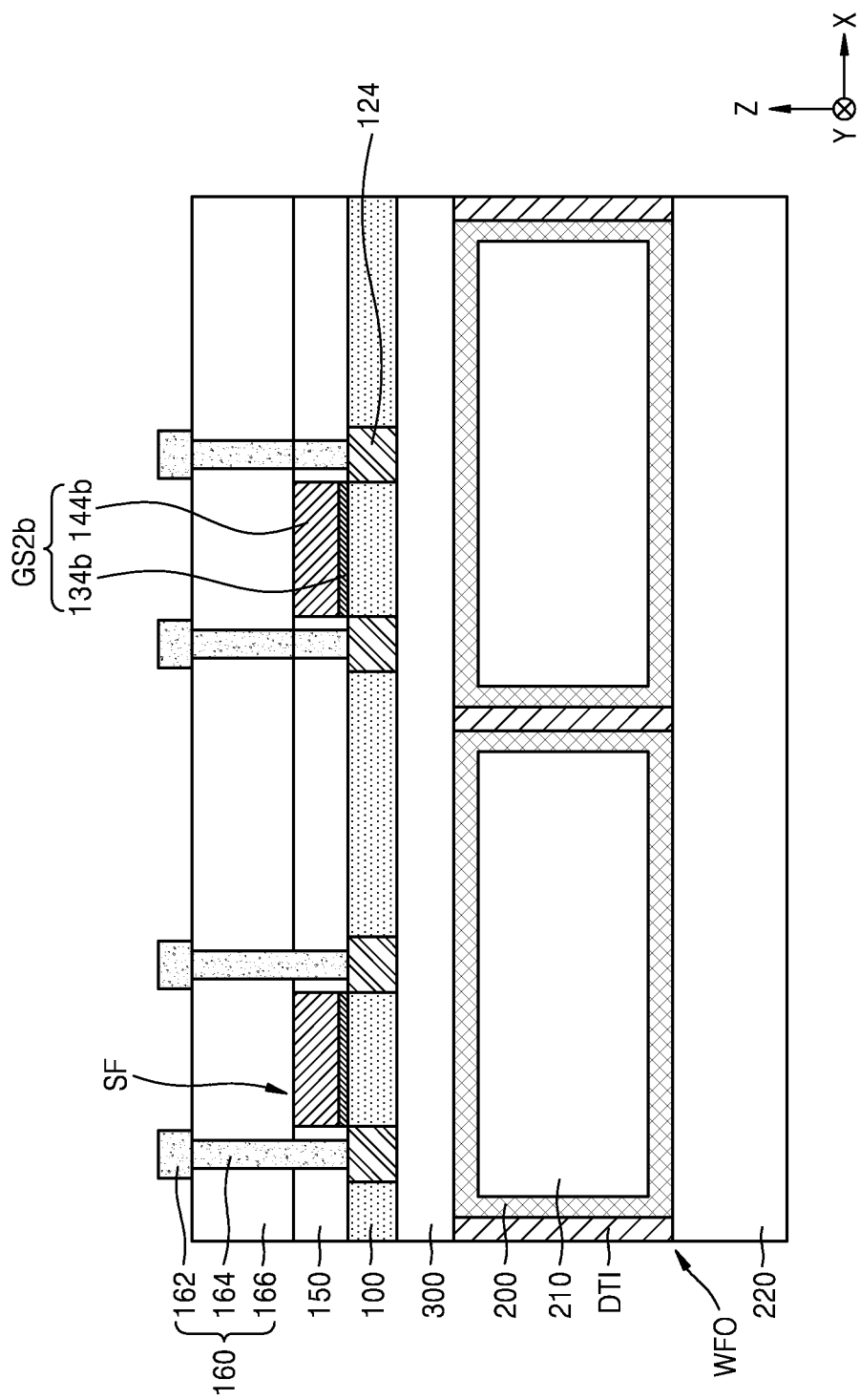
Figure 17D:
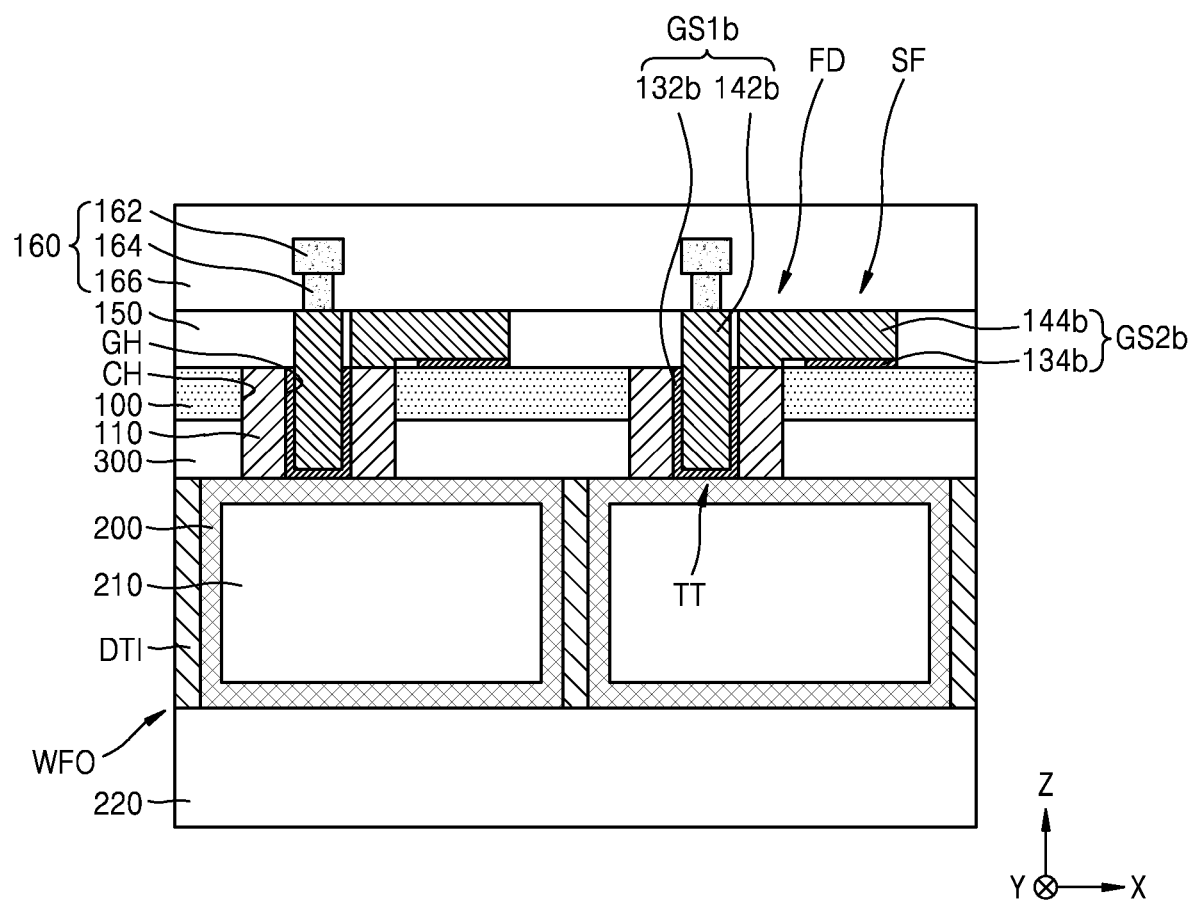

Referring to FIGS. 15A to 15C together, the first impurity region 122b, the second impurity region 124, and the third impurity region 126 may be formed on some portions of the first substrate layer 100. For example, by doping some portions of the first substrate layer 100 with impurities of a second conductive type, the first impurity region 122b, the second impurity region 124, and the third impurity region 126 may be formed.

The first impurity region 122b may be adjacent to the channel layer 110 and spaced apart from the channel layer 110. The third impurity region 126 may be formed to be adjacent to the first impurity region 122b, but spaced apart from the first impurity region 122. The second impurity region 124 may be formed spaced apart from each of the first impurity region 122b and the third impurity region 126. For example, a pair of second impurity regions 124 adjacent to each other but spaced apart from each other corresponding to each of a plurality of photodiode regions 210 may be formed.

Referring to FIGS. 16A to 16D together, a plurality of gate structures including the first gate structure GS1b, the second gate structure GS2b, and the third gate structure GS3 may be formed on the first substrate layer 100. Each of the plurality of gate structures may formed to include a gate insulating layer and a gate electrode layer. For example, the first gate structure GS1b may be formed to have a stacked structure of the first gate insulating layer 132b and the first gate electrode layer 142b, the second gate structure GS2b may be formed to have a stacked structure of the second gate insulating layer 134b and the second gate electrode layer 144b, and the third gate structure GS3 may be formed to have a stacked structure of the third gate insulating layer 136 and the third gate electrode layer 146.

In some embodiments, the first gate electrode layer 142b may be formed as a vertical gate. The first gate electrode layer 142b may be formed to protrude from the upper surface of the channel layer 110 while filling the gate hole GH. The first gate insulating layer 132b may be formed to cover the inner wall and the bottom surface of the gate hole GH. The first gate electrode layer 142b may be formed to cover the first gate insulating layer 132b and fill the gate hole GH.

The second gate electrode layer 144b may be formed to extend from the channel layer 110 onto the first impurity region 122b, and onto the first substrate layer 100 between the pair of second impurity regions 124. The second gate electrode layer 144b may be formed to contact the channel layer 110 and the first impurity region 122b. The second gate insulating layer 134b may be formed to be arranged between a portion of the first substrate layer 100 between the pair of second impurity regions 124, and the second gate electrode layer 144b.

The inter-gate insulating layer 150 surrounding the first gate structure GS1b, the second gate structure GS2b, and the third gate structure GS3 may be formed on the upper surface of the first substrate layer 100. The inter-gate insulating layer 150 may, on the upper surface of the first substrate layer 100, be formed to cover the side surfaces of each of the first gate structure GS1b, the second gate structure GS2b, and the third gate structure GS3.

Referring to FIGS. 17A to 17D together, the contact structure 160 may be formed on the upper surface of the inter-gate insulating layer 150. The contact structure 160 may be formed to include the plurality of contact pad layers 162, the contact plug 164 connected to the plurality of contact pad layers 162, and the interlayer insulating layer 166 surrounding the plurality of contact plugs 164 and covering the upper surface of the inter-gate insulating layer 150.

Each of the plurality of contact plugs 164 may be connected to one of the first impurity region 122, the second impurity region 124, the third impurity region 126, the first gate electrode layer 142b, the second gate electrode layer 144b, and the third gate electrode layer 146. The plurality of contact pad layers 162 may be electrically connected to one of the first impurity region 122, the second impurity region 124, the third impurity region 126, the first gate electrode layer 142b, the second gate electrode layer 144b, and the third gate electrode layer 146, via the plurality of contact plugs 164.

The contact plug 164 connected to the second gate electrode layer 144b may be formed not to be connected to a portion, which extends from the channel layer 110 to the first impurity region 122b among the second gate electrode layer 144b, and electrically connects the channel layer 110 to the first impurity region 122b. The plurality of contact pad layers 162 and the plurality of contact plugs 164 may be formed not to be arranged on a portion, which extends from the channel layer 110 to the first impurity region 122b among the second gate electrode layer 144b, and electrically connects the channel layer 110 to the first impurity region 122b.

Thereafter, the wiring structure 170 may be formed with reference to FIG. 11, and as illustrated in FIG. 14, after the resultant product of FIG. 11 is rotated upside down, the protective insulating layer 220 is oriented upward, and the photo device substrate WFO is oriented downward. Then, the protective insulating layer 220 is removed, and by forming the front passivation layer 510, the guide pattern 520, the plurality of color filters 530, and the plurality of microlenses 500, the image sensor 2 may be formed.

Figure 18:
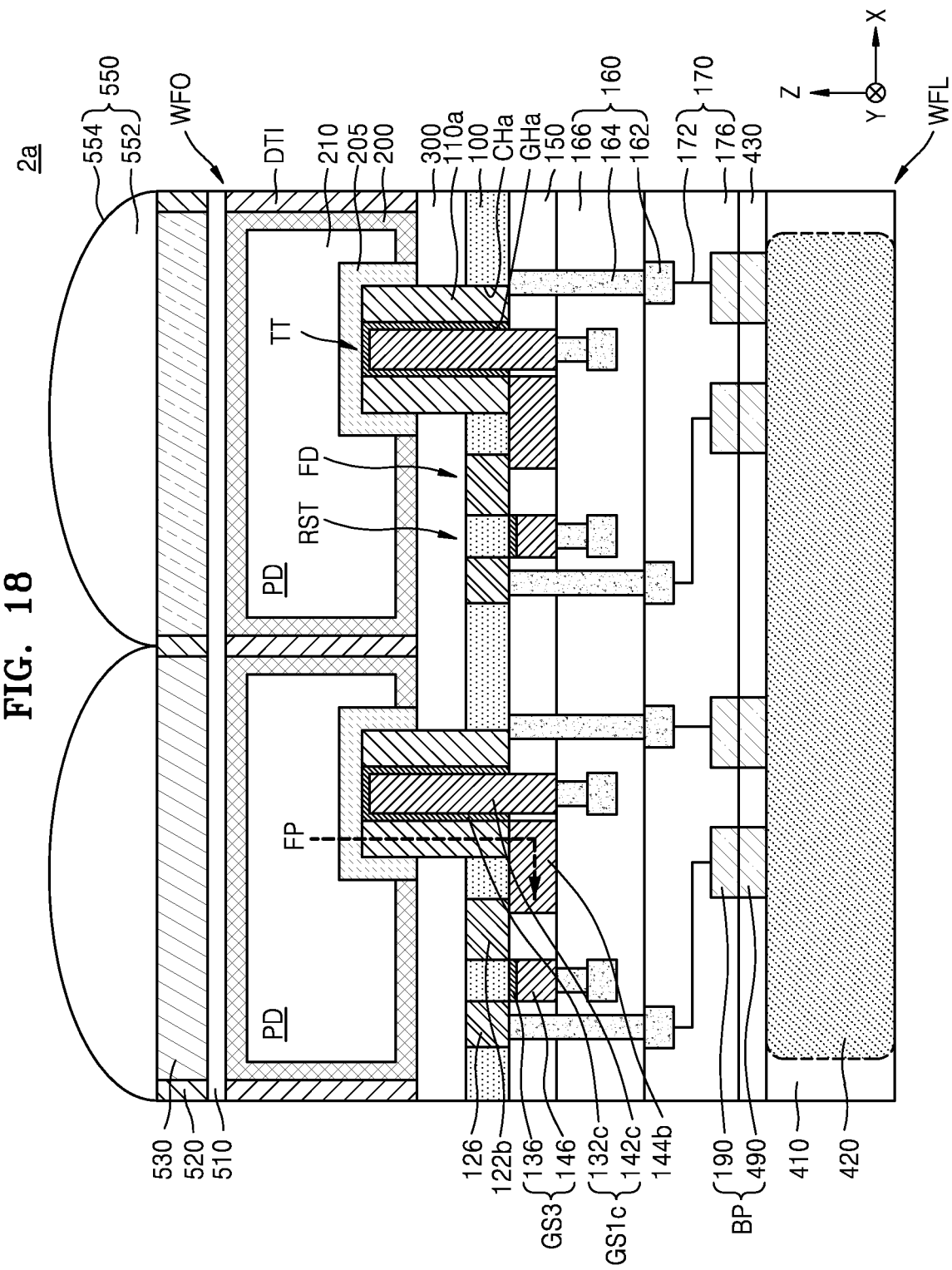
FIG. 18 is a cross-sectional view of an image sensor according to an embodiment.

FIG. 18 is a cross-sectional view of an image sensor 2a according to an embodiment. For convenience of explanation, a further description of components and technical aspects previously described with reference to FIGS. 12 and 14 may be omitted.

Referring to FIG. 18, the image sensor 2a may include the channel hole CHa, the channel layer 110a, the gate hole GHa, and a first gate structure GS1c, instead of the channel hole CH, the channel layer 110, the gate hole GH, and the first gate structure GS1b of the image sensor 2 illustrated in FIG. 14. The channel hole CHa, the channel layer 110a, and the gate hole GHa may be substantially the same as the channel hole CHa, the channel layer 110a, and the gate hole GHa illustrated in FIG. 12, respectively. Thus, for convenience of explanation, a further description of components and technical aspects may be omitted.

The first gate structure GS1c may have a stacked structure of a first gate insulating layer 132c and a first gate electrode layer 142c. In some embodiments, the first gate electrode layer 142c may include a vertical gate. The first gate structure GS1c may fill the gate hole GHa, and protrude downward from the lower surface of the channel layer 110a. The first gate insulating layer 132c may cover an inner wall and a bottom surface of the gate hole GHa. The first gate electrode layer 142c may cover the first gate insulating layer 132c, and fill the gate hole GHa. The first gate insulating layer 132c may be arranged between the channel layer 110, the photodiode impurity region 205, and the first gate electrode layer 142c.

Figure 19:
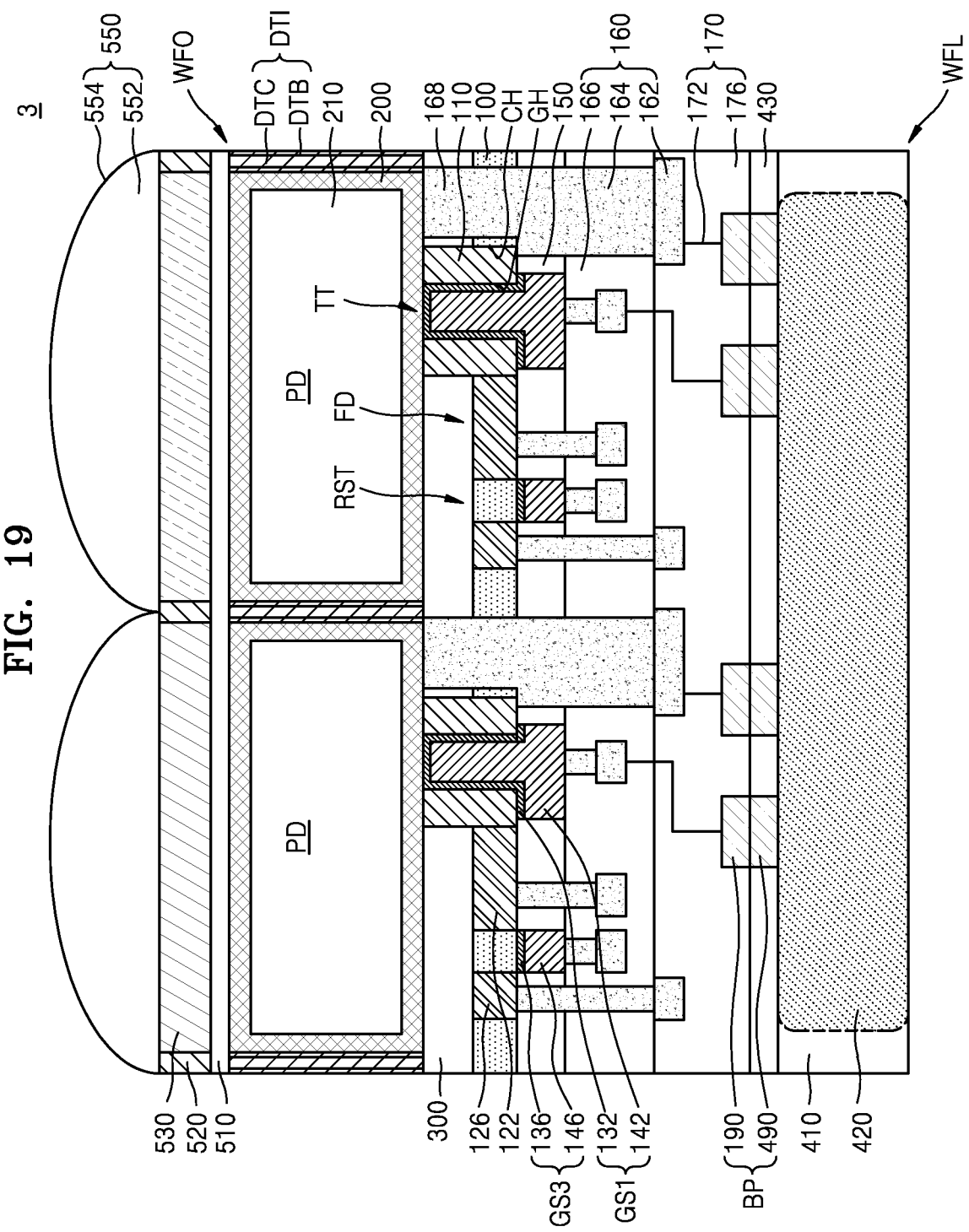
FIG. 19 is a cross-sectional view of an image sensor according to an embodiment.

FIG. 19 is a cross-sectional view of an image sensor 3 according to an embodiment. For convenience of explanation, a further description of components and technical features previously described with reference to FIG. 1 may be omitted.

Referring to FIG. 19, the image sensor 3 may further include a pixel isolation plug 168 unlike the image sensor 1 illustrated in FIG. 1. The pixel isolation plug 168 may be electrically connected to the contact pad layer 162 providing a ground among the plurality of contact pad layers 162. In some embodiments, the pixel isolation plug 168 may be electrically connected to the contact pad layer 162 providing a ground among the plurality of contact pad layers 162 via at least one of the plurality of contact plugs 164.

The pixel isolation region DTI may include a buried conductive layer DTC and an insulating liner DTB surrounding the buried conductive layer DTC. The insulating liner DTB may insulate the buried conductive layer DTC from the second substrate layer 200. In some embodiments, the insulating liner DTB may include metal oxide such as, for example, hafnium oxide, aluminum oxide, and tantalum oxide. In other embodiments, the insulating liner DTB may include an insulating material, such as, for example, silicon oxide, silicon nitride, and silicon oxynitride. The buried conductive layer DTC may include, for example, at least one of doped polysilicon, a metal, metal silicide, metal nitride, and a metal-including layer. The pixel isolation plug 168 may be electrically connected to the buried conductive layer DTC, and provide a ground to the buried conductive layer DTC.

According to embodiments, the image sensors 1a, 2, and 2a illustrated in FIGS. 12, 14, and 18 may further include the pixel isolation plug 168, and the pixel isolation regions DTI illustrated in FIGS. 12, 14, and 18 may include the insulating liner DTB surrounding the buried conductive layer DTC.

Figure 20:
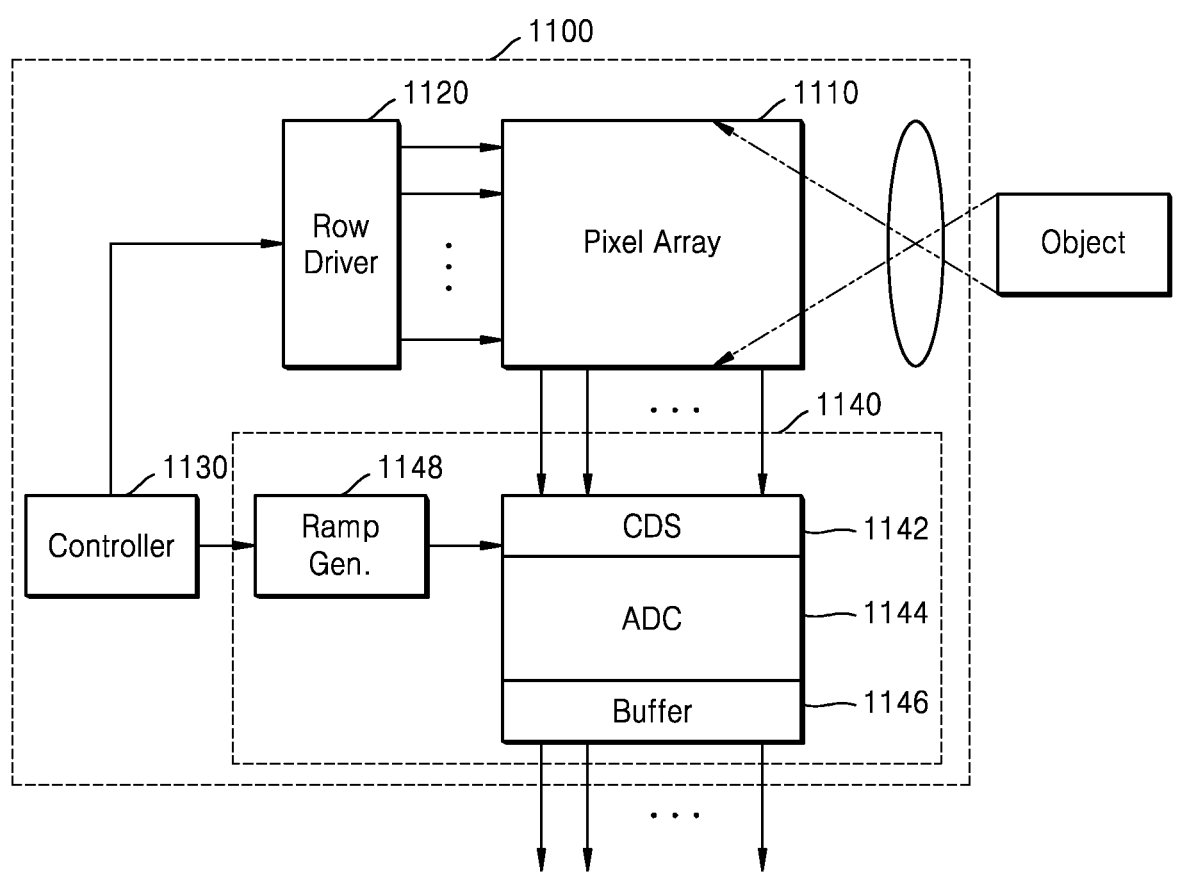
FIG. 20 is a block diagram of a configuration of an image sensor, according to an embodiment.

FIG. 20 is a block diagram of a configuration of an image sensor 1100, according to an embodiment.

Referring to FIG. 20, the image sensor 1100 may include a pixel array 1110, a controller 1130, a row driver 1120, and a pixel signal processor 1140. The image sensor 1100 may include at least one of the image sensors 1, 1A, 2, and 2A described with reference to FIGS. 1 to 19.

The pixel array 1110 may include a plurality of unit pixels arranged two-dimensionally, and each unit pixel may include a photoelectric conversion layer. The photoelectric conversion layer may absorb light to generate charges, and an electrical signal (or an output voltage) according to the generated charges may be provided to the pixel signal processor 1140 via a vertical signal line. The unit pixels included in the pixel array 1110 may provide one output voltage at a time in units of rows, and accordingly, the unit pixels belonging to one row of the pixel array 1110 may be simultaneously activated by a select signal, which is output by the row driver 1120. The unit pixels belonging to the selected row may provide the output voltage corresponding to the absorbed light, to an output line of a corresponding column.

The controller 1130 may control the row driver 1120, so that the pixel array 1110 absorbs light to accumulate charges, or temporarily store the accumulated charges, and outputs an electrical signal corresponding to the stored charges, to the outside of the pixel array 1110. In addition, the controller 1130 may control the pixel signal processor 1140 to measure the output voltage provided by the pixel array 1110.

The pixel signal processor 1140 may include a correlated double sampler (CDS) 1142, an analog-to-digital converter (ADC) 1144, and a buffer 1146. The CDS 1142 may sample and hold the output voltage provided by the pixel array 1110. The CDS 1142 may double-sample a certain noise level and a level of the generated output voltage, and output a level corresponding to a difference therebetween. In addition, the CDS 1142 may receive ramp signals generated by a ramp signal generator 1148, compare the ramp signals to each other, and output a result of the comparison. The ADC 1144 may convert an analog signal corresponding to the level received from the CDS 1142 into a digital signal. The buffer 1146 may latch the digital signals, and the latched digital signals may be sequentially output to the outside of the image sensor 1100 and transferred to an image processor.

Figure 21:
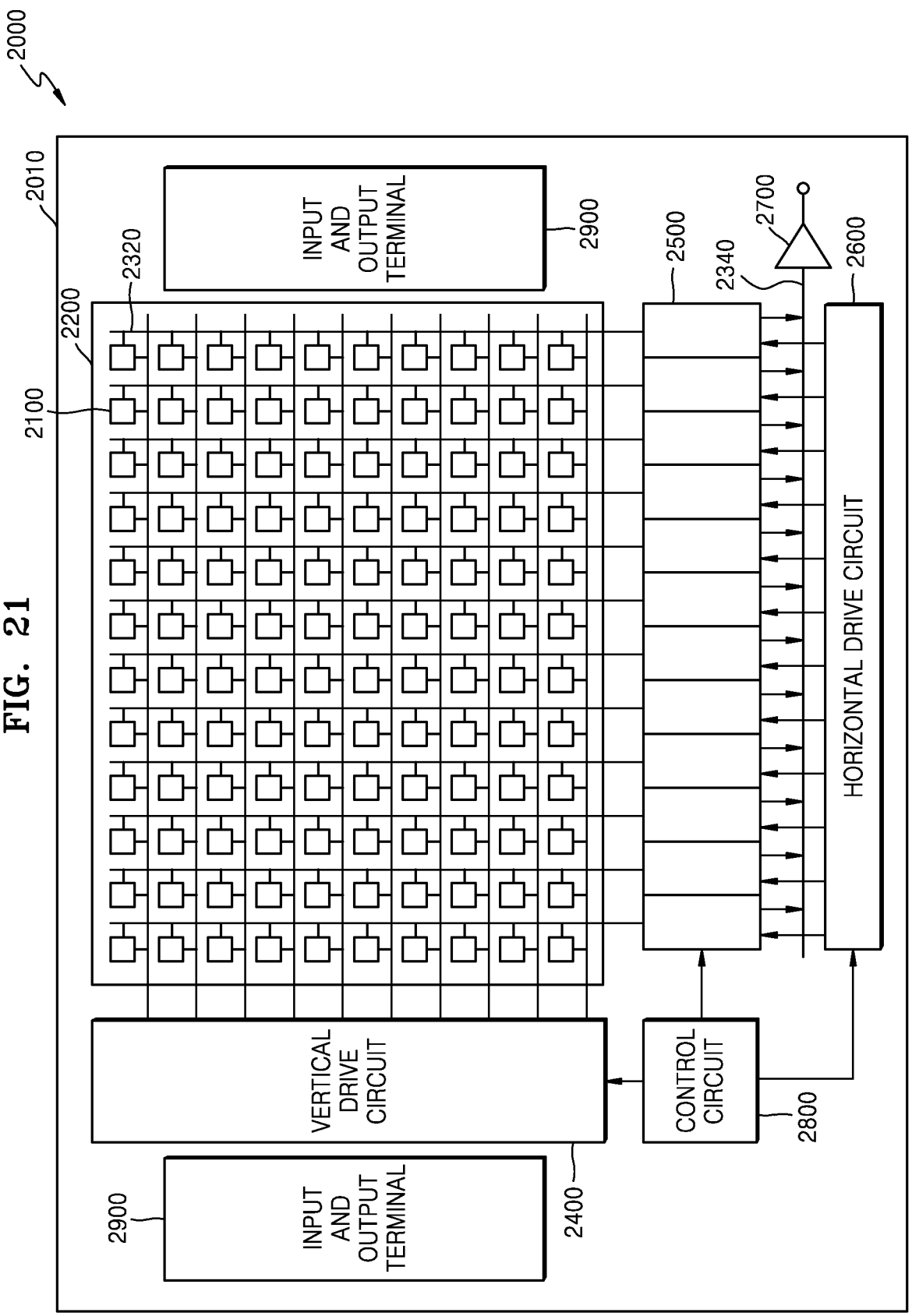
FIG. 21 is a block diagram of a configuration of an image sensor, according to an embodiment.

FIG. 21 is a block diagram of a configuration of an image sensor, according to an embodiment.

Referring to FIG. 21, the image sensor 2000 according to an embodiment may include a pixel unit 2200 and a periphery circuit unit. The pixel unit 2200 may be formed by regularly arranging a plurality of pixels 2100 including a photoelectric conversion layer in a substrate 2010 in a two-dimensional array structure. The image sensor 2000 may include at least one of the image sensors 1, 1a, 2, and 2a described with reference to FIGS. 1 to 19.

The periphery circuit unit may be arranged around the pixel unit 2200, and may include a vertical drive circuit 2400, a column signal processing circuit 2500, a horizontal drive circuit 2600, an output circuit 2700, a control circuit 2800, etc.

The control circuit 2800 may control the vertical drive circuit 2400, the column signal processing circuit 2500, the horizontal drive circuit 2600, etc. For example, the control circuit 2800 may generate clock signals or control signals, which are references for operations, such as a vertical drive circuit 2400, a column signal processing circuit 2500, a horizontal drive circuit 2600, etc., based on a vertical synchronization signal, a horizontal synchronization signal, and a master clock. In addition, the control circuit 2800 may input the clock signal or the control signals to the vertical drive circuit 2400, the column signal processing circuit 2500, the horizontal drive circuit 2600, etc.

The vertical drive circuit 2400 may include, for example, a shift register, and may select a pixel drive wiring, supply a pulse for driving a pixel to the selected pixel drive wiring, and drive the pixel in units of rows. For example, the vertical drive circuit 2400 may selectively scan each pixel 2100 of the pixel unit 2200 sequentially in a vertical direction in units of rows. In addition, the pixel signal according to the charges generated by the photoelectric conversion layer of each pixel 2100 may be supplied to the column signal processing circuit 2500 via a vertical signal line 2320.

The column signal processing circuit 2500 may be arranged on each column of the pixel 2100, and perform signal processing, such as, for example, noise removal, for each pixel column of a signal output by the pixel 2100 on one row. For example, the column signal processing circuit 2500 may perform signal processing, such as correlated-double sampling (CDS), signal amplification, and analog-to-digital (AD) conversion for removing noise, that is unique to the pixel 2100. A horizontal selection switch may be installed at an output terminal of the column signal processing circuit 2500.

The horizontal drive circuit 2600 may include, for example, a shift register, and by sequentially outputting a horizontal scanning pulse and selecting in order each of the column signal processing circuits 2500, may output the pixel signal of each column signal processing circuit 2500 to a horizontal signal line 2340.

The output circuit 2700 may perform signal processing on signals sequentially supplied via the horizontal signal line 2340 by each of the column signal processing circuits 2500, and output the processed signals. For example, the output circuit 2700 may also perform only buffering, or may also perform black level adjustment, thermal non-uniformity correction, various digital signal processing, etc. An input/output terminal 2900 may exchange signals with the outside.

Figure 22A:
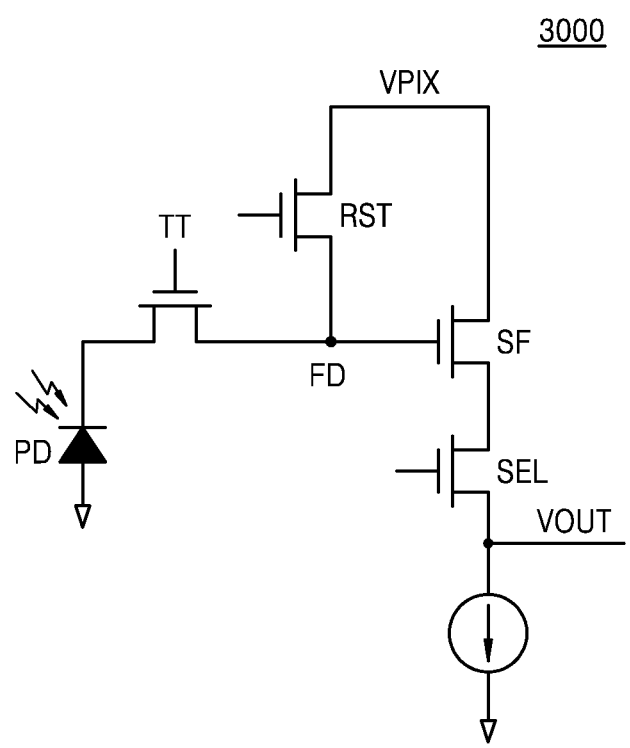
FIGS. 22A and 22B are readout circuits of an image sensor according to embodiments.
Figure 22B:
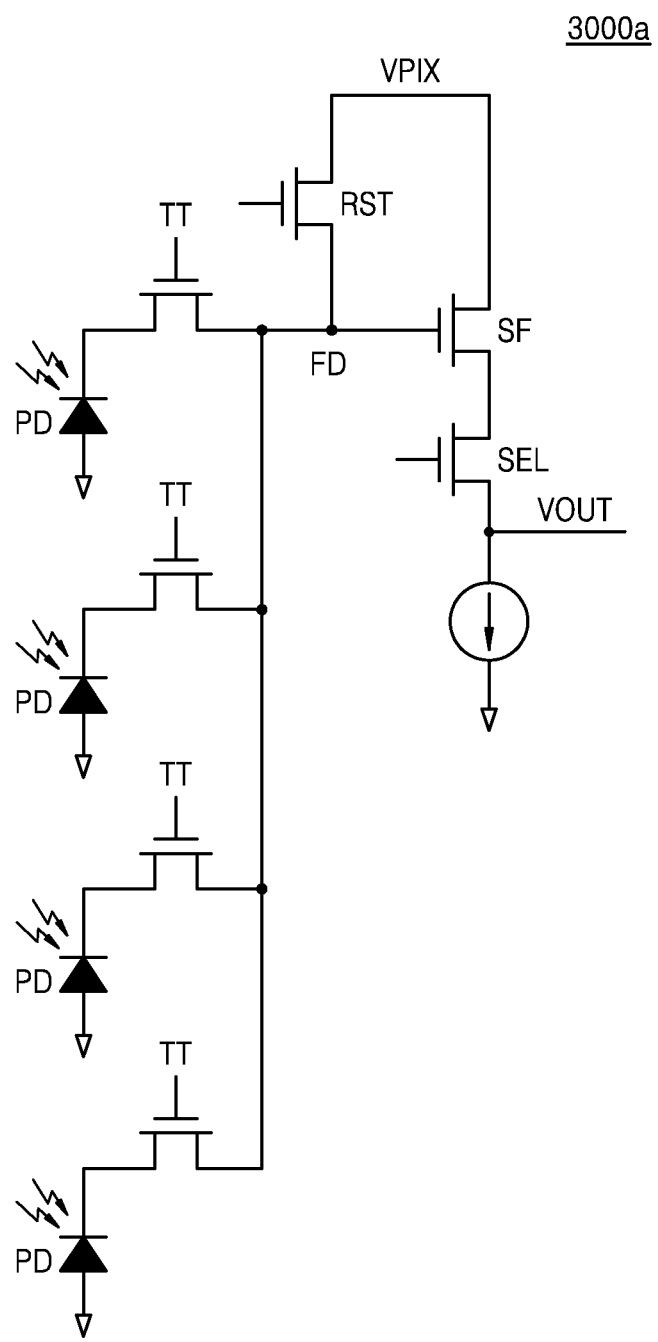

FIGS. 22A and 22B are readout circuits of an image sensor 3000 according to embodiments.

Referring to FIG. 22A, the image sensor 3000 may include the photo sensing device PD, the transfer transistor TT, the floating diffusion region FD, the reset transistor RST, the source follower transistor SF, and the selection transistor SEL. The photo sensing device PD and the transfer transistor TT may constitute a unit pixel. The image sensor 3000 may include at least one of the image sensors 1, 1a, 2, and 2a described with reference to FIGS. 1 to 19.

Each of the transfer transistor TT, the reset transistor RST, the source follower transistor SF, and the selection transistor SEL may include a transfer gate, a reset gate, a source follower gate, and a selection gate. In some embodiments, the transfer gate may include a vertical gate, and each of the reset gate, the source follower gate, and the selection gate may include a planar gate. The transfer gate may be arranged between the plurality of photo sensing devices PD and the floating diffusion region FD, and transmit charges generated by the plurality of photo sensing devices PD to the floating diffusion region FD.

The transfer transistor TT may include a source region and a drain region, each of which is respectively connected to the transfer gate, the floating diffusion region FD, and the photo sensing device PD. The reset transistor RST may include a source region connected to the reset gate and the floating diffusion region FD, and a drain region connected to a power supply voltage VPIX. The source follower transistor SF may include the source follower gate connected to the floating diffusion region FD, the source region connected to the source region of the selection transistor SEL, and the drain region connected to the power supply voltage VPIX. The selection transistor SEL may include the selection gate, a source region connected to a source region of the source follower transistor SF, and a drain region connected to the output voltage VOUT.

As described with reference to FIGS. 1 to 19, the image sensor 3000 may include a photo sensing device PD and the floating diffusion region FD, which are spaced apart from each other with the inter-substrate insulating layer 300 arranged therebetween. As a result, a parasitic capacitance between the photo sensing device PD and the floating diffusion region FD may be reduced, and the photo sensing capability may be increased.

Alternatively, as described with reference to FIGS. 14 to 18, in the image sensor 3000, a parasitic capacitance between the photo sensing device PD and the floating diffusion region FD, and a parasitic capacitance between the floating diffusion region FD and the contact pad layer 162, may be reduced, a conversion gain may be increased, and the photo sensing capability of the image sensor 3000 may be increased.

Referring to FIG. 22B, an image sensor 3000a may include the plurality of photo sensing devices PD, a plurality of transfer transistors TT, the floating diffusion region FD, the reset transistor RST, the source follower transistor SF, and the selection transistor SEL. The photo sensing device PD and the transfer transistor TT may constitute a unit pixel. The image sensor 3000a may include at least one of the image sensors 1, 1a, 2, and 2a described with reference to FIGS. 1 to 19.

In FIG. 22B, four unit pixels including four photo sensing devices PD are illustrated as constituting a shared pixel, which share one floating diffusion region FD, one reset transistor RST, one source follower transistor SF, and one selection transistor SEL, via four transfer transistors TT. However, embodiments of the inventive concept are not limited thereto. For example, in some embodiments, two unit pixels including two photo sensing device PD may be constitute a shared pixel, which share one floating diffusion region FD, one reset transistor RST, one source follower transistor SF, and one selection transistor SEL, via two transfer transistors TT.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:
1. An image sensor, comprising:
   a first substrate layer;
   a second substrate layer that is thicker than the first substrate layer;
   an inter-substrate insulating layer arranged between the first substrate layer and the second substrate layer;
   a first impurity region, a pair of second impurity regions, and a third impurity region, which are spaced apart from each other and arranged on some portions of the first substrate layer;
   a photodiode region constituting a photo sensing device arranged on the second substrate layer;
   a transfer transistor including a first gate electrode layer that fills a gate hole, penetrates the first substrate layer and the inter-substrate insulating layer, and extends to the second substrate layer,
   wherein the first gate electrode layer is a vertical gate; and
   a floating diffusion region arranged on a side of the first substrate layer and connected to the transfer transistor.

2. The image sensor of claim 1, further comprising:
   a channel layer that covers sidewalls of a channel hole, penetrates the first substrate layer and the inter-substrate insulating layer, extends to the second substrate layer, and limits a size of the gate hole.

3. The image sensor of claim 2, wherein at least a portion of the first impurity region includes the floating diffusion region and contacts the channel layer such that the at least a portion of the first impurity region is connected to the transfer transistor.

4. The image sensor of claim 3, wherein a thickness of the first impurity region is substantially equal to a thickness of the first substrate layer.

5. The image sensor of claim 3, further comprising:
   a first gate insulating layer arranged between the channel layer and the first gate electrode layer, and extending onto a surface of the channel layer opposite to the inter-substrate insulating layer.

6. The image sensor of claim 2, wherein the channel hole is one of a plurality of channel holes,
   wherein a portion of the second substrate layer is arranged between adjacent channel holes among the plurality of channel holes, and plurality of channel holes are spaced apart from the photodiode region.

7. The image sensor of claim 2, wherein the channel hole further comprises:
   a photodiode impurity region that penetrates the first substrate layer, the inter-substrate insulating layer, and the second substrate layer, extends into the photodiode region, and is arranged between the channel hole and the photodiode region.

8. The image sensor of claim 2, further comprising:
   a second gate electrode layer extending from the channel layer onto the first impurity region and contacting the channel layer and the first impurity region,
   wherein at least a portion of the second gate electrode layer comprises the floating diffusion region.

9. The image sensor of claim 8, wherein the second gate electrode layer further extends from the channel layer onto a portion of the first substrate layer between the pair of second impurity regions.

10. The image sensor of claim 9, further comprising:
    a first gate insulating layer arranged between the channel layer and the first gate electrode layer; and a second gate insulating layer arranged between a portion of the first substrate layer, between the pair of second impurity regions, and the second gate electrode layer.

11. An image sensor, comprising:
a first substrate layer including impurities of a first conductivity type;
a second substrate layer including impurities of the first conductivity type;
an inter-substrate insulating layer arranged between the first substrate layer and the second substrate layer;
a first impurity region, a pair of second impurity regions, and a third impurity region, which are arranged on some portions of the first substrate layer, are spaced apart from each other, and respectively include impurities of a second conductivity type that is different from the first conductivity type;
a photodiode region arranged in the second substrate layer and including the impurities of the second conductivity type;
a transfer transistor including a first gate electrode layer that penetrates the first substrate layer and the inter-substrate insulating layer and extends toward the photodiode region;
a source follower transistor including a second gate electrode layer arranged on a portion of the first substrate layer between the pair of second impurity regions; and
a reset transistor including a third gate electrode layer arranged on a portion of the first substrate layer between the first impurity region and the third impurity region,
wherein the first impurity region comprises a floating diffusion region connected to the transfer transistor and a source region of the reset transistor.

12. The image sensor of claim 11, wherein an upper surface of the first impurity region is substantially coplanar with an upper surface of the first substrate layer, and
a lower surface of the first impurity region is substantially coplanar with a lower surface of the first substrate layer.

13. The image sensor of claim 12, wherein a thickness of each of the first impurity region, the pair of second impurity regions, and the third impurity region is substantially equal to a thickness of the first substrate layer.

14. The image sensor of claim 11, further comprising:
a channel hole that penetrates the first substrate layer and the inter-substrate insulating layer, and extends to the second substrate layer; and
a channel layer that covers sidewalls of the channel hole, limits a size of a gate hole, and includes the impurities of the first conductivity type,
wherein the first impurity region contacts the channel layer.

15. The image sensor of claim 14, further comprising:
a first gate insulating layer that covers a lower surface and sidewalls of the gate hole,
wherein the first gate electrode layer covers the first gate insulating layer, and fills the gate hole.

16. The image sensor of claim 15, wherein the first gate insulating layer extends onto a surface of the channel layer opposite to the inter-substrate insulating layer in the channel hole.

17. The image sensor of claim 11, further comprising:
an inter-gate insulating layer that surrounds the first gate electrode layer, the second gate electrode layer, and the third gate electrode layer, on the first substrate layer; and a contact structure comprising a plurality of contact pad layers, a plurality of contact plugs respectively connected to the plurality of contact pad layers, and an interlayer insulating layer that surrounds the plurality of contact pad layers and covers the inter-gate insulating layer,
wherein the first impurity region is electrically connected to the second gate electrode layer via at least one of the plurality of contact pad layers and at least one of the plurality of contact plugs.

18. An image sensor, comprising:
a first substrate layer including impurities of a first conductivity type;
a second substrate layer including the impurities of the first conductivity type;
an inter-substrate insulating layer arranged between the first substrate layer and the second substrate layer;
a first impurity region, a pair of second impurity regions, and a third impurity region, which are arranged on some portions of the first substrate layer, are spaced apart from each other, and respectively include impurities of a second conductivity type that is different from the first conductivity type;
a photodiode region arranged in the second substrate layer and including the impurities of the second conductivity type;
a channel layer including the impurities of the first conductivity type that penetrates the first substrate layer and the inter-substrate insulating layer, covers sidewalls of a channel hole that extends to the second substrate layer, and limits a size of a gate hole;
a transfer transistor including a first gate insulating layer that covers a bottom surface and sidewalls of the gate hole and a first gate electrode layer, and covers the first gate insulating layer and fills the channel hole,
wherein the first gate electrode layer is a vertical gate;
a plurality of source follower transistors including a second gate insulating layer arranged therebetween, and a second gate electrode layer arranged on a portion of the first substrate layer between the pair of second impurity regions; and
a plurality of reset transistors including a third gate insulating layer arranged therebetween, and including a third gate electrode layer arranged on a portion of the first substrate layer between the first impurity region and the third impurity region,
wherein the second gate electrode layer extends from the portion of the first substrate layer between the pair of second impurity regions onto the channel layer and the first impurity region, and contacts the channel layer and the first impurity region.

19. The image sensor of claim 18, wherein a thickness of the second substrate layer is greater than a thickness of the first substrate layer, and
wherein a thickness of each of the first impurity region, the pair of second impurity regions, and the third impurity region is substantially equal to the thickness of the first substrate layer.

20. The image sensor of claim 18, further comprising:
a photodiode impurity region arranged between the first gate insulating layer and the photodiode region, and between the first gate insulating layer and the second substrate layer, and including the impurities of the first conductivity type, wherein the first gate electrode layer penetrates the first substrate layer, the inter-substrate insulating layer, and the second substrate layer, and extends into the photodiode region.

* * * * *